(12) United States Patent
Mavretic et al.

(10) Patent No.: US 12,119,206 B2
(45) Date of Patent: Oct. 15, 2024

(54) SWITCHING CIRCUIT

(71) Applicant: ASM AMERICA, INC., Pheonix, AZ (US)

(72) Inventors: Anton Mavretic, Natick, MA (US); Ian M. Costanzo, Worcester, MA (US); Ronald Anthony Decker, Turnersville, NJ (US)

(73) Assignee: ASM AMERICA, INC.

( * ) Notice: Subject to any disclaimer, the term of this patent is extended or adjusted under 35 U.S.C. 154(b) by 0 days.

(21) Appl. No.: 18/133,356

(22) Filed: Apr. 11, 2023

(65) Prior Publication Data

US 2023/0253183 A1 Aug. 10, 2023

Related U.S. Application Data

(63) Continuation of application No. 17/209,071, filed on Mar. 22, 2021, now Pat. No. 11,631,570, which is a
(Continued)

(51) Int. Cl.
*H03F 3/191* (2006.01)
*H01J 37/32* (2006.01)
(Continued)

(52) U.S. Cl.
CPC .. *H01J 37/32082* (2013.01); *H01L 21/02274* (2013.01); *H01L 21/3065* (2013.01);
(Continued)

(58) Field of Classification Search
CPC .......... H01J 37/32082; H01J 2237/334; H01J 37/32174; H01J 37/32183;
(Continued)

(56) References Cited

U.S. PATENT DOCUMENTS

| 3,828,281 A | 8/1974 | Chambers |
| 4,110,700 A | 8/1978 | Rosen et al. |

(Continued)

FOREIGN PATENT DOCUMENTS

| EP | 0840349 | 5/1998 |
| EP | 0840350 | 5/1998 |
| WO | WO2006096589 | 9/2006 |

OTHER PUBLICATIONS

Navigator II Matching Networks with a Solid-State Technology Option, Advanced Energy Industries, Inc. 2012, Exhibit 106, pp. 1-1.
(Continued)

*Primary Examiner* — Khanh V Nguyen
(74) *Attorney, Agent, or Firm* — The Belles Group, P.C. (ASM)

(57) ABSTRACT

In one embodiment, an impedance matching network includes a variable reactance circuit having fixed reactance components and corresponding switching circuits. Each switching circuit includes a diode and a driver circuit. The driver circuit includes, coupled in series, a biasing current source positioned to provide a bias current to bias the diode, a first switch, a second switch, and a resistor. For each diode of each switching circuit, the control circuit is configured to receive a value related to a voltage drop on the resistor and, based on the value related to the voltage drop, adjust the bias current being provided by the biasing current source.

20 Claims, 42 Drawing Sheets

Related U.S. Application Data continuation of application No. 17/022,760, filed on Sep. 16, 2020, now Pat. No. 10,984,985, which is a continuation of application No. 16/410,862, filed on May 13, 2019, now Pat. No. 11,017,983, which is a continuation-in-part of application No. 16/255,269, filed on Jan. 23, 2019, now Pat. No. 10,679,823, which is a continuation-in-part of application No. 16/211,961, filed on Dec. 6, 2018, now Pat. No. 10,431,424, which is a continuation-in-part of application No. 15/787,374, filed on Oct. 18, 2017, now Pat. No. 10,340,879, which is a continuation-in-part of application No. 15/667,951, filed on Aug. 3, 2017, now Pat. No. 10,217,608, which is a continuation of application No. 15/384,904, filed on Dec. 20, 2016, now Pat. No. 9,729,122, which is a continuation-in-part of application No. 15/046,585, filed on Feb. 18, 2016, now Pat. No. 9,525,412, which is a continuation-in-part of application No. 14/734,053, filed on Jun. 9, 2015, now Pat. No. 9,306,533.

(60) Provisional application No. 62/670,990, filed on May 14, 2018, provisional application No. 62/620,781, filed on Jan. 23, 2018, provisional application No. 62/595,222, filed on Dec. 6, 2017, provisional application No. 62/409,635, filed on Oct. 18, 2016, provisional application No. 62/117,728, filed on Feb. 18, 2015, provisional application No. 62/118,552, filed on Feb. 20, 2015.

(51) Int. Cl.
*H01L 21/02* (2006.01)
*H01L 21/3065* (2006.01)
*H01L 21/311* (2006.01)
*H01L 29/20* (2006.01)
*H01L 29/778* (2006.01)
*H01L 29/861* (2006.01)
*H01L 49/02* (2006.01)
*H02M 3/335* (2006.01)
*H03H 7/38* (2006.01)
*H03H 7/40* (2006.01)
*H03K 17/687* (2006.01)
*H04B 1/44* (2006.01)
*H02M 3/00* (2006.01)
*H03K 17/10* (2006.01)
*H03K 17/691* (2006.01)
*H03K 17/795* (2006.01)

(52) U.S. Cl.
CPC ........ *H01L 21/31116* (2013.01); *H01L 28/20* (2013.01); *H01L 28/40* (2013.01); *H01L 29/2003* (2013.01); *H01L 29/7787* (2013.01); *H01L 29/861* (2013.01); *H02M 3/33569* (2013.01); *H03H 7/38* (2013.01); *H03H 7/40* (2013.01); *H03K 17/687* (2013.01); *H04B 1/44* (2013.01); *H01J 2237/334* (2013.01); *H02M 3/01* (2021.05); *H03F 3/191* (2013.01); *H03K 17/102* (2013.01); *H03K 2017/6875* (2013.01); *H03K 17/691* (2013.01); *H03K 17/7955* (2013.01)

(58) Field of Classification Search
CPC .......... H01L 21/02274; H01L 21/3065; H01L 21/31116; H01L 28/20; H01L 28/40; H01L 29/2003; H01L 29/7787; H01L 29/861; H02M 3/33569; H02M 3/01; H03H 7/38; H03H 7/40; H03K 17/687; H03K 17/102; H03K 17/691; H03K 17/7955; H03K 2017/6875; H04B 1/44; H04B 1/0458; H04B 1/18; H03F 3/191; H03F 2200/451; H03F 2200/541; H03F 2200/61; H03F 1/223; H03F 1/56; H03F 3/195; H03F 3/211; H03F 3/245; H03F 3/45183
USPC ........................................................ 330/302
See application file for complete search history.

(56) References Cited

U.S. PATENT DOCUMENTS

| | | |
|---|---|---|
| 4,679,007 A | 7/1987 | Reese et al. |
| 4,692,643 A | 9/1987 | Tokunaga et al. |
| 4,751,408 A | 6/1988 | Rambert |
| 4,929,855 A | 5/1990 | Ezzeddine |
| 5,012,123 A | 4/1991 | Ayasli et al. |
| 5,079,507 A | 1/1992 | Ishida et al. |
| 5,314,603 A | 5/1994 | Sugiyama et al. |
| 5,654,679 A | 8/1997 | Mavretic et al. |
| 5,815,047 A | 9/1998 | Sorensen et al. |
| 5,849,136 A | 12/1998 | Mintz et al. |
| 5,880,921 A | 3/1999 | Tham et al. |
| 5,889,252 A | 3/1999 | Williams et al. |
| 5,971,591 A | 10/1999 | Vona et al. |
| 6,046,641 A | 4/2000 | Chawla et al. |
| 6,137,367 A | 10/2000 | Ezzedine et al. |
| 6,252,354 B1 | 6/2001 | Collins et al. |
| 6,259,334 B1 | 7/2001 | Howald |
| 6,291,999 B1 | 9/2001 | Nishimori et al. |
| 6,400,012 B1 | 6/2002 | Miller et al. |
| 6,424,232 B1 * | 7/2002 | Mavretic ........... H01J 37/32082 333/32 |
| 6,472,822 B1 | 10/2002 | Chen et al. |
| 6,583,572 B2 | 6/2003 | Veltrop et al. |
| 6,621,372 B2 | 9/2003 | Kondo et al. |
| 6,657,395 B2 | 12/2003 | Windhorn |
| 6,677,828 B1 | 1/2004 | Harnett et al. |
| 6,703,080 B2 | 3/2004 | Reyzelman et al. |
| 6,791,274 B1 | 9/2004 | Hauer et al. |
| 6,794,951 B2 | 9/2004 | Finley |
| 6,818,562 B2 | 11/2004 | Todorow et al. |
| 6,887,339 B1 | 5/2005 | Goodman et al. |
| 6,888,313 B2 | 5/2005 | Blackburn et al. |
| 6,888,396 B2 | 5/2005 | Hajimiri et al. |
| 6,946,847 B2 | 9/2005 | Nishimori et al. |
| 6,967,547 B2 | 11/2005 | Pellegrini et al. |
| 7,004,107 B1 | 2/2006 | Raoux et al. |
| RE39,051 E | 3/2006 | Harnett |
| 7,071,786 B2 | 7/2006 | Inoue et al. |
| 7,095,178 B2 | 8/2006 | Nakano et al. |
| 7,113,761 B2 | 9/2006 | Bickham et al. |
| 7,122,965 B2 | 10/2006 | Goodman |
| 7,164,236 B2 | 1/2007 | Mitrovic et al. |
| 7,169,625 B2 | 1/2007 | Davis et al. |
| 7,199,678 B2 | 4/2007 | Matsuno |
| 7,251,121 B2 | 7/2007 | Bhutta |
| 7,298,091 B2 | 11/2007 | Pickard et al. |
| 7,298,128 B2 | 11/2007 | Bhutta |
| 7,304,438 B2 | 12/2007 | Kishinevsky |
| 7,328,126 B2 | 2/2008 | Chamness |
| 7,332,981 B2 | 2/2008 | Matsuno |
| 7,439,610 B2 | 10/2008 | Weigand |
| 7,480,571 B2 | 1/2009 | Howald et al. |
| 7,495,524 B2 | 2/2009 | Omae et al. |
| 7,498,908 B2 | 3/2009 | Gurov |
| 7,514,935 B2 | 4/2009 | Pankratz |
| 7,518,466 B2 | 4/2009 | Sorensen et al. |
| 7,535,312 B2 | 5/2009 | Mckinzie, III |
| 7,602,127 B2 | 10/2009 | Coumou |
| 7,642,879 B2 | 1/2010 | Matsuno |
| 7,666,464 B2 | 2/2010 | Collins et al. |
| 7,714,676 B2 | 5/2010 | Mckinzie, III |
| 7,728,602 B2 | 6/2010 | Valcore et al. |
| 7,745,955 B2 | 6/2010 | Kirchmeier et al. |

(56) References Cited

U.S. PATENT DOCUMENTS

| | | |
|---|---|---|
| 7,755,300 B2 | 7/2010 | Kishinevsky et al. |
| 7,764,140 B2 | 7/2010 | Nagarkatti et al. |
| 7,777,567 B2 | 8/2010 | Polizzo |
| 7,796,368 B2 | 9/2010 | Kotani et al. |
| 7,839,223 B2 | 11/2010 | Van Zyl |
| 7,852,170 B2 | 12/2010 | Mckinzie, III |
| 7,863,996 B2 | 1/2011 | Cotter et al. |
| 7,868,556 B2 | 1/2011 | Xia |
| 7,872,523 B2 | 1/2011 | Sivakumar et al. |
| 7,917,104 B2 | 3/2011 | Manssen et al. |
| 7,969,096 B2 | 6/2011 | Chen |
| 8,008,982 B2 | 8/2011 | Mckinzie, III |
| 8,010,084 B2 | 8/2011 | Turner |
| 8,031,926 B2 | 10/2011 | Sutko et al. |
| 8,040,068 B2 | 10/2011 | Coumou et al. |
| RE42,917 E | 11/2011 | Hauer et al. |
| 8,089,026 B2 | 1/2012 | Sellers |
| 8,102,954 B2 | 1/2012 | Coumou |
| 8,110,991 B2 | 2/2012 | Coumou |
| 8,203,859 B2 | 6/2012 | Omae et al. |
| 8,217,731 B2 | 7/2012 | Mckinzie, III |
| 8,217,732 B2 | 7/2012 | Mckinzie, III |
| 8,228,112 B2 | 7/2012 | Reynolds |
| 8,237,501 B2 | 8/2012 | Owen |
| 8,264,154 B2 | 9/2012 | Banner et al. |
| 8,278,909 B2 | 10/2012 | Fletcher |
| 8,289,029 B2 | 10/2012 | Coumou |
| 8,299,867 B2 | 10/2012 | Mckinzie, III |
| 8,314,561 B2 | 11/2012 | Fisk et al. |
| 8,330,432 B2 | 12/2012 | Van Zyl et al. |
| 8,334,657 B2 | 12/2012 | Xia |
| 8,334,700 B2 | 12/2012 | Coumou et al. |
| 8,335,479 B2 | 12/2012 | Koya et al. |
| 8,344,559 B2 | 1/2013 | Van Zyl et al. |
| 8,344,801 B2 | 1/2013 | Owen et al. |
| 8,368,308 B2 | 2/2013 | Banna et al. |
| 8,368,469 B2 | 2/2013 | Mohammadi et al. |
| 8,395,322 B2 | 3/2013 | Coumou |
| 8,416,008 B2 | 4/2013 | Van Zyl et al. |
| 8,436,643 B2 | 5/2013 | Mason |
| 8,461,842 B2 | 6/2013 | Thuringer et al. |
| 8,466,736 B1 | 6/2013 | Reynolds |
| 8,487,706 B2 | 7/2013 | Li et al. |
| 8,502,689 B2 | 8/2013 | Chen et al. |
| 8,513,889 B2 | 8/2013 | Zhang et al. |
| 8,520,413 B2 | 8/2013 | Tran et al. |
| 8,536,636 B2 | 9/2013 | Englekirk |
| 8,552,665 B2 | 10/2013 | Larson et al. |
| 8,558,633 B2 | 10/2013 | Mckinzie, III |
| 8,559,907 B2 | 10/2013 | Burgener et al. |
| 8,564,381 B2 | 10/2013 | Mckinzie |
| 8,569,842 B2 | 10/2013 | Weis et al. |
| 8,576,010 B2 | 11/2013 | Yanduru |
| 8,576,013 B2 | 11/2013 | Coumou |
| 8,587,321 B2 | 11/2013 | Chen et al. |
| 8,620,236 B2 | 12/2013 | Manssen et al. |
| 8,624,501 B2 | 1/2014 | Nagarkatti et al. |
| 8,633,782 B2 | 1/2014 | Nagarkatti et al. |
| 8,638,159 B2 | 1/2014 | Ranta et al. |
| 8,649,754 B2 | 2/2014 | Burgener et al. |
| 8,659,335 B2 | 2/2014 | Nagarkatti et al. |
| 8,674,606 B2 | 3/2014 | Carter et al. |
| 8,680,928 B2 | 3/2014 | Jeon et al. |
| 8,686,796 B2 | 4/2014 | Presti |
| 8,710,926 B2 | 4/2014 | Nagarkatti et al. |
| 8,716,984 B2 | 5/2014 | Mueller et al. |
| 8,723,423 B2 | 5/2014 | Hoffman et al. |
| 8,742,669 B2 | 6/2014 | Carter et al. |
| 8,773,019 B2 | 7/2014 | Coumou et al. |
| 8,779,859 B2 | 7/2014 | Su et al. |
| 8,781,415 B1 | 7/2014 | Coumou et al. |
| 8,815,329 B2 | 8/2014 | Ilic et al. |
| 8,847,561 B2 | 9/2014 | Karlieek et al. |
| 8,884,180 B2 | 11/2014 | Ilic et al. |
| 8,884,525 B2 | 11/2014 | Hoffman et al. |
| 8,890,537 B2 | 11/2014 | Valcore, Jr. et al. |
| 8,912,835 B2 | 12/2014 | Nagarkatti et al. |
| 8,928,329 B2 | 1/2015 | Downing et al. |
| 9,083,343 B1 | 7/2015 | Li et al. |
| 9,190,993 B1 | 11/2015 | Li |
| 9,306,533 B1 | 4/2016 | Anton |
| 9,496,122 B1 | 11/2016 | Bhutta |
| 9,779,196 B2 | 10/2017 | Valcore, Jr. |
| 10,269,540 B1 | 4/2019 | Carter et al. |
| 10,340,879 B2 | 7/2019 | Mavretic et al. |
| 10,469,108 B2 | 11/2019 | Howald et al. |
| 10,483,090 B2 | 11/2019 | Bhutta et al. |
| 10,734,196 B2 | 8/2020 | Morii et al. |
| 10,812,071 B2 | 10/2020 | Morii et al. |
| 2002/0048960 A1 | 4/2002 | Scanlan et al. |
| 2002/0060914 A1 | 5/2002 | Porter et al. |
| 2002/0185227 A1 | 12/2002 | Macgearailt |
| 2003/0007372 A1 | 1/2003 | Porter et al. |
| 2003/0046013 A1 | 3/2003 | Gerrish |
| 2006/0095232 A1 | 5/2006 | Purdy |
| 2006/0170367 A1 | 8/2006 | Bhutta |
| 2006/0198077 A1 | 9/2006 | Bhutta |
| 2006/0232471 A1 | 10/2006 | Coumou |
| 2007/0075784 A1 | 4/2007 | Pettersson et al. |
| 2007/0139122 A1 | 6/2007 | Nagarkatti et al. |
| 2008/0012548 A1 | 1/2008 | Gerhardt |
| 2008/0179948 A1 | 7/2008 | Nagarkatti et al. |
| 2008/0180179 A1 | 7/2008 | Polizzo |
| 2008/0197854 A1 | 8/2008 | Valcore et al. |
| 2008/0278721 A1 | 11/2008 | Bai et al. |
| 2009/0048792 A1 | 2/2009 | Turner |
| 2009/0207537 A1 | 8/2009 | Coumou |
| 2010/0001796 A1 | 1/2010 | Sivakumar et al. |
| 2010/0073104 A1 | 3/2010 | Cotter et al. |
| 2010/0123453 A1 | 5/2010 | Pauly et al. |
| 2010/0123502 A1 | 5/2010 | Bhutta et al. |
| 2010/0194195 A1 | 8/2010 | Coumou et al. |
| 2010/0201370 A1 | 8/2010 | Coumou et al. |
| 2010/0231296 A1 | 9/2010 | Nagarkatti et al. |
| 2011/0241781 A1 | 10/2011 | Owen et al. |
| 2011/0247696 A1 | 10/2011 | Zolock et al. |
| 2012/0013253 A1 | 1/2012 | Coumou |
| 2012/0062322 A1 | 3/2012 | Owen |
| 2012/0188007 A1 | 7/2012 | Van Zyl et al. |
| 2012/0262064 A1 | 10/2012 | Nagarkatti et al. |
| 2013/0043854 A1 | 2/2013 | Tran et al. |
| 2013/0105082 A1* | 5/2013 | Melikyan ............... H05H 1/46 315/111.21 |
| 2013/0169359 A1 | 7/2013 | Coumou |
| 2013/0193867 A1 | 8/2013 | Van Zyl et al. |
| 2013/0207738 A1 | 8/2013 | Mason |
| 2013/0222055 A1 | 8/2013 | Coumou et al. |
| 2013/0257311 A1 | 10/2013 | Tran et al. |
| 2013/0314163 A1 | 11/2013 | Costa |
| 2013/0320853 A1 | 12/2013 | Carter et al. |
| 2014/0009248 A1 | 1/2014 | Granger-Jones |
| 2014/0028389 A1 | 1/2014 | Coumou |
| 2014/0028398 A1 | 1/2014 | Owen |
| 2014/0049250 A1 | 2/2014 | Brown et al. |
| 2014/0055034 A1 | 2/2014 | Coumou |
| 2014/0061156 A1 | 3/2014 | Brouk et al. |
| 2014/0062303 A1 | 3/2014 | Hoffman et al. |
| 2014/0091875 A1 | 4/2014 | Shimomoto et al. |
| 2014/0097908 A1 | 4/2014 | Fisk, II et al. |
| 2014/0117861 A1 | 5/2014 | Finley et al. |
| 2014/0117872 A1 | 5/2014 | Finley |
| 2014/0118031 A1 | 5/2014 | Rughoonundon et al. |
| 2014/0210345 A1 | 7/2014 | Hoffman |
| 2014/0210551 A1 | 7/2014 | Mueller |
| 2014/0218076 A1 | 8/2014 | Coumou et al. |
| 2014/0220913 A1 | 8/2014 | Coumou et al. |
| 2014/0231243 A1 | 8/2014 | Finley |
| 2014/0232266 A1 | 8/2014 | Finley et al. |
| 2014/0266492 A1 | 9/2014 | Radomski et al. |
| 2014/0306742 A1 | 10/2014 | Menzer et al. |
| 2014/0320013 A1 | 10/2014 | Coumou et al. |
| 2015/0115289 A1 | 4/2015 | Fursin et al. |
| 2015/0200079 A1 | 7/2015 | Bhutta |
| 2015/0303033 A1 | 10/2015 | Bhutta |

(56) References Cited

U.S. PATENT DOCUMENTS

| | | |
|---|---|---|
| 2015/0348854 A1 | 12/2015 | Kapoor et al. |
| 2016/0134260 A1 | 5/2016 | Bhutta et al. |
| 2016/0308560 A1 | 10/2016 | Howald et al. |
| 2017/0278677 A1 | 9/2017 | Nagami |
| 2017/0345620 A1 | 11/2017 | Coumou et al. |
| 2018/0076788 A1 | 3/2018 | Decker et al. |
| 2018/0151331 A1 | 5/2018 | Liu et al. |
| 2019/0267212 A1 | 8/2019 | Mavretic |
| 2019/0272978 A1 | 9/2019 | Bhutta et al. |
| 2019/0287764 A1 | 9/2019 | Long et al. |
| 2020/0144032 A1 | 5/2020 | Ulrich |
| 2020/0150164 A1 | 5/2020 | Ulrich |
| 2020/0185195 A1 | 6/2020 | Haga |
| 2020/0211824 A1 | 7/2020 | Morii |
| 2020/0212868 A1 | 7/2020 | Morii |
| 2020/0212869 A1 | 7/2020 | Morii |
| 2020/0212892 A1 | 7/2020 | Morii |
| 2020/0212893 A1 | 7/2020 | Morii |
| 2020/0303166 A1 | 9/2020 | Morii |
| 2020/0411285 A1 | 12/2020 | Mavretic |
| 2021/0013009 A1 | 1/2021 | Oliveti et al. |
| 2021/0020411 A1 | 1/2021 | Savas et al. |
| 2021/0082732 A1 | 3/2021 | Mutyala et al. |
| 2021/0111009 A1 | 4/2021 | Van Greunen et al. |

OTHER PUBLICATIONS

Frenzel E. Louis, Jectronic Design, Back to Basics: Impedance Matching (Part 1), Advanced Energy Industries, Inc., Exhibit 1009, pp. 1-10.

Frenzel E. Louis, Jectronic Design, Back to Basics: Impedance Matching (Part 2), Advanced Energy Industries, Inc. Exhibit 1010, pp. 1-9.

Frenzel E. Louis, Jectronic Design, Back to Basics: Impedance Matching (Part 3), Advanced Energy Industries, Inc., Exhibit 1011, pp. 1-7.

Analog Devices, 10MHz, Four-Quadrant Multiplier/Divider AD734, Advanced Energy Industries, Inc., 2011, Exhibit 1018, pp. 1-20.

Analog Devices, Dual Ultrafast Voltage Comparator ADCMP566, Advanced Energy Industries, Inc., 2003, Exhibit 1019, pp. 1-16.

Analog Devices, 10-Bit, 105 MSPS/125 MSPS/150 MSPS, 1.8 V Dual Analog-to-Digital Converter AD9600, Advanced Energy Industries, Inc., 2007-2009, Exhibit 1020, pp. 1-72.

Analog Devices, LF-2.7 Ghz RF/IF Gain and Phase Detector AD8302, Advanced Energy Industries, Inc., 2002, Exhibit 1021, pp. 1-24.

Todorow, Valentin., Impedance Matching and Matching Networks, Advanced Energy Industries, Inc., 2009, Exhibit 1008, pp. 1-27.

* cited by examiner

SWITCHING CIRCUIT

CROSS REFERENCE TO RELATED APPLICATIONS

The present application is a continuation of U.S. patent application Ser. No. 17/209,071, filed Mar. 22, 2021, which is a continuation of U.S. patent application Ser. No. 17/022,760, filed Sep. 16, 2020, which is a continuation of U.S. patent application Ser. No. 16/410,862, filed May 13, 2019, which is a continuation in part of U.S. patent application Ser. No. 16/255,269 (now U.S. Pat. No. 10,679,823), filed Jan. 23, 2019, which is a continuation in part of U.S. patent application Ser. No. 16/211,961 (now U.S. Pat. No. 10,431,424), filed Dec. 6, 2018, which is a continuation in part of U.S. patent application Ser. No. 15/787,374, filed Oct. 18, 2017, which is a continuation in part of U.S. patent application Ser. No. 15/667,951, filed Aug. 3, 2017 (now U.S. Pat. No. 10,217,608), which is a continuation of U.S. patent application Ser. No. 15/384,904, filed Dec. 20, 2016 (now U.S. Pat. No. 9,729,122), which is a continuation in part of U.S. patent application Ser. No. 15/046,585, filed Feb. 18, 2016 (now U.S. Pat. No. 9,525,412), which is a continuation in part of U.S. patent application Ser. No. 14/734,053, filed Jun. 9, 2015 (now U.S. Pat. No. 9,306,533), which claims the benefit of U.S. Provisional Patent Application No. 62/118,552, filed Feb. 20, 2015.

U.S. patent application Ser. No. 16/410,862 further claims the benefit of U.S. Provisional Patent Application No. 62/670,990, filed May 14, 2018. U.S. patent application Ser. No. 16/255,269 further claims the benefit of U.S. Provisional Patent Application No. 62/620,781, filed Jan. 23, 2018. U.S. patent application Ser. No. 16/211,961 further claims the benefit of U.S. Provisional Patent Application No. 62/595,222, filed Dec. 6, 2017. U.S. patent application Ser. No. 15/787,374 further claims the benefit of U.S. Provisional Patent Application No. 62/409,635, filed Oct. 18, 2016. U.S. patent application Ser. No. 15/046,585 further claims the benefit of U.S. Provisional Patent Application Ser. No. 62/117,728, filed on Feb. 18, 2015. The foregoing references are incorporated herein by reference in their entireties.

BACKGROUND

Semiconductor wafer fabrication can use plasma processing to manufacture semiconductor devices, such as microprocessors, memory chips, and other integrated circuits and devices. Plasma processing involves energizing a gas mixture by introducing RF energy. This gas mixture is typically contained in a vacuum chamber, also called plasma chamber, and the RF energy is introduced through electrodes or other means in the chamber. In a typical plasma process, the RF generator generates power at an RF frequency and this power is transmitted through RF cables to the plasma chamber. To provide efficient transfer of power from the RF generator to the plasma chamber, a matching network is used.

The predominant variable capacitor in use in RF matching networks is the Vacuum Variable Capacitor (VVC). Electronically Variable Capacitor (EVC) technology, however, is emerging as an alternative, as EVCs can be switched more quickly. Faster switching enables faster matching, which enables faster manufacturing.

High power applications, however, present additional challenges. In low power applications, the use of EVCs is more straightforward because a low voltage matching network can be used. When a matching network is used in a high power application, however, a high voltage matching network is required. In a high voltage matching network, the ability to quickly switch EVCs may be limited by the types of high voltage switches that are used to switch the EVCs themselves. Thus, there exists a need for a high voltage switch that can be used in conjunction with an EVC in an RF matching network for quick switching of high voltages (e.g., 2000 volts or more). Further, beyond semiconductor fabrication and matching networks, there exists a general need for an improved high voltage switch.

BRIEF SUMMARY

In one aspect, the present disclosure is direct to an impedance matching circuit comprising a radio frequency (RF) input configured to couple to an RF source; an RF output configured to couple to a plasma chamber; and a control circuit; and a variable reactance circuit operably coupled to the control circuit and configured to provide a variable reactance, the variable reactance circuit comprising fixed reactance components and corresponding switching circuits, wherein each of the switching circuits comprises a diode; and a driver circuit operably coupled to the diode and configured to switch the diode, the driver circuit comprising, coupled in series a biasing current source positioned to provide a bias current to bias the diode; a first switch; a second switch; and a resistor; wherein, for each diode of each switching circuit, the control circuit is configured to (a) receive a value related to a voltage drop on the resistor, and (b) based on the value related to the voltage drop, adjust the bias current being provided by the biasing current source.

In another aspect, a semiconductor processing tool comprises a plasma chamber configured to deposit a material onto a substrate or etch a material from the substrate; and an impedance matching circuit operably coupled to the plasma chamber, the matching circuit comprising an RF input configured to couple to an RF source; an RF output configured to couple to the plasma chamber; and a control circuit; and a variable reactance circuit operably coupled to the control circuit and configured to provide a variable reactance, the variable reactance circuit comprising fixed reactance components and corresponding switching circuits, wherein each of the switching circuits comprises a diode; and a driver circuit operably coupled to the diode and configured to switch the diode, the driver circuit comprising, coupled in series a biasing current source positioned to provide a bias current to bias the diode; a first switch; a second switch; and a resistor; wherein, for each diode of each switching circuit, the control circuit is configured to (a) receive a value related to a voltage drop on the resistor, and (b) based on the value related to the voltage drop, adjust the bias current being provided by the biasing current source.

In another aspect, a method of impedance matching comprises operably coupling a matching network between an RF source and a plasma chamber, the matching network comprising a control circuit; and a variable reactance circuit operably coupled to the control circuit, the variable reactance circuit comprising fixed reactance components and corresponding switching circuits, wherein each of the switching circuits comprises a diode; and a driver circuit operably coupled to the diode and configured to switch the diode, the driver circuit comprising, coupled in series a biasing current source positioned to provide a bias current to bias the diode; a first switch; a second switch; and a resistor; altering a reactance of the variable reactance circuit by altering a state of at least one of the switching circuits; for each diode of each switching circuit receiving a value related to a voltage drop on the resistor; based on the value related to the voltage drop, adjusting the bias current being provided by the biasing current source.

BRIEF DESCRIPTION OF THE DRAWINGS

The foregoing summary, as well as the following detailed description of the exemplary embodiments, will be better understood when read in conjunction with the appended drawings. It should be understood, however, that the invention is not limited to the precise arrangements and instrumentalities shown in the following figures.

DETAILED DESCRIPTION

Figure 1A:
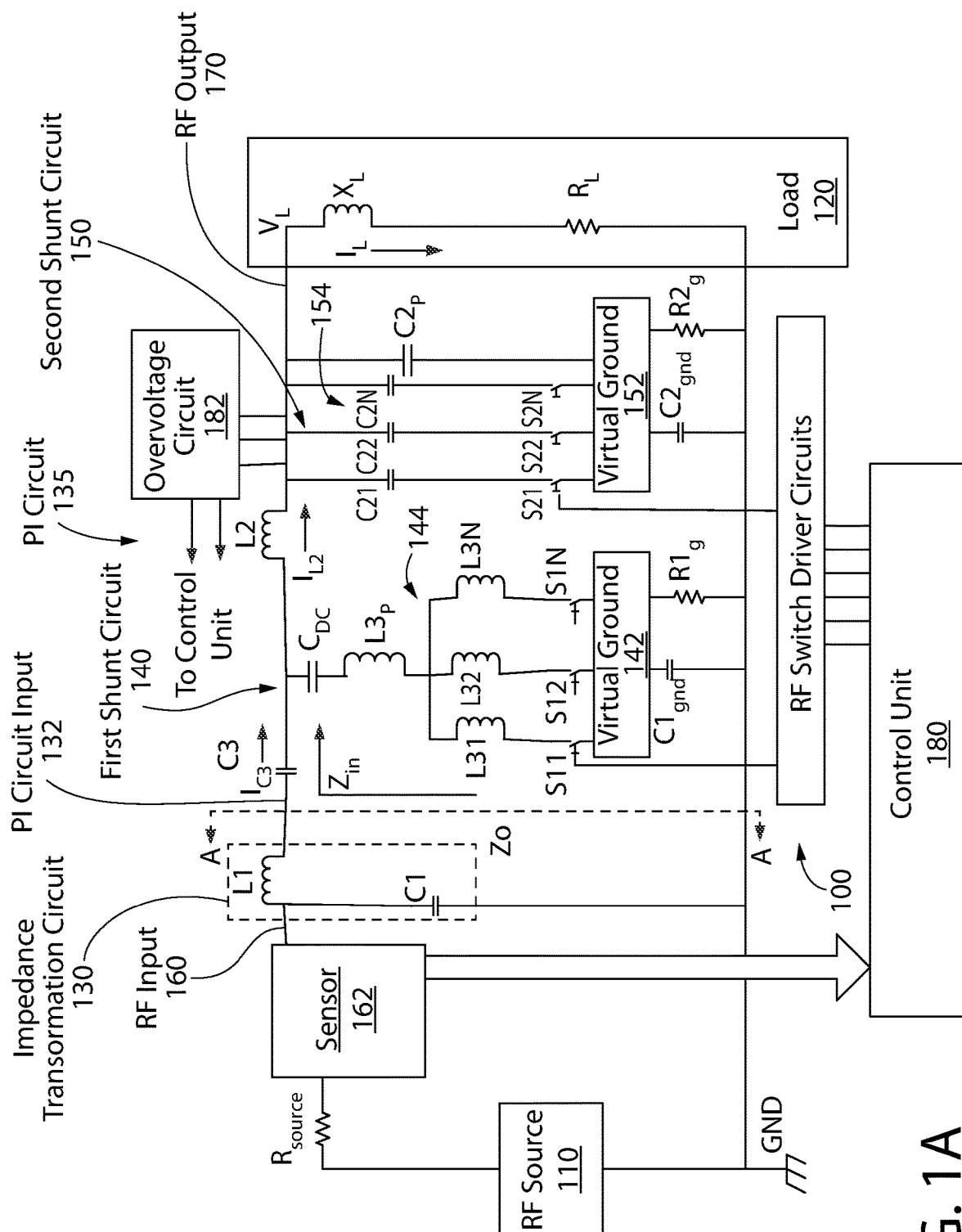
FIG. 1A is a schematic representation of a first embodiment of an RF impedance matching network.

The description of illustrative embodiments according to principles of the present invention is intended to be read in connection with the accompanying drawings, which are to be considered part of the entire written description. In the description of embodiments of the invention disclosed herein, where circuits are shown and described, one of skill in the art will recognize that for the sake of clarity, not all desirable or useful peripheral circuits and/or components are shown in the figures or described in the description. Moreover, the features and benefits of the invention are illustrated by reference to the disclosed embodiments. Accordingly, the invention expressly should not be limited to such disclosed embodiments illustrating some possible non-limiting combinations of features that may exist alone or in other combinations of features; the scope of the invention being defined by the claims appended hereto.

As used throughout, ranges are used as shorthand for describing each and every value that is within the range. Any value within the range can be selected as the terminus of the range. In addition, all references cited herein are hereby incorporated by reference in their entireties. In the event of a conflict in a definition in the present disclosure and that of a cited reference, the present disclosure controls.

Matching Network

As discussed above, to provide efficient transfer of power from the RF generator to the plasma chamber, a matching network is used. The purpose of the matching network is to transform the plasma impedance (usually a low value) to a value suitable for the RF generator. In many cases, particularly in wafer fabrication processes, the RF power is transmitted through 50 Ohm coaxial cables and the system impedance of the RF generators is also 50 Ohm. On the other hand, the impedance of the plasma, driven by the RF power, varies and this impedance must be transformed to non-reactive 50 Ohm (i.e., 50+j0) for maximum power transmission. RF matching networks perform this task of continuously transforming the plasma impedance to 50 Ohm for the RF generator. An RF matching network can include one or more variable capacitors and a microprocessor-based control circuit to control the capacitance values of the variable capacitors. The value and size of the variable capacitors are influenced by the power handling capability, the frequency of operation, and the impedance range of the plasma chamber.

The predominant variable capacitor in use in RF matching networks is the Vacuum Variable Capacitor (VVC). Electronically Variable Capacitor (EVC) technology, however, is emerging as an alternative, as EVCs can be switched more quickly. Faster switching enables faster matching, which enables faster manufacturing. EVCs comprise discrete capacitors that are switched in or out to alter the total EVC capacitance.

In the embodiments of an RF impedance matching network disclosed herein, the matching network is configured as a "PI" type matching network. By this configuration, the switching of the variable capacitance components and variable inductance components (sometimes referred to collectively as variable components or reactive components) occurs in the shunt of the matching circuit. Thus, unlike in other matching networks, such as "L" type matching networks, the exemplified matching network switches its reactive components to a ground and not in series. There are no variable inductors or capacitors in the series leg.

In these embodiments, an RF impedance matching network includes an RF input configured to couple to an RF source, the RF source having a fixed RF source impedance; an RF output configured to couple to a load, the load having a variable load impedance; a transformation circuit coupled to the RF input and configured to provide a transformed impedance that is less than the fixed source impedance; and a PI circuit having a first shunt circuit in parallel to the RF input and a second shunt circuit in parallel to the RF input and the RF output. The first shunt circuit includes a first shunt variable component providing a first variable capacitance or inductance; and a first virtual ground coupled to the first shunt variable component and a ground. The second shunt circuit includes a second shunt variable component providing a second variable capacitance or inductance; and a second virtual ground coupled to the second shunt variable component and the ground.

In general, the circuit configurations are tailored to either an inductive or capacitive load impedance of the chamber. Whether one configures a shunt circuit as an inductor or a capacitor will depend on factors such as frequency of operation, power, and the appropriate physical size of the element. For example, smaller inductors will be easier to package and layout, with lower heat dissipation that is easier to control. Specific embodiments will be described in more detail below.

Turning in detail to the drawings, FIG. 1A illustrates an RF impedance matching network 100 according to a first embodiment of the invention. The matching network 100 includes an RF input 160 configured to couple to an RF source 110, and an RF output 170 coupled to a load 120. A sensor 162 is coupled at the RF input 160 between the RF source 110 and the matching network 100. In the exemplified embodiment, the load 120 is a plasma chamber for semiconductor device fabrication. The semiconductor device can be microprocessor, a memory chip, or another type of integrated circuit or device. In other embodiments, the load 120 can be any load of variable impedance that can utilize an RF matching network.

In the exemplified embodiment, the RF impedance matching network 100 serves to help maximize the amount of RF power transferred from the RF source 110 to the plasma chamber 120 by matching the impedance at the RF input 160 to the fixed impedance of the RF source 110. The matching network 100 can consist of a single module within a single housing designed for electrical connection to the RF source 110 and plasma chamber 120. In other embodiments, the components of the matching network 100 can be located in different housings, some components can be outside of the housing, and/or some components can share a housing with a component outside the matching network 100.

As is known in the art, the plasma within a plasma chamber 120 typically undergoes certain fluctuations outside of operational control so that the impedance presented by the plasma chamber 120 is a variable impedance. Since the variable impedance of the plasma chamber 120 cannot be fully controlled, an impedance matching network may be used to create an impedance match between the plasma chamber 120 and the RF source 110.

Moreover, the impedance of the RF source 110 may be fixed at a set value by the design of the particular RF source 110. Although the fixed impedance of an RF source 110 may undergo minor fluctuations during use, due to, for example, temperature or other environmental variations, the impedance of the RF source 110 is still considered a fixed impedance for purposes of impedance matching because the fluctuations do not significantly vary the fixed impedance from the originally set impedance value. Other types of RF sources may be designed so that the impedance of the RF source may be set at the time of, or during, use. The impedance of such types of RF sources is still considered fixed because it may be controlled by a user (or at least controlled by a programmable controller) and the set value of the impedance may be known at any time during operation, thus making the set value effectively a fixed impedance.

The RF source 110 may be an RF generator of a type that is well-known in the art to generate an RF signal at an appropriate frequency and power for the process performed within the plasma chamber 120. The RF source 110 may be electrically connected to the RF input 160 of the RF impedance matching network 100 using a coaxial cable or similar means, which for impedance matching purposes would have the same fixed impedance as the RF source 110.

The plasma chamber 120 can include a first electrode and a second electrode, and in processes that are well known in the art, the first and second electrodes, in conjunction with appropriate control systems (not shown) and the plasma in the plasma chamber 120, enable one or both of deposition of materials onto a substrate and etching of materials from the substrate.

The sensor 162 is configured to monitor the RF signal output from the RF source 110. The sensor 162 can monitor an RF input parameter or multiple RF input parameters at the RF input 160. The sensor 162 can be any sensor configured to detect a parameter at the RF input 160. The input parameter can be any parameter measurable at the RF input 160 sufficient for operating the matching network 100. In the exemplified embodiment, the sensor 162 detects the voltage, current, and phase at the RF input 160 of the matching network 100. The sensor 162 can provide analog information to a control unit 180, where it is converted to a digital form. Based on the RF input parameter detected by the RF input sensor 162, the control unit 180 can determine the variable load impedance. The control unit 180 can further calculate the necessary switching positions on the shunt legs such that the proper inductance and capacitance is provided by the variable components 144, 154 for creating an impedance match. That is, the control unit 180 can determine a first shunt capacitance value for the first shunt variable capacitance component 144 and a second shunt capacitance value for the second shunt variable capacitance component 154 to create an impedance match at the RF input 160. The control unit 180 can then send a control the driver circuit 185 to alter a first shunt variable capacitance of the first shunt variable capacitance component 144; and alter a second shunt variable capacitance of the second shunt variable capacitance component 154 based on a second control signal received from the control unit 180. The match need not be a perfect matching of impedance. For example, an impedance match can result in 10% or less RF power reflected back to the RF source.

Most of the inductive and capacitive components used in the discussed embodiments can be designed on a ceramic substrate or some other material such as Rogers material that can withstand the temperature excursions. Particularly at higher power levels and large currents a capacitive array or/and inductive array may be specifically packaged to satisfy the thermal issues associated with current passing through the shunt elements and series elements at higher power levels. Many of these components will be either air cooled or water cooled, depending on the particular architecture used for a specific load.

Transformation Circuit

The matching network 100 of the exemplified embodiment includes both a PI circuit 135 and a transformation circuit 130. The fixed impedance transformation circuit 130 is located at the front-end of the matching network 100. The transformation circuit 130 is coupled to the RF input 160 and enables the impedance at cross-section A-A looking back toward RF input 160 to be lowered to a value that is less than the real part of the fixed RF source impedance, thus providing a desired lowered impedance at the input of the PI circuit 135 (the PI circuit input 132) that is less than the fixed impedance of the RF source 110. In this embodiment, the RF source impedance is fixed at 50 Ohms, and RF power is transmitted through coaxial cables which also have a fixed impedance of 50 Ohms. In other embodiments, the fixed impedance can be of a different value. In preferred embodiments, the lowered impedance is less than the real part of the load impedance ($R_L$).

The transformation circuit 130 includes an inductor L1 (sometimes referred to as a transformation inductor) and a capacitor C1 (sometimes referred to as a transformation capacitor). In this embodiment, the transformation inductor L1 is in series with the RF input 160, and the transformation capacitor C1 is in parallel to the RF input 160 and coupled to a chassis ground GND. In other embodiments, the configuration is reversed, with the capacitor in series with the RF input 160, and the inductor in parallel to the RF input 160 and coupled to the chassis ground GND. The configuration chosen depends on the remaining PI circuit 135 and the configuration that prevents the DC component of the load 120 returning to the RF source 110. The transformation circuit 130 is connected to a chassis ground GND (not the virtual grounds, which will be discussed below). In other embodiments, the chassis ground GND can be another type of ground.

In the exemplified embodiment, the transformation circuit 130 is configured to lower the impedance from 50 Ohms at the RF input 160 to approximately 15 Ohms at the PI circuit input 132 (the input of the PI circuit 135), with no imaginary part (or minimal imaginary part). Thus, for example, the output impedance ($Z_o$) of the transformation circuit 130 is approximately 15 Ohms+j0. The PI circuit 135 of the matching network 100 is designed for this reduced input impedance, referred to as $Z_{in}$ in FIGS. 1A-10. The interface between the output of the transformation circuit 130 and the PI circuit 135 is designated by line A-A.

The transformation circuit 130 can lower the voltage stresses on the matching network 100. Thus, high voltage stress on switches S11 to S1N and S21 to S2N will be lowered. Such lowered stress enhances the functioning of switches such as RF FET switches, PIN diodes, and insulated-gate bipolar transistors (IGBTs).

This lowered stress can be better understood by the following examples. In the first example, there is no transformation circuit. A 5,000 Watts RF generator (RF source) has a 50 Ohms output impedance ($R_{source}$) and a frequency of 27.12 MHz that is provided at the RF input 160 of the matching network 100. The matching network 100 is perfectly tuned to 50 Ohms at its input and has no reactive components present. The voltage ($V=\sqrt{PR}$) therefore will be $\sqrt{(5000W)(50Ohms)}$ or 500 V rms. The current (I=V/R) will be 500 V rms/50 Ohms, or 10 A rms.

In the second example, a transformation circuit lowers the impedance provided at the input 132 of the PI circuit 135 to 15 Ohms. The voltage ($V=\sqrt{PR}$) will now be $\sqrt{(5000W)(15Ohms)}$ or 273.9 V rms, and the current (I=V/R) will be 273.9 V rms/15 Ohms, or 18.3 A rms. Thus, the current increases by a factor of 1.83, while the voltage decreases by a factor of 1.83. The active components of the PI circuit 135 more easily handle current than voltage. Thus, the transformation circuit's reduction of voltage causes less stress on the active components. A designer can choose for his convenience appropriate impedance reduction factor. That reduction factor depends on chamber load impedance and its real part ($Z_L=R_L+/-jX_L$). In preferred embodiments, the reduced input impedance $Z_{in}$ is less than the real part of the load impedance ($R_L$).

PI Circuit

The PI circuit 135 of FIG. 1A includes a series capacitor C3 in series with the RF input 160 and coupled between the transformation inductor L1 and the RF output 170. The series capacitor C3 can decouple the DC component to help prevent the DC component of the load 120 from returning to the RF source 110. The PI circuit 135 further includes a series inductor L2 in series with the RF input 160 and coupled between the series capacitor C3 and the RF output 170. The PI circuit 135 further includes a first shunt circuit 140 in parallel to the RF input 160 and a second shunt circuit 150 parallel to the RF input 160.

The first shunt circuit 140 includes a first shunt capacitor CDC and a first shunt padding inductor $L3_P$. The first shunt capacitor CDC can decouple the DC component of the plasma coming back toward the switches S11, S12, S1N, such that the switches are not burdened with large components of the DC voltage. The first shunt circuit 140 further includes a first shunt variable inductive component 144 comprising (a) a plurality of first shunt inductors L31, L32, L32 coupled in parallel to the first shunt padding inductor L3$_P$, and (b) a plurality of first shunt switches S11, S12, S1N coupled to the plurality of first shunt inductors L31, L32, L32 and configured to connect and disconnect each of the plurality of first shunt inductors L31, L32, L32 to a first virtual ground 142. Also included is a first shunt ground capacitor C1$_{gnd}$ coupled between the second virtual ground and the ground GND. The first shunt ground capacitor C1$_{gnd}$ and a first shunt ground inductance inherent to the first virtual ground 142 can resonate in series to provide the lowest possible impedance from the virtual ground to the ground GND. The first shunt circuit 140 further includes a first shunt galvanic return resistor R1$_G$ coupled between the first virtual ground 142 and the ground GND. The first shunt ground capacitor C1$_{gnd}$ and the first shunt galvanic return resistor R1$_G$ are coupled in parallel.

The second shunt circuit 150 includes a second shunt variable capacitance component 154 comprising (a) a plurality of second shunt capacitors C21, C22, C2N coupled in parallel, and (b) a plurality of second shunt switches S21, S22, S2N coupled to the plurality of second shunt capacitors C21, C22, C2N and configured to connect and disconnect each of the plurality of second shunt capacitors C21, C22, C2N to a second virtual ground 152. The circuit further includes a padding capacitor C2$_P$ coupled in parallel to at least one of the plurality of second shunt capacitors C21, C22, C2N, the padding capacitor C2$_P$ coupled to the second virtual ground 152. The circuit further includes a second shunt ground capacitor C2$_{gnd}$ coupled between the second virtual ground 152 and the ground GND, and a second shunt galvanic return resistor R2$_G$ coupled between the second virtual ground 152 and the ground GND. The second shunt ground capacitor C2$_{gnd}$ and the first shunt galvanic return resistor R2$_G$ are coupled in parallel. The capacitors, inductors, and resistors discussed herein can refer to any components of suitable design to provide capacitance, inductance, and resistance, respectively. In preferred embodiments, the matching network is designed such that, for a particular load, there is minimal possible variation of capacitors and inductors, thereby allowing the fewest possible switches. Padding capacitors and padding inductors are capacitors and inductors that do not need to be switched.

The variable inductance components discussed herein can refer to a plurality of shunt inductors and coupled switches, and is sometimes referred to as an inductive array or simply a variable inductor. Similarly, the variable capacitance components discussed herein can refer to a plurality of shunt capacitors and coupled switches, and is sometimes referred to as a capacitive array or simply as a variable capacitor. A variable inductance component can refer to any structure capable of providing a variable inductance, and a variable capacitance component can refer to any structure capable of providing a variable capacitance. For example, the variable capacitance component can be an electronic variable capacitor (EVC), as described in U.S. Pat. No. 7,251,121. By these components, the capacitances and inductances provided in the shunt legs can be controlled such that the combined impedances of the RF impedance matching network 100 and the plasma chamber match, or at least substantially match, the fixed impedance of the RF source 110. A first shunt variable inductance component 144 and a second shunt variable capacitance component 154 are shown in FIG. 1A.

Virtual Ground

Figure 1B:
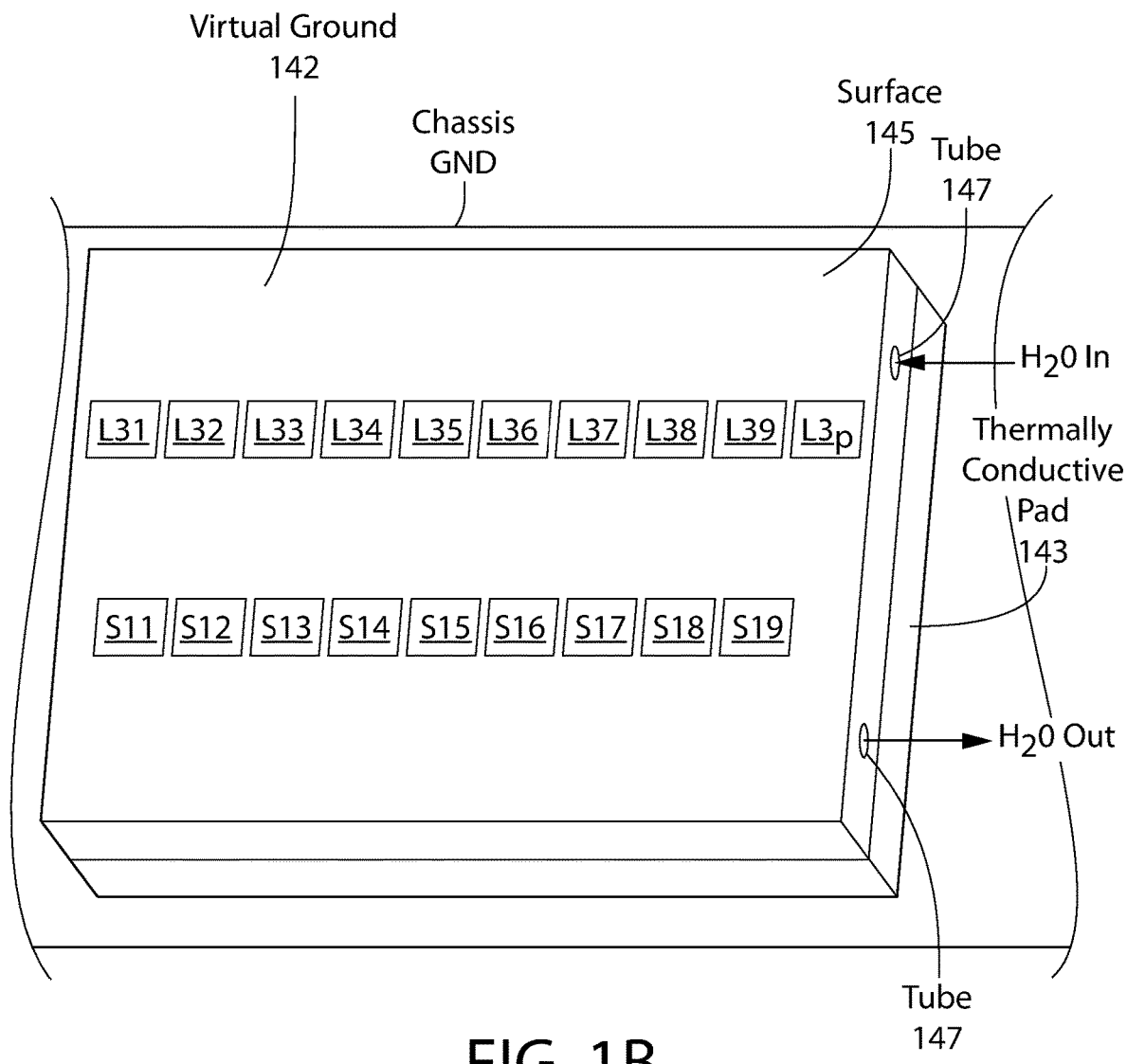
FIG. 1B is a representation of a first embodiment of a virtual ground.

As discussed above, the switches are not connected directly to chassis ground GND but to a virtual ground 142, 152. FIG. 1B shows an embodiment of the first virtual ground 142. The same or a similar structure can be used for virtual ground 152 and the other virtual grounds disclosed herein. In the exemplified embodiment of FIG. 1B, the virtual ground 142 is an aluminum plate with embedded tubes 147. The virtual ground 142 is water cooled, with water (H$_2$O) flowing in and out of the embedded tubes 147. The virtual ground can include thermally conductive isolation pads or paste between the virtual ground surface 145 and the chassis GND to conduct heat and to separate the virtual ground from the chassis ground GND. The pad 143 is not electrically conductive. In other embodiments, the virtual ground 142, 152 can be any electrically conductive component that is physically separated from a ground. For example, the virtual ground can be arranged vertically or include fins. Further, the virtual ground can include other cooling means. For example, at low power applications, the virtual ground can be air cooled. Standard heat sinking methods can be applied.

In the exemplified embodiment of FIG. 1B, nine switches S11-S19 are mounted on the surface 145 of the virtual ground 142. The nine switches S11-S19 correspond with switches S11, S12, and S1N of FIG. 1A, since the "N" can refer to any total number of switches (or any total number of inductors or capacitors as "N" is used elsewhere in the drawings). In other embodiments, more or less switches can be used, depending on the required accuracy of the variable inductance (or variable capacitance in other embodiments). Switchable and padding components L31-L39 and L3$_P$ (corresponding to L31, L32, L3N, L3$_P$ of FIG. 1A) can also be mounted on the surface 145 of the first virtual ground 142, as shown in FIG. 1B. The exemplified embodiment uses nine switchable inductors, though, as with the switches discussed above, any number of switchable inductors (or switchable capacitors depending on the embodiment) can be used. Further, the other virtual grounds disclosed herein can be configured similarly. Thus, the switchable and padding components C21, C22, C2N, C2$_P$ of the second shunt circuit 150 can be mounted on a surface of the second virtual ground 152 in a manner similar to the surface 145 of virtual ground 142 shown in FIG. 1B. Further, similar virtual grounds can be used for the matching network embodiments shown in FIGS. 2-10. For example, virtual ground 242 of FIG. 2 can use a virtual ground configuration similar to that shown in FIG. 1B, but where capacitors C11, C12, C1N, C1$_P$ are mounted on the surface of the virtual ground 242 instead of inductors L31-L39 and L3$_P$.

As shown in FIG. 1A, the virtual ground 142, 152 can be connected to a common RF chassis ground GND via a ground capacitor C1$_{gnd}$, C2$_{gnd}$. The virtual ground 142, 152 has an inherent inductance (L$_{gnd}$) that is generally small. This inherent inductance can connect in series with the ground capacitor to create a series resonant circuit. The series resonant circuit acts as a short at the frequency of operation. There is also a galvanic return resistor designated as R1$_G$ or R2$_G$ that has a much larger value than the series resonance impedance of L$_{gnd}$ and C$_{gnd}$. Thus, the galvanic connection does not pass the main RF current.

By using a virtual ground for each shunt circuit of variable components, each branch return of RF-switched current can go to one point ground. Since the shunt branch RF current can be very large, they will be much easier to control and to stream them away from, for example, FET gate driving low voltage circuitry. Further, noise immunity and RF interference within the matching network will be much easier to control.

By the virtual ground, the switches in a shunt circuit can be connected to a platform from which heat can be better controlled and extracted if needed. The RF currents flowing from the tuning capacitors or inductors (e.g., L31, S21) will always flow into the virtual ground 142. The virtual ground 142 can also reduce the coupling capacitance from the back side of the switches and their respective FETs to a ground. Each variable capacitive or inductive component 144, 154 can have a separate virtual ground 142, 152 to further reduce the capacitive cross talk among the switches. The separation of switched currents in the virtual ground can help reduce the jitter noise in the switches as well as cross talk among the switches. These currents can be very difficult to control at very high RF power levels. The virtual ground can ease the design of high power switches.

After full layout of the circuit, one can determine the inductance of the ground connections. A capacitance can be determined for some very small impedance from virtual ground to the chassis ground GND by calculating the needed capacitance $C_{gnd}$. In a preferred embodiment, the capacitor $C_{gnd}$ has a very low ESR (equivalent series resistance) and should withstand several kilovolts of voltage breakdown in case of overvoltage occurrence on the RF switches. Choosing the proper components can prevent the network from being under high voltage stress. The embodiment shown in FIG. 1A is useful for an inductive load chamber and powers below 5 kW.

In the matching network 100 of FIG. 1A and certain other embodiments discussed hereafter, a bypass capacitor CDC (or C4) forms part of the shunt circuit 140 for the purpose of decoupling the DC voltage that may be reflected from the chamber load 120. This capacitance is not part of the matching network 100 in that this capacitance is not used for matching purposes. The capacitor CDC can sustain high voltage swings coming back from the load 120 and can pass very large RF currents. For instance, at RF power P=5 kW, these currents may be in the order of 100 A rms. The bypass capacitor CDC can be in series with the variable shunt inductance and can prevent the DC voltage returning from the chamber 120 from reaching the RF switches.

In the exemplified embodiment, the switches use field effect transistors (FETs). In other embodiments, the switches use PIN/NIP diodes, a Micro Electro Mechanical (MEM) switch, a solid state relay, bipolar transistors, insulated-gate bipolar transistors (IGBTs), and the like. In the exemplified embodiment, each switch turns a capacitor or inductor ON or OFF to control the overall capacitance or inductance provided by the variable components 144, 154, thus enabling the matching network 100 to provide variable capacitance and variable inductance in the shunt legs. In alternative embodiments, a switch can be configured to control more than one capacitor or inductor.

The matching network 100 includes one or more RF switch driver circuits 185. The driver circuits 185 are configured to switch the plurality of switches S11, S12, S1N, S21, S22, S2N. Each of the driver circuits 185 can include several discrete driving circuits, with each discrete driving circuit configured to switch one of the switches.

The matching network 100 further includes a control unit 180. The control unit 180 is the brains of the RF impedance matching network 100 as it receives multiple inputs from sources such as the sensor 162 and the driver circuits 185 and makes calculations necessary to determine changes to the variable capacitance and inductance components 144, 154, and delivers commands to these components 144, 154 to create the impedance match. The control unit 180 can be of the type that is commonly used in semiconductor fabrication processes, and therefore known to those of skill in the art.

The control unit 180 can be configured with an appropriate processor and/or signal generating circuitry to provide an input signal for controlling the driver circuits 185. The control unit 180 of the matching network 100 can be a standard DSP- and FPGA-based architecture. The control unit 180 can house several other circuits, including an overvoltage conditioning circuit 182 for switching off all the active switches in the case of overvoltage at the output of the match. The overvoltage circuit 182 can indicate to the control board when to go into the shutdown condition.

In the exemplified embodiment, the control unit 180 includes a processor. The processor may be any type of properly programmed processing device, such as a computer or microprocessor, configured for executing computer program instructions (e.g. code). The processor may be embodied in computer and/or server hardware of any suitable type (e.g. desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. The processor of the exemplified embodiment is configured with specific algorithms to enable matching network 100 to perform the functions described herein.

A power supply (not shown) can be connected to the driver circuits 185, control unit 180, and sensor 162 to provide operational power, at the designed currents and voltages, to each of these components.

The inductive and capacitive shunt designs in the PI configuration enable low voltage stresses on the variable components. High voltage stress is particularly hard on active FET switches that must switch large potentials as well as large currents at the power levels on the order of 5 kW. Since the disclosed embodiments do not switch any series components in these PI configurations, they are fixed in this matching network 100, and therefore there are lower voltages on the shunt capacitive or inductive components. This will be shown later in a tabular form.

At lower frequencies the inductors may be discrete since they will have inherently larger values. At higher frequencies such as 13.56 MHz, 27.12 MHz, 40.68 MHz, and 60 MHz, the inductors can be made by a method called spiral inductors and printed on a ceramic substrate.

Figure 2:
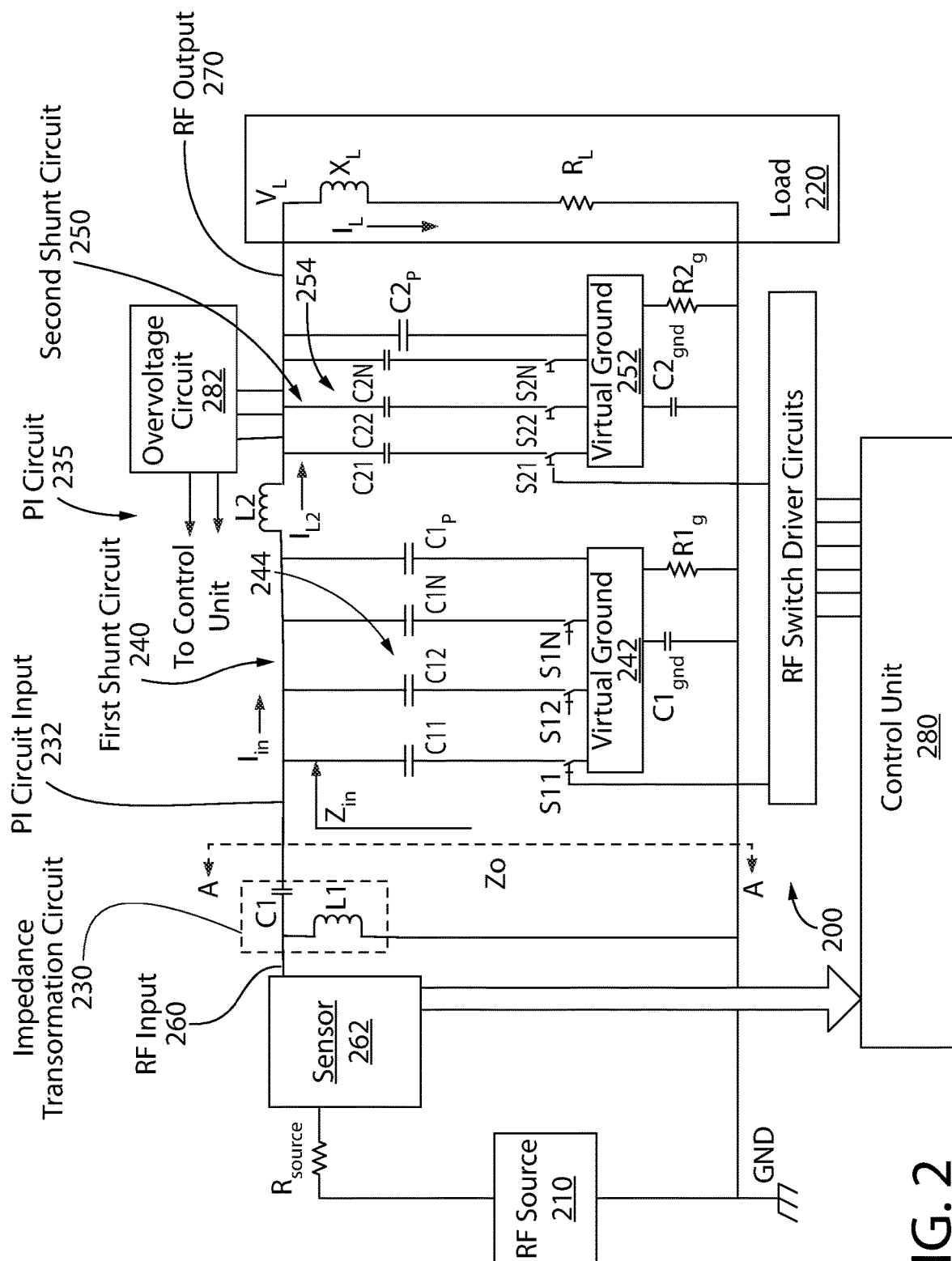
FIG. 2 is a schematic representation of a second embodiment of an RF impedance matching network.

FIG. 2 is a schematic representation of a second embodiment of an RF impedance matching network 200. As will be described, this embodiment uses variable capacitance components 244, 254 in both shunt legs. As in FIG. 1A, the matching network 200 includes an RF input 260 configured to couple to an RF source 210 and an RF output 170 configured to couple to a load 220, a transformation circuit 230, and a PI circuit 235.

The transformation circuit 230 is again coupled to the RF input 260 and configured to provide a transformed impedance that is less than the fixed source impedance. The transformation capacitor C1, however, is in series with the RF input 260, and the transformation inductor L1 is in parallel to the RF input and coupled to the chassis ground GND.

The first shunt circuit 240 is in parallel to the RF input 260. The circuit 240 includes a first shunt variable capacitance component 244 comprising (a) a plurality of first shunt capacitors C11, C12, C1N coupled in parallel, and (b) a plurality of first shunt switches S11, S1, S13 coupled to the plurality of first shunt capacitors C11, C12, C1N and configured to connect and disconnect each of the plurality of first shunt capacitors C11, C12, C1N to a first virtual ground 242. The first shunt circuit 240 further includes a padding capacitor $C1_P$ ("first shunt padding capacitor") coupled in parallel to at least one of the plurality of first shunt capacitors C11, C12, C1N, the first shunt padding capacitor $C1_P$ coupled to the first virtual ground 242; a capacitor $C1_{gnd}$ ("first shunt ground capacitor") coupled between the first virtual ground 242 and the ground GND; and a resistor $R1_G$ ("first shunt galvanic return resistor") coupled between the first virtual ground 242 and the ground GND.

The second shunt circuit 250 is also in parallel to the RF input 260. Similar to the first shunt circuit 240, the second shunt circuit 250 includes a second shunt variable capacitance component 254 comprising (a) a plurality of second shunt capacitors C21, C22, C2N coupled in parallel, and (b) a plurality of second shunt switches S21, S22, S2N coupled to the plurality of second shunt capacitors C21, C22, C2N and configured to connect and disconnect each of the plurality of second shunt capacitors C21, C22, C2N to a second virtual ground 252. The second shunt circuit 250 further includes a padding capacitor $C2_P$ ("second shunt padding capacitor") coupled in parallel to at least one of the plurality of second shunt capacitors C21, C22, C2N, the second shunt padding capacitor $C2_P$ coupled to the second virtual ground 252; a capacitor $C2_{gnd}$ ("second shunt ground capacitor") coupled between the second virtual ground 252 and the ground GND; and a resistor $R2_G$ ("second shunt galvanic return resistor") coupled between the second virtual ground 252 and the ground GND.

The matching network 200 further includes a series inductor L2 in series with the RF input 260 and coupled between the transformation capacitor C1 and the RF output 270. The embodiment of the matching network 200 shown in FIG. 2 is useful for inductive and capacitive loads. Since it has only one inductor in the series leg, it is efficient. It is useful for high power applications that are less than 10 kW.

Figure 3:
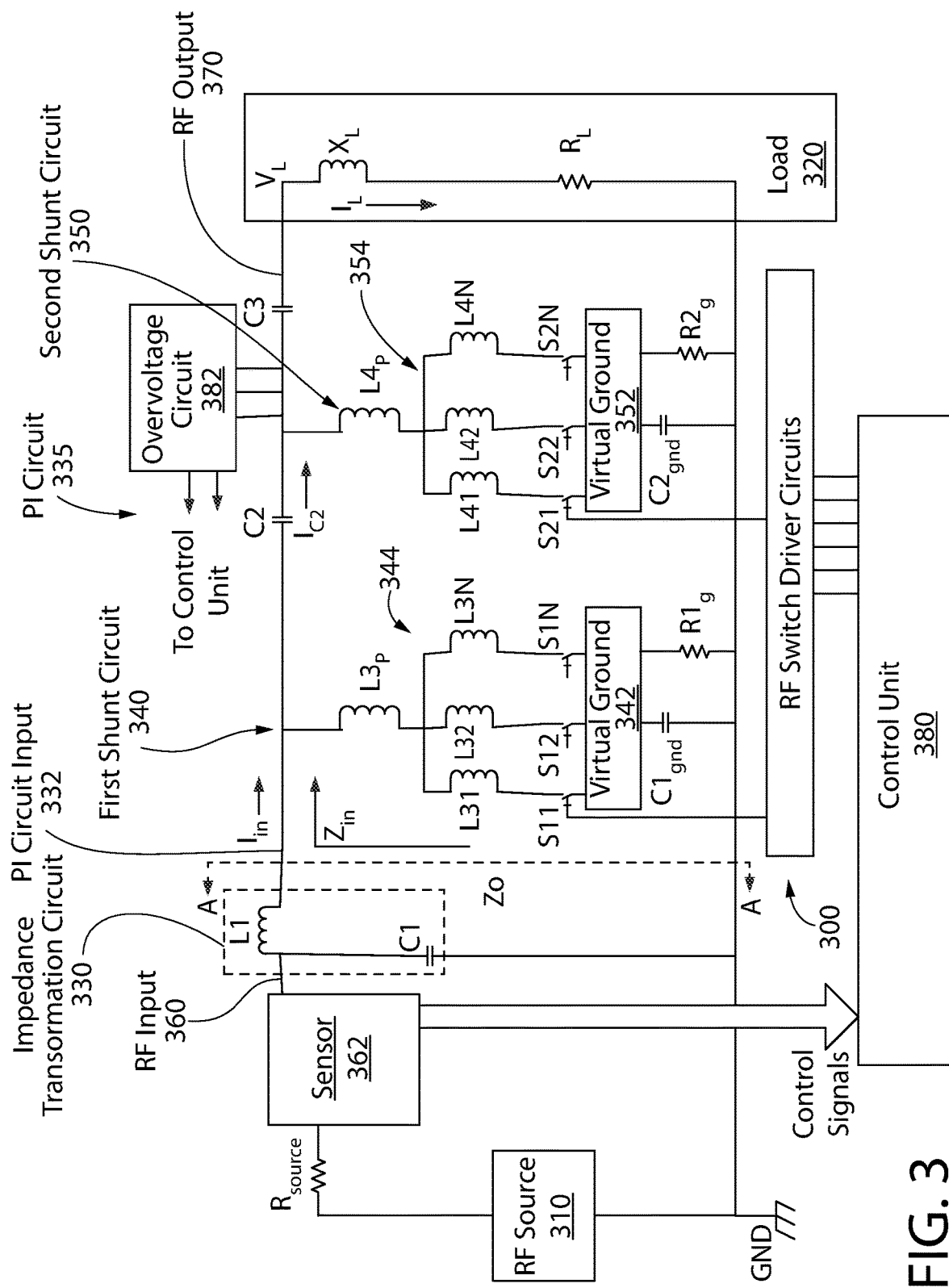
FIG. 3 is a schematic representation of a third embodiment of an RF impedance matching network.

FIG. 3 is a schematic representation of a third embodiment of an RF impedance matching network 300. In this embodiment, variable inductors 344, 354 are used in both shunt legs. As in the previous figures, the matching network 300 includes an RF input 360 configured to couple to an RF source 310 and an RF output 370 configured to couple to a load 320, a transformation circuit 330, and a PI circuit 335.

Similar to the embodiment shown in FIG. 1A, the transformation inductor L1 is in series with the RF input 360, and the transformation capacitor C1 is in parallel to the RF input 360 and coupled to a chassis ground GND. Also similar to FIG. 1A, the first shunt circuit 340 includes a first shunt padding inductor $L3_P$; a plurality of first shunt inductors L31, L32, L3N coupled in parallel to the first shunt padding inductor $L3_P$; a plurality of first shunt switches S11, S12, S1N coupled to the plurality of first shunt inductors L31, L32, L3N and configured to connect and disconnect each of the plurality of first shunt inductors L31, L32, L3N to a first virtual ground 342; a first shunt ground capacitor $C1_{gnd}$ coupled between the second virtual ground 352 and the ground GND; and a first shunt galvanic return resistor $R1_G$ coupled between the first virtual ground 342 and the ground GND. The second shunt circuit 350 is configured similar to the first shunt circuit 340. The matching network 300 further includes a first series capacitor and a second series capacitor coupled in series between the RF input 360 and the RF output 370.

The embodiment of the matching network 300 shown in FIG. 3 has only one inductor in the series leg and therefore is more efficient. It is useful for high power applications up to more than 5 kW. It is useful for inductive loads.

Figure 4:
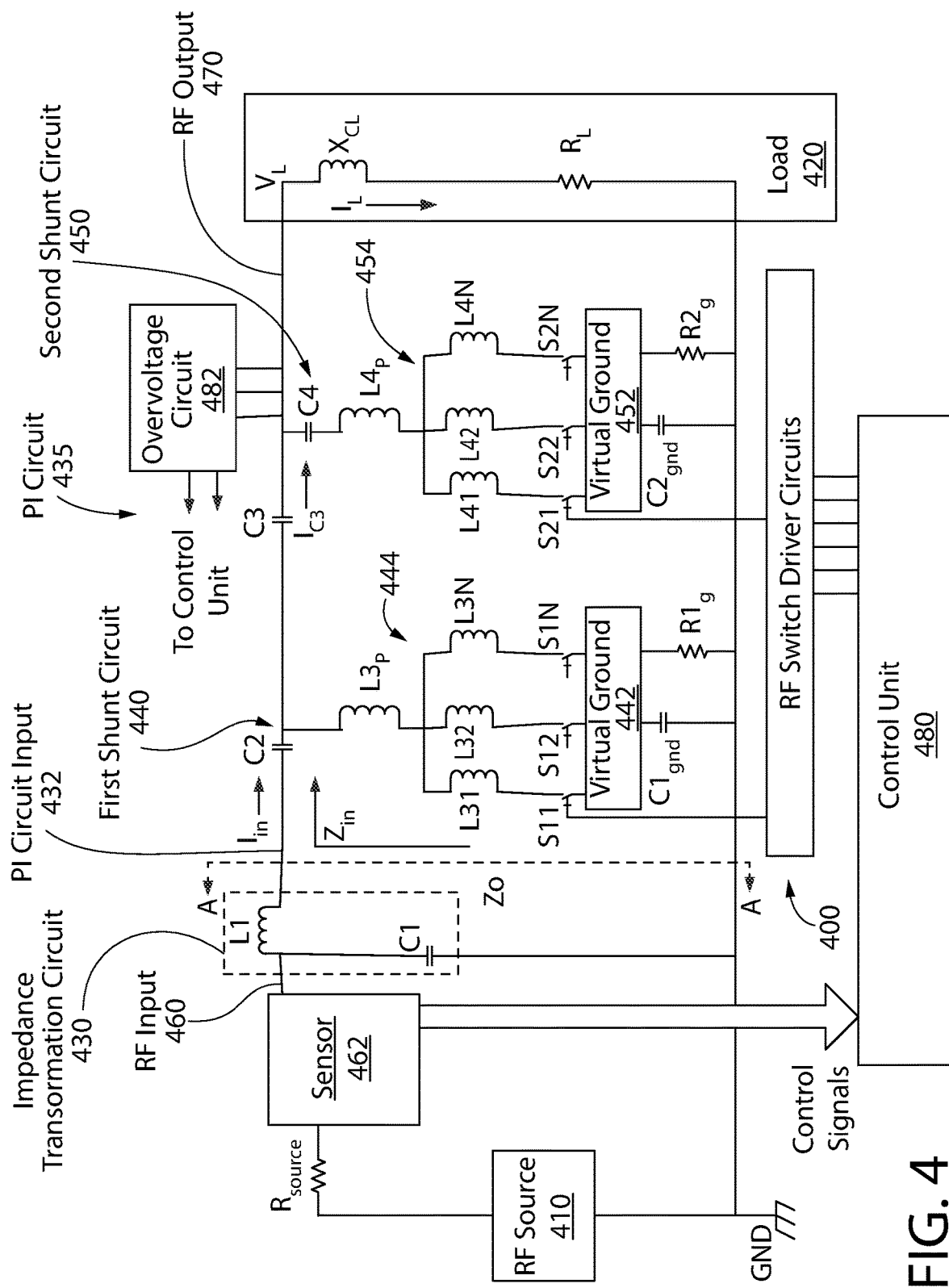
FIG. 4 is a schematic representation of a fourth embodiment of an RF impedance matching network.

FIG. 4 is a schematic representation of a fourth embodiment of an RF impedance matching network 400. This embodiment is similar to the embodiment shown in FIG. 3, however, the first series capacitor C2 is coupled between the RF input 460 and the first shunt circuit 440, the second series capacitor C3 is coupled between the first shunt circuit 440 and the second shunt circuit 450, and a single capacitor C4 is coupled in series with the padding inductor $L4_P$ in the second shunt circuit 450. The embodiment of the matching network 400 shown in FIG. 4 has only one inductor in the series leg and therefore is useful in higher power matching designs, up to approximately 10 kW. The series capacitor C3 is moved away from high current in the load loop, which improves efficiency and therefore usefulness for high RF power matching.

Figure 5:
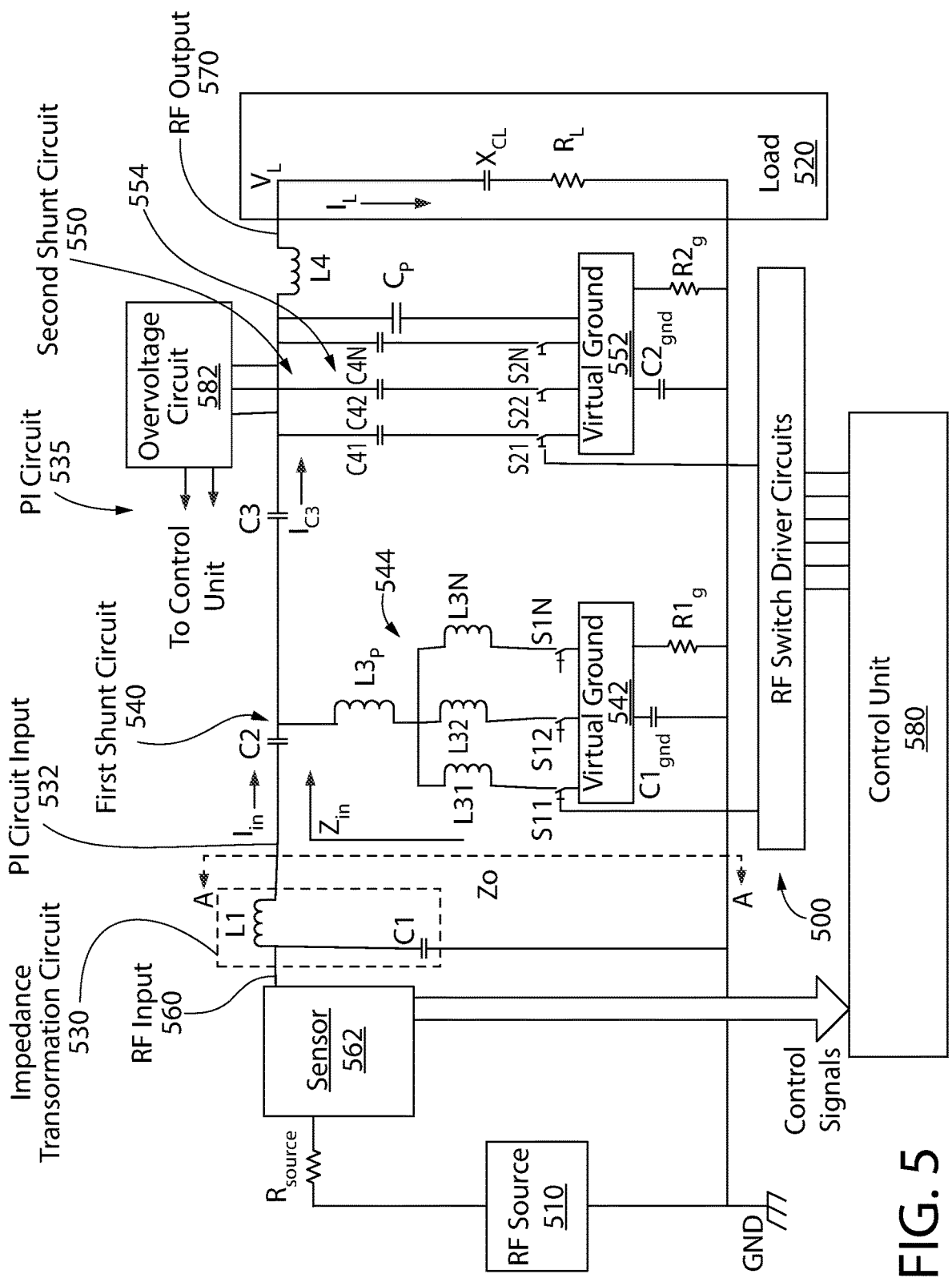
FIG. 5 is a schematic representation of a fifth embodiment of an RF impedance matching network.

FIG. 5 is a schematic representation of a fifth embodiment of an RF impedance matching network 500. This embodiment is similar to the embodiment shown in FIG. 1A, however, the series inductor L2 is replaced with a series capacitor C3, a series inductor L4 is added, and single capacitor CDC in the first shunt circuit 140 of FIG. 1A is eliminated. The embodiment of the matching network 500 shown in FIG. 5 is useful at lower powers up to 5 kW.

Figure 6:
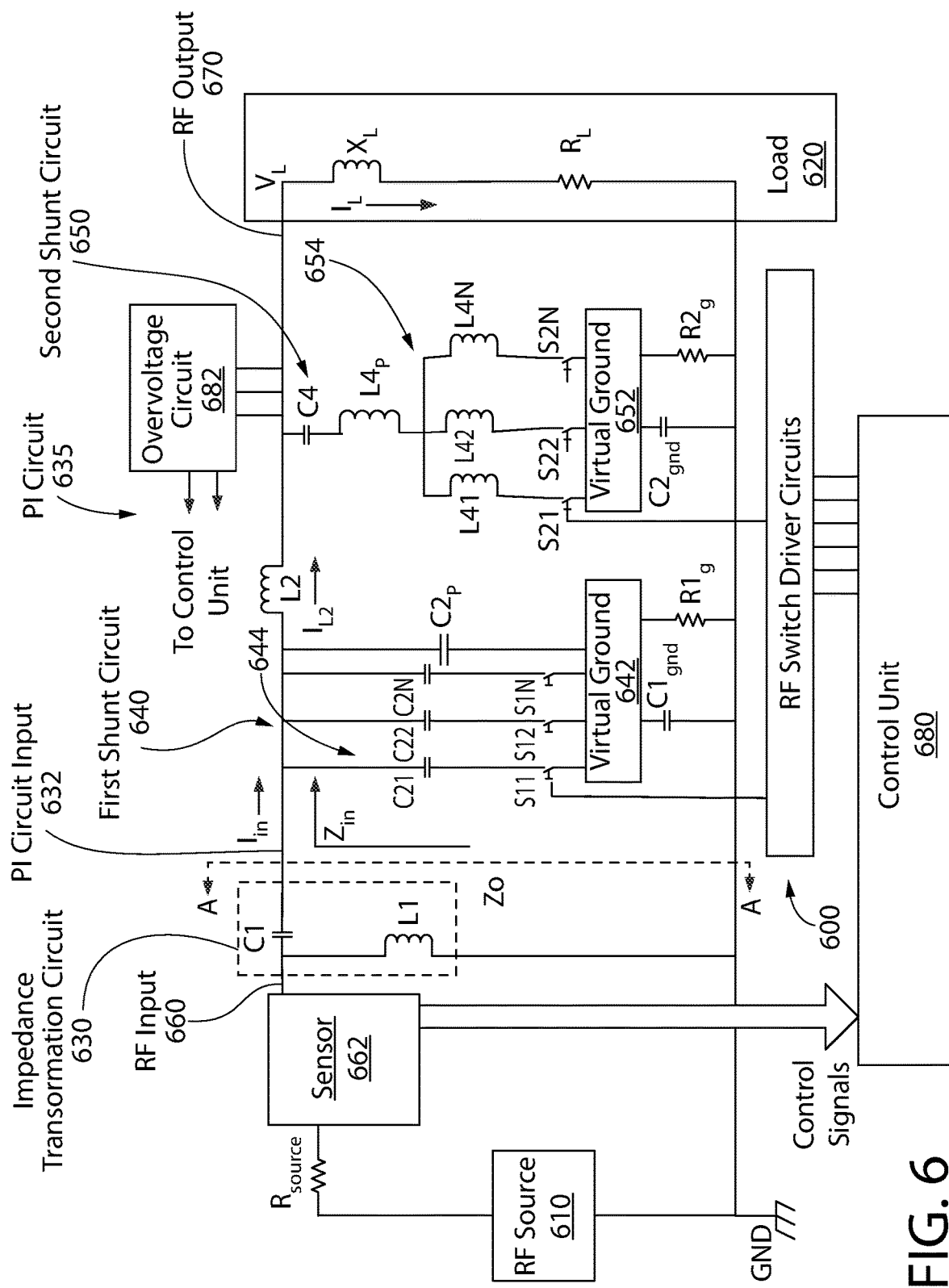
FIG. 6 is a schematic representation of a sixth embodiment of an RF impedance matching network.

FIG. 6 is a schematic representation of a sixth embodiment of an RF impedance matching network 600. This embodiment is similar to the embodiment shown in FIG. 1A, however, the inductor L1 and capacitor C1 of the transformation circuit 630 are reversed, the series capacitor C3 of FIG. 1A is eliminated, and the positioning of the first and second shunt circuit 650s is reversed, such that the first shunt circuit 640 has the plurality of switching capacitors C21, C22, C2N, and the second shunt circuit 650 has the plurality of switching inductors L41, L42, L4N. The embodiment of the matching network 600 shown in FIG. 6 is useful for medium-to-high powers and inductive loads. Since it has only one inductor in the series leg, it can provide good efficiency.

Figure 7:
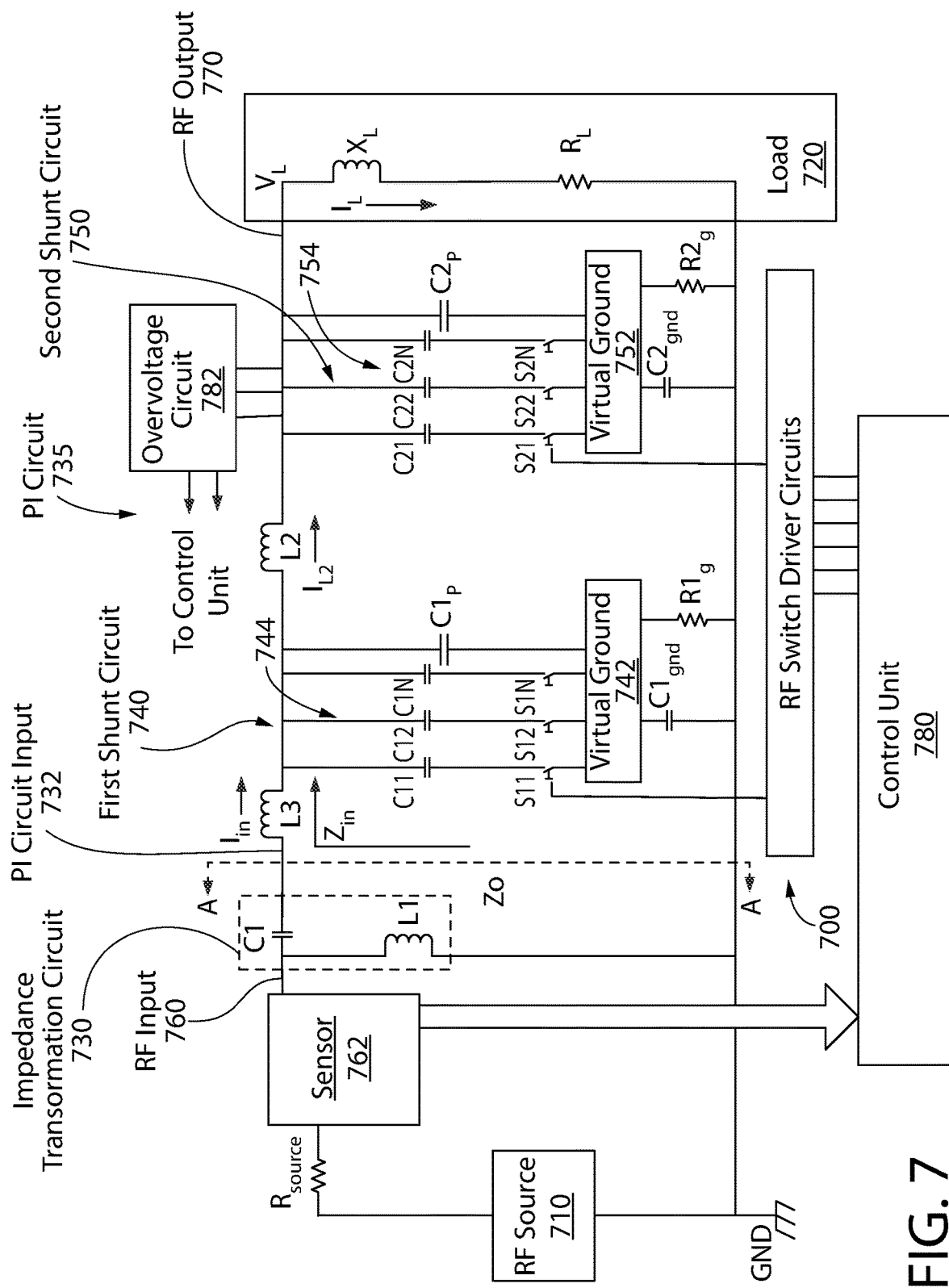
FIG. 7 is a schematic representation of a seventh embodiment of an RF impedance matching network.

FIG. 7 is a schematic representation of a seventh embodiment of an RF impedance matching network 700. This embodiment is similar to the embodiment shown in FIG. 2, however, a series inductor L3 is coupled between the transformation capacitor C1 and the first shunt circuit 740. The embodiment of the matching network 700 shown in FIG. 7 has two inductors in the series leg, and therefore is used for lower powers below 5 kW.

Figure 8:
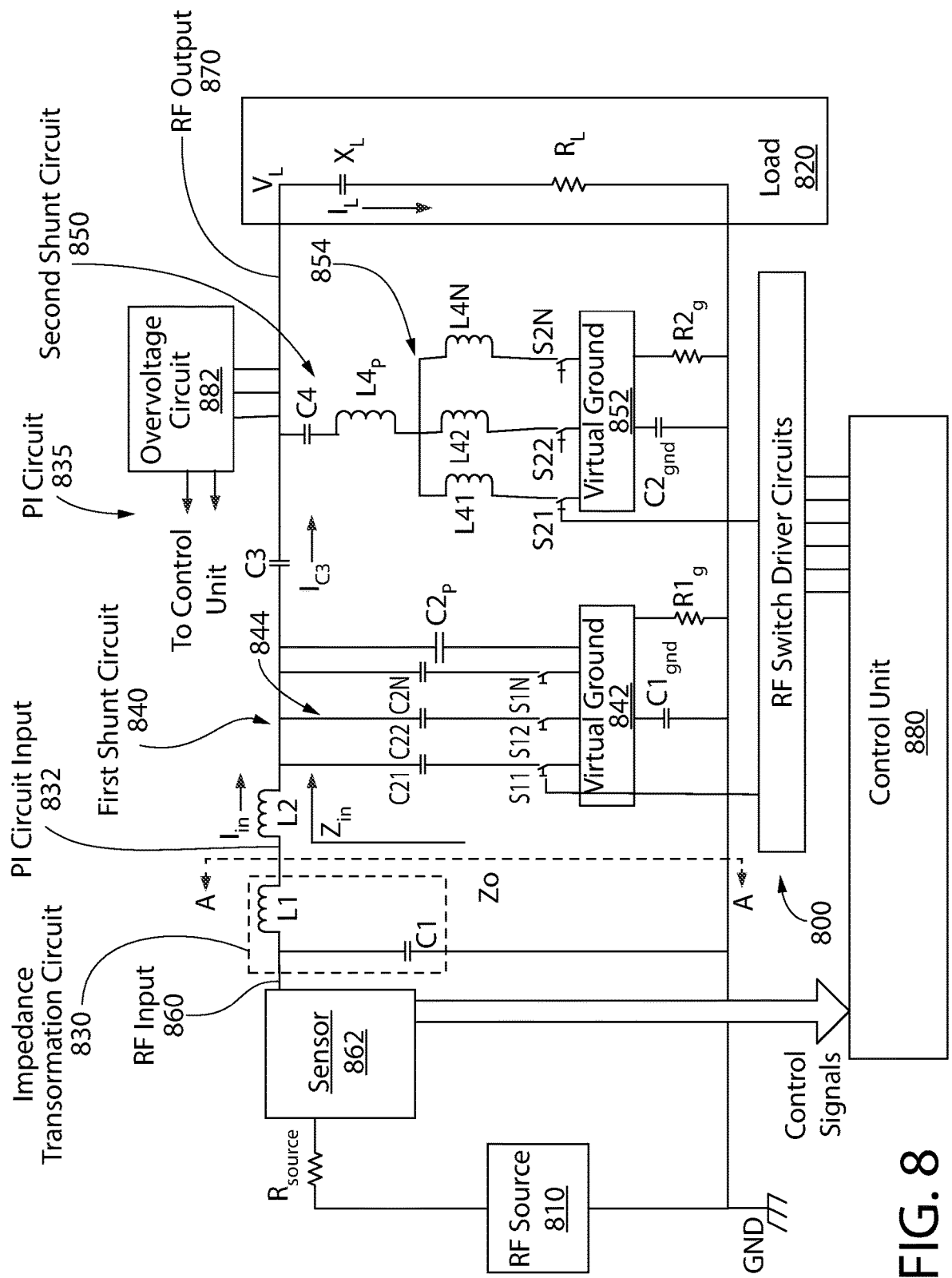
FIG. 8 is a schematic representation of an eighth embodiment of an RF impedance matching network.

FIG. 8 is a schematic representation of an eighth embodiment of an RF impedance matching network 800. This embodiment is similar to the embodiment shown in FIG. 6, however, the inductor L1 and capacitor C1 of the transformation circuit 830 are reversed, a series inductor L2 is added between the transformation inductor L1 and the first shunt circuit 840, and the series inductor L2 between the first and second shunt circuits 840, 850 is replaced with a series capacitor C3. The embodiment of the matching network 800 shown in FIG. 8 is useful for capacitive chamber loads. There are two inductors in the series leg and it is useful for applications below 5 kW.

Figure 9:
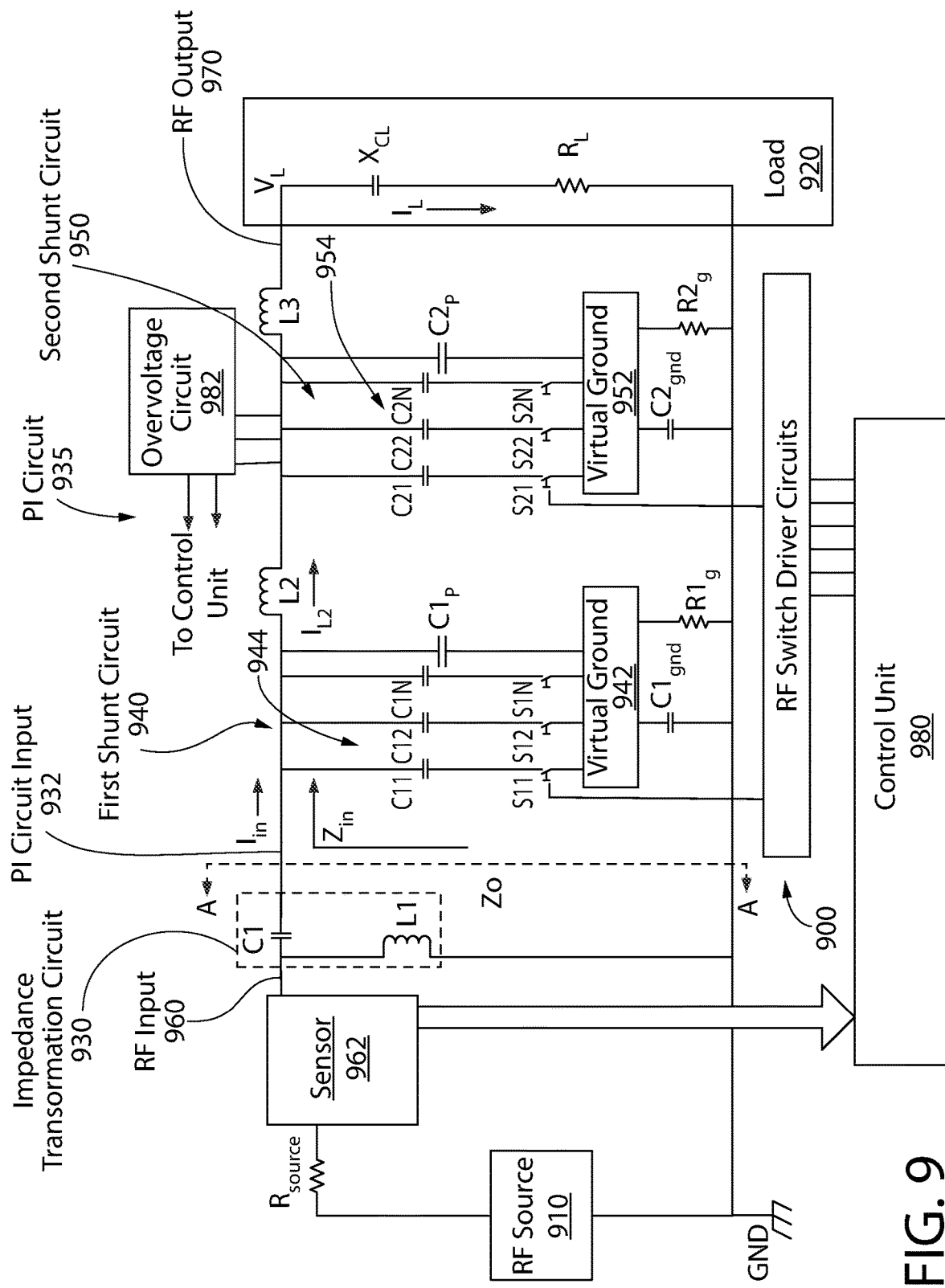
FIG. 9 is a schematic representation of a ninth embodiment of an RF impedance matching network.

FIG. 9 is a schematic representation of a ninth embodiment of an RF impedance matching network 900. This embodiment is similar to the embodiment shown in FIG. 2, however, an additional series inductor L3 is coupled between the second shunt circuit 950 and the RF output 970. The embodiment of the matching network 900 shown in FIG. 9 is useful for capacitive chamber loads. There are two inductors in the series leg and therefore more losses. It is useful for applications below 5 kW.

Figure 10:
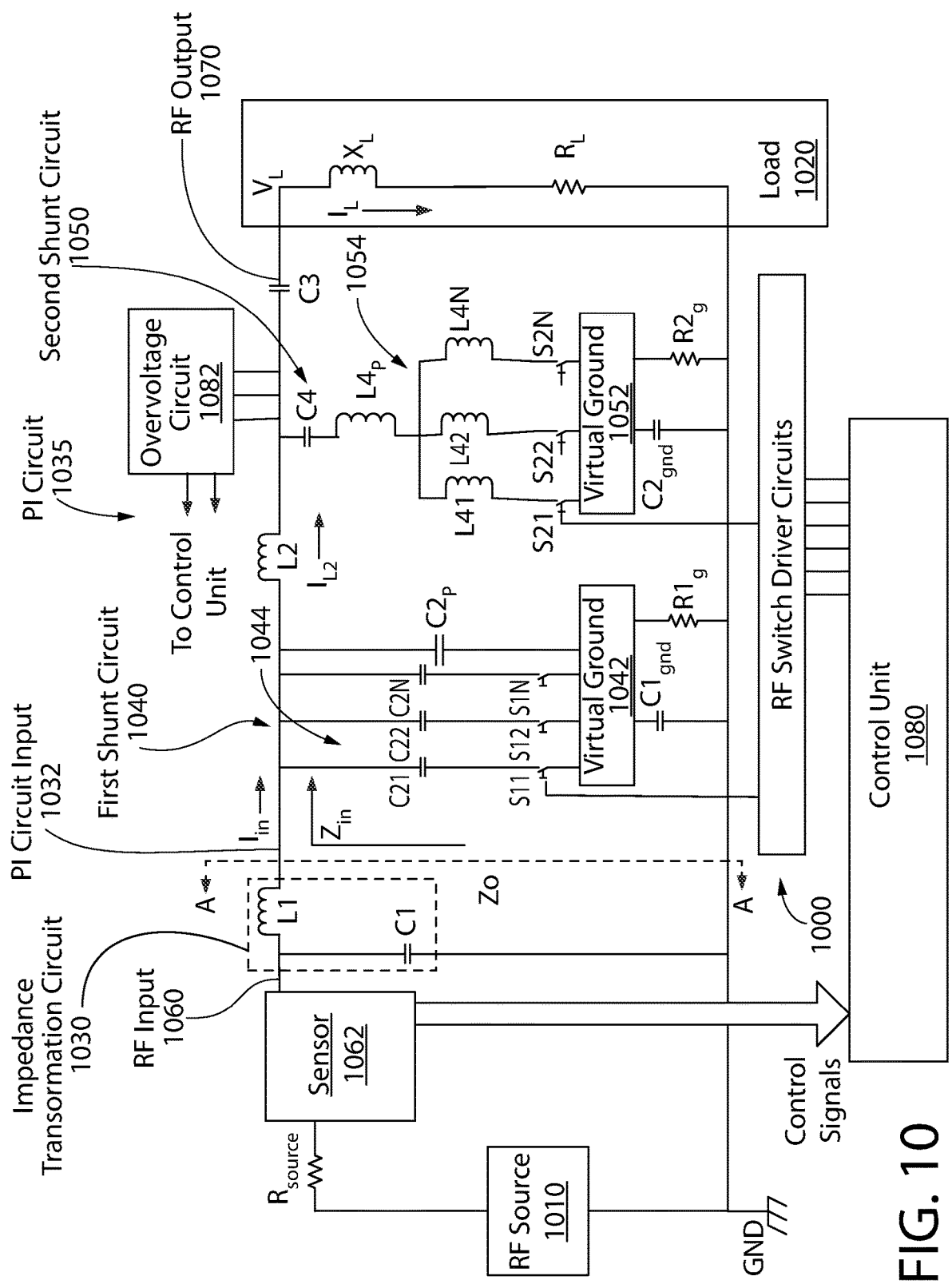
FIG. 10 is a schematic representation of a tenth embodiment of an RF impedance matching network.

FIG. 10 is a schematic representation of a tenth embodiment of an RF impedance matching network 1000. This embodiment is similar to the embodiment shown in FIG. 8, however, the series inductor L3 is coupled between the first shunt circuit 1040 and the second shunt circuit 1050, and the series capacitor C3 is coupled between the second shunt circuit 1050 and the RF output 1070. The embodiment of the matching network 1000 shown in FIG. 10 is useful for inductive chamber loads and for medium-to-low RF power applications. It is noted that, where components in one embodiment are similarly situated to components in another embodiment, the function and characteristics of those components can be similar, though a detailed discussion of those components is not repeated for that particular embodiment.

In Table 1, simulated results for typical matching conditions are shown for the matching network 100 shown in FIG. 1A. The impedance load conditions are assumed as typical chamber impedances. Values for series coupling capacitor C3 (2 nF) and series inductance L2 (8 uH) were specifically chosen to satisfy the circuit equations under the matching conditions. $R_L$ is representative of the real part of the load impedance. Pout is the delivered RF power to the load resistor $R_L$. The example components were chosen for delivering 5 kW of RF power to a plasma chamber. The simulations show that the matching network can satisfy all the load impedance conditions for a typical process.

TABLE 1

Matching Network of FIG. 1A Simulation Results.

| $R_L$ Ω | $X_L$ Ω | C3 nF | L31, L32, L3N (var.) uH | L2 (fixed) uH | C21, C22, C2N (var.) pF | $I_{C3}$ A, rms | $I_{L2}$ A, rms | $I_L$ A, rms | $V_L$ kV, rms | $P_{out}$ kW |
|---|---|---|---|---|---|---|---|---|---|---|
| 1 | 31 | 2 | 2.5 | 8 | 3,080 | 9.8 | 15.3 | 66.4 | 1.6 | 5 |
| 2 | 38 | 2 | 3.1 | 8 | 2,640 | 11.3 | 13.3 | 45 | 1.4 | 5 |
| 5 | 39 | 2 | 5 | 8 | 2,400 | 9.9 | 8.0 | 30.5 | 0.8 | 5.8 |
| 10 | 39 | 2 | 5 | 8 | 2,300 | 13.3 | 6.8 | 20 | 0.7 | 5.1 |

Software was used to determine the circuit components values for the variable shunt elements L3, C2 using the assigned load impedance values. The software then calculated the currents and voltages. As is shown, the matching network can be designed with reasonable values for the capacitors and inductors. The simulation was carried out at the frequency f=2 MHz, and therefore the components values reflect that frequency. The assumed power was 5 kW. One could choose other value for the variable shunt elements L3, C2 to attempt to have even smaller currents and voltages in the variable shunt elements L3, C2.

Switching Circuits

FIGS. 11-17 below discuss switching circuits that can be utilized in the above matching networks. For example, each of switches S11 to S1N and S21 to S2N in FIG. 2 can utilize one of the switching circuits discussed below to switch capacitors C11 to C1N and C21 to C2N, respectively, thus enabling electronically variable capacitance. Similarly, the switching circuits can switch the inductors L31 to L3N of FIG. 1 to enable variable inductance. Accordingly, switches S11 to S19 of FIG. 1B can utilize one of the switching circuits discussed below.

The switching circuits discussed below can also be used outside of RF matching networks, and outside the realm of high frequency switching. For example, certain switching circuits may be used as a form of high voltage relay at a low frequency. The disclosed switching circuits can also be used in equipment such as magnetic resonance circuits, medical equipment circuits (e.g., ultrasound imaging or x-ray equipment). Another possible application is in telecommunications equipment where the antenna impedance should be matched to the transmitter output impedance. In such cases as transmitters, there are many applications where the carrier frequency is switched under so-called hot switching conditions. These switches are also used in handheld transmitters for military use, and in many other military applications using various transmitters and receivers.

Figure 11:
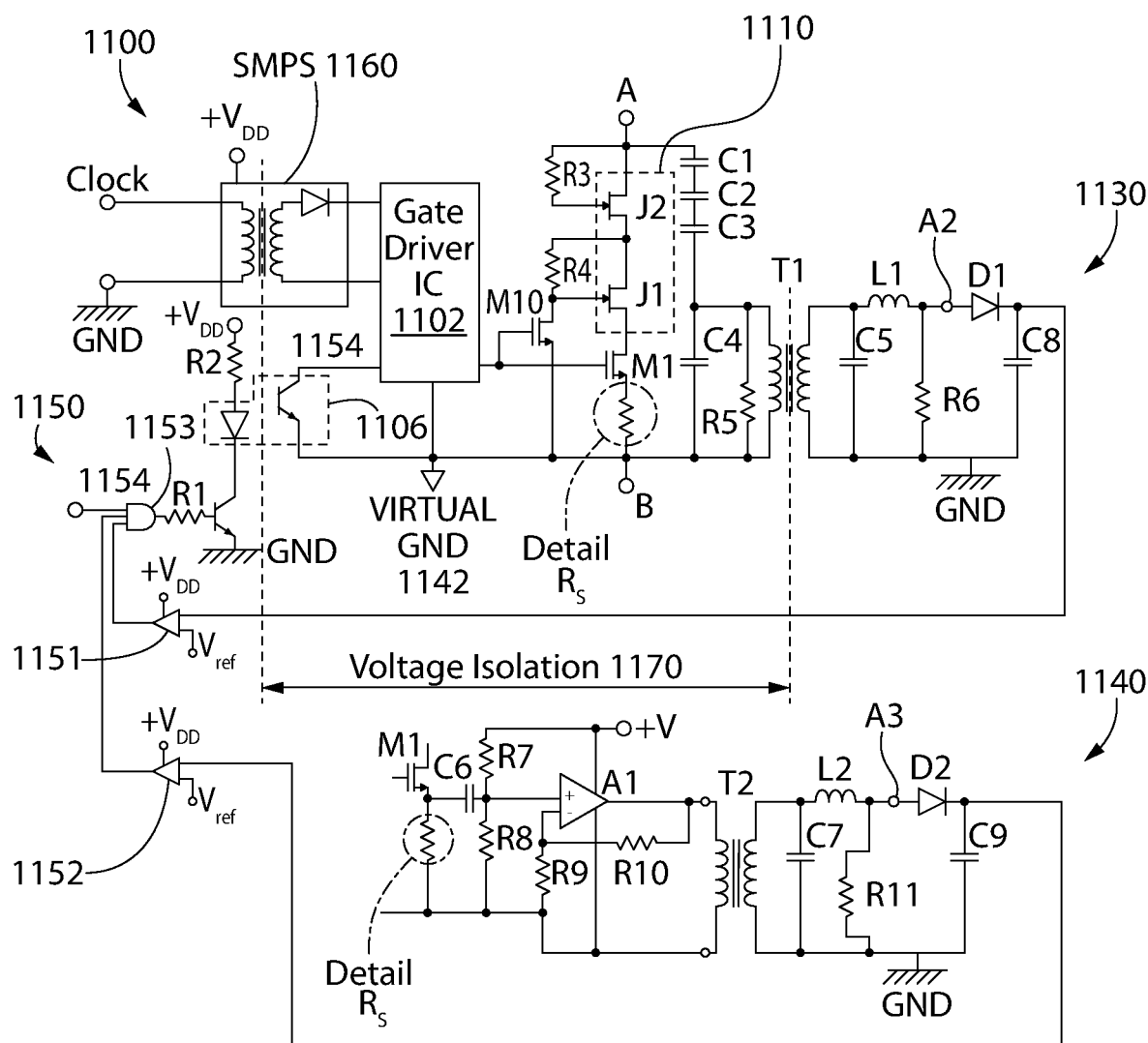
FIG. 11 is a schematic representation of a first switching circuit according to one embodiment.

Referring now to FIG. 11, a first switching circuit 1100 is shown. The first switching circuit 1100 comprises a passive switch 1110 coupled to a first switch terminal A. The first switching circuit 1100 further comprises a driving switch M1 coupled in series with the passive switch 1110 and a second switch terminal B, the driving switch M1 configured to turn the passive 1110 switch on and off. The first switching circuit 1100 further comprises a power source 1160 configured to provide power to the passive switch 1110 and the driving switch M1. The first switching circuit 1100 further comprises a monitoring circuit 1150 configured to (1) receive an indication that a switching circuit voltage exceeds a predetermined amount and, in response, reduce the power provided to the driving switch M1; and (2) receive an indication that a switching circuit current exceeds a predetermined amount and, in response, reduce the power provided to the driving switch M1. In other embodiments, the monitoring circuit 1150 can be configured to perform operation (1) and not operation (2), or operation (2) and not operation (1). These components and operation will be described further below.

In the exemplified embodiment, the power source 1160 is a switched mode power supply (SMPS). Further, the exemplified switching circuit includes a gate driver 1102 operably coupled to (a) the power source 1160, (b) a gate of the passive switch 1110, and (c) a gate of the driving switch M1. In other embodiments, other power sources, drivers, and/or amplifiers can be used as required by the components of the specific switching circuit.

In the exemplified embodiment, the passive switch 1110 comprises a plurality of switches connected in series. Specifically, the passive switch 1110 comprises two high voltage and high current junction gate field-effect transistors (JFETs) J1, J2. In other embodiments, the passive switch can comprise any number of switches, and those switches can be of various types. The exemplified JFETs of the passive switch 1110 are connected in series to increase the voltage operation of the switching circuit 1100. The passive switch 1110 can also comprise external body diodes.

The first switching circuit 1100 further comprises a driving switch M1 coupled in series with the passive switch 1110 and a second switch terminal B. The driving switch M1 can be configured to turn the passive switch 1110 on and off. In the exemplified embodiment, the driving switch M1 comprises a high voltage and high current metal-oxide-semiconductor field-effect transistor (MOSFET). In other embodiments, other switches can be used, such as a BJT, an IGBT, a GaN device, and even a relay (e.g., in special applications at low frequency and high currents). Connecting the driving switch M1 and passive switch 1110 in series allows the circuit to use an industry standard gate driver integrated circuit (IC) with the driving switch M1.

The switching circuit 1100 can be configured such that JFETS J1, J2 are always turned on, and thereby the JFETS J1, J2 can provide high voltage isolation 1170. Resistors R3 and R4 (which can have large values, e.g., 10 Megaohms) can connect the gate and drain of the JFETs J1, J2 to the same potential and can force the JFETS to the on condition. The drain voltages starting on terminal A in FIG. 11 can distribute equally on all three transistors M1, J1, J2. In other embodiments, the switching circuit can include more than two JFETS in series, but the packaging of these devices must be such that the high voltage would not break down on the junctions. A separate circuit that allows equal voltage distribution on the switches is omitted here, as such circuits (e.g., a snubber circuit) are well known. These switches are typically heat sunk either on an air heat sink or water-cooled heat sink. All these switching arrangements can also use GaN devices since in the ON state they conduct current in both directions. Driving GaN gates, however, requires slightly different gate drivers.

The first switching circuit 1100 can also include an optocoupler 1106 configured to electrically isolate the gate driver IC 1102 from the monitoring circuit 1150 (discussed below). The optocoupler 1106 can drive the gate driver IC 1102 on and off, thus also driving the first switching circuit 1100 on and off. Supply line +V can be around 10-15 VDC and can be supplied by a switched-mode power supply (SMPS). DC isolation on the SMPS is expected to be greater than 4 kV for this application, thus enabling the switching circuit 1100 to be used in a high voltage RF application. In the exemplified embodiment, the low voltage monitoring circuit 1150 is isolated from the drains and high voltage switching voltage by at least 4 kV peak, if not more in other applications. For higher power applications on this switching circuit, the voltage separation can be raised even higher. The gate driver can have the floating SMPS associated with it for that purpose.

The exemplified optocoupler 1106 and gate driver IC 1102 are not connected to chassis ground GND but to a virtual ground. The main RF ground (terminal B) is connected to the virtual ground. The virtual ground can be designed similarly to the virtual ground shown in FIG. 1B, which is an aluminum plate with embedded tubes for water cooling. Mounted on the virtual ground can be variable capacitors or inductors and a switching circuit for each. Thus, components of the switching circuit 1100 (e.g., power FETs) can be mounted on the virtual ground. As discussed above, the virtual ground can be connected via a series network directly to the chassis ground.

The exemplified virtual ground is floating, and it has an isolation of the systems grounds as large as the transformers and the optocouplers will allow. For that reason, two or more such system switches can be connected in parallel to increase the current switching capabilities.

The first switching circuit 1100 can be considered "smart" or "self-healing" as it has two automatic shut-off conditions—one for excessive voltage and one for excessive current. Regarding excessive voltage, in the exemplified embodiment, the switching circuit 1100 can be switched off if a voltage on terminal A exceeds a predetermined value. For example, the predetermined value can be 4,000 V.

An excessive voltage indication can be provided by a voltage sensing circuit 1130, the voltage sensing circuit 1130 comprising (a) a first transformer T1 operably coupled to the second terminal B and (b) a first diode D1 operably coupled to the monitoring circuit 1150. The switching circuit 1100 can be designed such that, if the voltage at terminal A is 4,000 V, then the voltage at diode D1 output (voltage sensing circuit output) is 4 VDC. The voltage at the diode D1 output can provide evidence of excessive voltage at terminal A or elsewhere in the circuit.

Diode D1 and the optocoupler 1106 can be connected to a monitoring circuit 1150 for monitoring the switching circuit 1100 for excessive voltage or current. In the exemplified embodiment, the monitoring circuit 1150 can be configured to (1) receive an indication that a switching circuit voltage exceeds a predetermined amount (excessive voltage indication) and, in response, reduce the power provided to the driving switch M1; and (2) receive an indication that a switching circuit current exceeds a predetermined amount (excessive current indication) and, in response, reduce the power provided to the driving switch M1.

The monitoring circuit 1150 can include low-level logic components to determine whether a shut-off condition is present. For example, regarding excessive voltage, a first comparator 1151 can be used to receive the excessive voltage indication. The first comparator 1151 can receive a threshold voltage $V_{ref}$ on a first terminal and can be set to normally provide an output a logical value "1" (e.g., +4 V). The first comparator 1151 can also receive a signal from the voltage sensing circuit 1130. When the voltage at the voltage sensing circuit output (the monitor voltage) exceeds the $V_{ref}$, the comparator can change its condition to logical "0" (e.g., 0 V), thus causing the shut off condition on gate 1153 for the control signal 1154.

The second shut off condition of the switching circuit 1100 can be based on current. The switching circuit 1100 can include a current sensing circuit 1140. The current sensing circuit 1140 can determine a current passing from a first switch terminal A to a second switch terminal B of the first switching circuit when the switching circuit is turned on by the control signal 1154. That current can be determined by the RF impedance load that the first switching circuit 1100 is switching on and off. This current is similar to load current IL in FIGS. 1A and 3-10. The current sensing circuit 1140 can include (a) a second transformer T2 operably coupled to the second terminal B and (b) a second diode D2 operably coupled to the monitoring circuit 1150. The current sensing circuit 1140 can further include sense resistor $R_S$. Sense resistor $R_S$ is shown adjacent to terminal B in FIG. 11, and its surrounding components are shown in more detail below as part of sensing circuit 1140. Sense resistor $R_S$ can provide a low resistance (e.g., 10-50 mOhms). The circuitry that follows the sense resistor $R_S$ can function like a high-speed operational amplifier with sufficient gain bandwidth product to replicate the RF current waveform. The gain in the operational amplifier chain must be such that the switching circuit 1100 can detect an appreciable RF voltage. In some cases, such as at lower frequencies and high currents, the switching circuit 1100 can use a current transformer in the source of driving switch M1 instead of a sense resistor. If the inductance of the current transformer is sufficiently small at the frequency of operation, it can be substituted for the $R_S$ sense resistor.

The current in the source of the driving switch M1 can thus be detected and received via the source resistor $R_S$. The processing of the current waveform is received by the source resistor $R_S$ and the operational amplifier circuitry that follows the detected waveform. The signature of the current in the source of the driving switch M1 can be used to see its amplitude. This current amplitude is detected and can be viewed on an oscilloscope to determine the shape and the frequency spectrum, if necessary. Further on, after the output of the operational amplifier A1, there is diode D2. The output of that diode D2 (used as a detector) is a DC voltage proportional to the RMS value of the source current in the driving switch M1. This detected DC voltage waveform can be sent to the second comparator 1152, with a reference voltage $V_{ref}$ on the other terminal of the second comparator 1152. When the detected voltage, which is now proportional to the current in the source of the driving switch M1, is larger than a predetermined value, this can be considered an excessive current indication. In this case, the reference voltage can trip the second comparator 1152 output from its normally high value (logic value "1") to a low value (logic value "0"). The monitoring circuit 1150 can thus detect that the current in the driving switch M1 has exceeded the predetermined value.

The monitoring circuit 1150 can include an AND logic gate 1153 to switch off the gate driver IC 1102 when a shut off condition has occurred. In the exemplified embodiment, a three-input wide AND logic gate 1153 is utilized. The detector diodes D1, D2, as described above, rectify the RF waveforms of detected RF voltage and current and covert them to DC so that the signals can be used at the comparator terminals. The comparators 1151, 1152 receive signals from the detector diodes D1, D2. The comparer outputs can be logic signals that are received by the AND logic gate 1153. The AND logic gate 1153 can shut off the incoming control signal 1154 if a high voltage or high current condition is indicated. In the exemplified embodiment, when a high voltage condition is indicated the first comparator output is a logic value 0, and when a high voltage condition is indicated the second comparator output is a logic value 0. If the AND logic gate 1153 receives a logic value 0 from either comparator 1151, 1152, the AND logic gate 1153 can shut down the control signal 1154 and thereby switch off the gate driver IC 1102. In so doing, the monitoring circuit 1150 can ensure safe voltage and current operation values. The set of safe operating values can be set by the appropriate reference voltage values on the comparators 1151 and 1152.

The foregoing circuitry can further signal an LED light to tell an operator that the switching circuit 1100 has exceeded the prescribed voltage or current value. The LED light can stay on as long as there is an excessive voltage or current condition. In other embodiments, the switching circuit 1100 can utilize methods other than those described above for responding to excessive voltage or excessive current conditions on the passive switch 1110 and the driving switch M1.

There are several advantages to the described self-healing switch. Other solutions for shutting off such switches could include the use of control board algorithms. But such an approach is usually too slow to shut off the driving switch M1 off when the voltage becomes excessive. The exemplified analog hardware implementation is much faster. The voltage sensing circuit 1130 is designed such that its frequency bandwidth can be large enough to cover at least the third harmonic of the RF frequency that is being switched. For example, if the switching circuit 1100 is used in the standard ISM frequency of 13.56 MHz, the bandwidth of the voltage sensing circuit 1130 can be larger than 40.68 MHz. This large frequency bandwidth also enables one to see the shape of the switched waveform during the switching conditions. That shape can be observed at terminal A2 before the detector diode D1.

The exemplified switching circuit 1100 can prevent a catastrophic switch failure in the case of high voltage transient returning back from the vacuum chamber via the matching network and on the RF switches. In high VSWR ratios, that condition could occur, for example, when setting up the process recipe in the process chamber and other anomalies in the chamber.

The switching circuit 1100 can further include an intermediary switch M10 for enabling the passive switch 1110 to switch simultaneously with the driving switch M1. In the exemplified embodiment, the intermediary switch M10 is a MOSFET, though in other embodiments other switches can be used. In the exemplified embodiment, the intermediary switch M10 can allow the switching circuit 1100 to disconnect the gate of switch J1 when switch M1 is in the OFF condition. This allows slightly larger high voltage potentials on terminal A.

The exemplified intermediary switch M10 comprises a gate, a drain, and a source. The gate is operably coupled to the power source 1160. In this embodiment, the gate of the intermediary switch M10 is connected to output of the gate driver 1102, though other designs can be used. Further, the drain of the intermediary switch M10 is operably coupled to the passive switch 1110. In the exemplified embodiment, the drain of the intermediary switch M10 is connected to the gate of switch J1.

If the intermediary switch M10 were not in the gate of switch J1, the gate of switch J1 would be connected to the virtual ground or a bottom terminal B. The maximum voltage on the drain of the driving switch M1 would be low in all situations. The drain of driving switch M1 would only see the $V_{GS}$ (gate-source voltage) voltage drop of switch J1. In this case, all the voltage drops from terminal A down to terminal B would be across the passive switch 1110—in the exemplified embodiment, switches J1, J2. Since the driving switch M1 is used only as a switching device at relatively low voltages, the driving switch M1 would likely be an inexpensive and high speed device.

But in the exemplified embodiment, due to the intermediary switch M10, the gate of driving switch M1 and the gate of switch M10 can be switched simultaneously. As a result, the off condition of the series connected driving and passive switches M1, 1110 (e.g., vertically cascoded switches M1, J1, J2) behave differently. Specifically, the high voltage from terminal A down to terminal B can be distributed more evenly. Instead of two transistors taking all the high voltage distribution, there can be three transistors distributing the high voltage—in the exemplified embodiment, switches J1, J2 and M1—since the gate of J1 is opened with the switching action of intermediary switch M10.

In this example, switch M1 should have a high voltage rating similar to those of switches J1, J2. If the gate of switch J1 would be connected directly to ground, the switching circuit could use switch M1 at a relatively low drain voltage. For lower switching voltages, such a configuration could be used. Switch M10 can be a low drain current device with a high drain voltage breakdown that does not have to be heat sunk.

The switching circuit 1100 can further include voltage sense capacitors C1, C2, C3 and C4. A typical design of such a high voltage probe is in the ratio of 1000:1. The capacitors C1, C2, C3 can therefore be in the order of 10 pF and at very high break down voltage. Capacitor C4 can be adjusted accordingly to read 1000:1 in voltage ratio.

Resistors R3, R4 can be included to keep the switches J1, J2 on. Further, these resistors R3, R4 can have very high values (e.g., 10 Mega Ohms or more), and thus can prevent excessive bleed off of RF current in the off condition.

In the exemplified embodiment, transformers T1, T2 can be pulse transformers with a winding isolation in the order of greater than 4 kV. These transformers T1, T2 can detect small voltages in the order of few millivolts to a few volts. Both are used as detector transformers. They can be very small in size but, since they are pulse transformers, they must have very large frequency bandwidth response. The bandwidth is typically determined so that the switching circuit 1100 can detect up to the fifth harmonic of the RF signal being switched. For instance, if the switching circuit was to switch a high voltage and high current waveform at a fundamental frequency of 10 MHz, the detecting transformers T1, T2 can have their bandwidths up to 50 MHz to clearly replicate the drain voltage after capacitive dividers C1, C2, C3 and C4 for the drain voltage and the current transformer T2 that will replicate the source current in switch M1.

Figure 12:
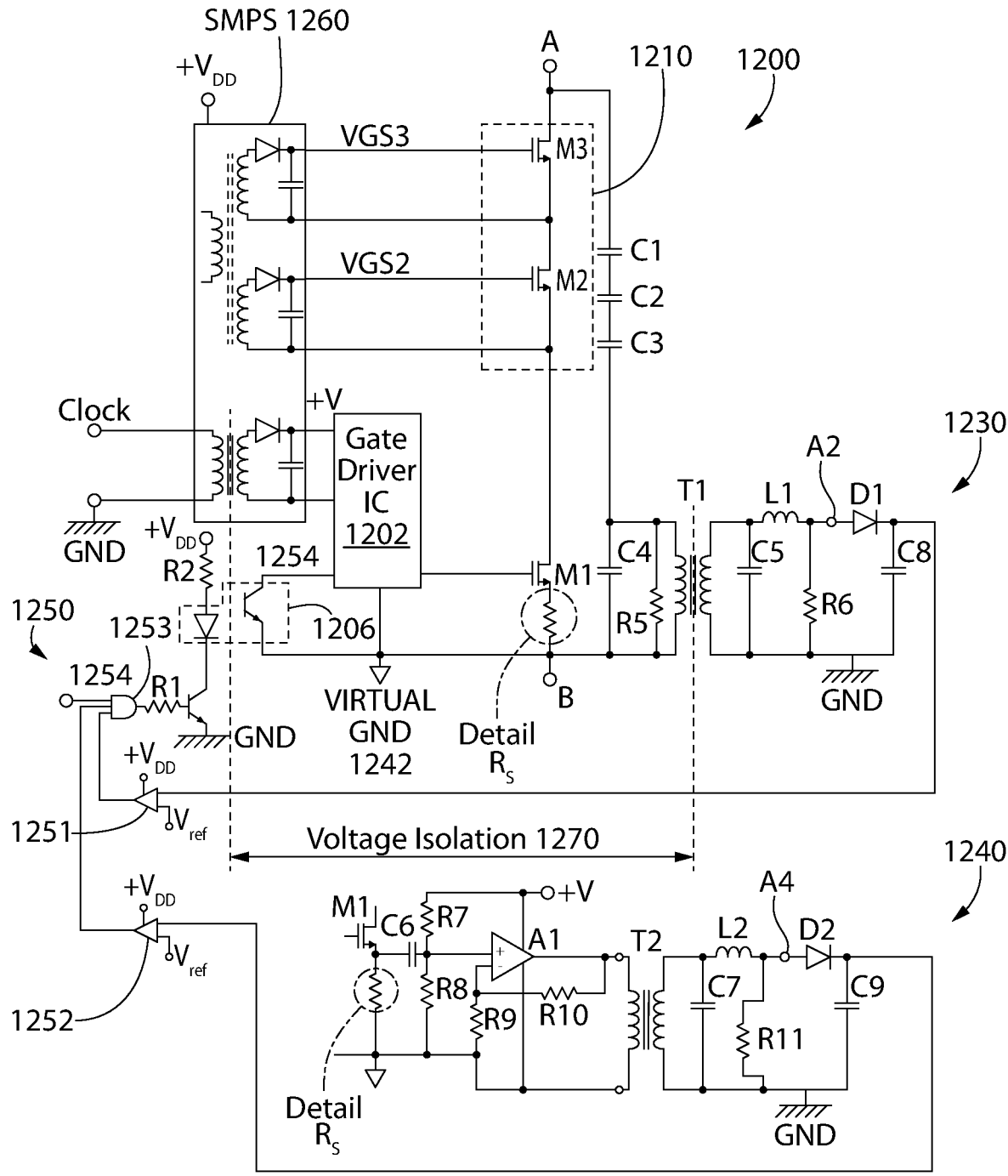
FIG. 12 is a schematic representation of a second switching circuit according to another embodiment.

FIG. 12 provides a schematic of a second switching circuit 1200. The second switching circuit 1200 is very similar to the first switching circuit 1100 of FIG. 11, and therefore most of the discussion with regard to FIG. 11 applies to also to FIG. 12. Accordingly, comparable components are shown, including gate driver 1202, optocoupler 1206, driving switch M1, voltage sensing circuit 1230, current sensing circuit 1240, monitoring circuit 1250, first comparator 1251, second comparator 1252, AND logic gate 1253, control signal 1254, and power source 1260. Voltage isolation 1270 is also shown.

The primary difference from first switching circuit 1100 is that the second switching circuit 1200 uses MOSFETs M1, M2, M3 in series, instead of a combination of MOSFETs M1 and JFETs J1, J2. Thus, the passive switch 1210 uses MOSFETs M2, M3 instead of switches J1, J2. The MOSFETs M1, M2, M3 in the shown vertical position will typically have smaller inter-electrode capacitance. In particular, the MOSFET M3 will typically have a smaller capacitance between the drain and gate and the drain to source than a JFET for the same current. Since the capacitance will be smaller, the second switching circuit 1200 can operate at slightly higher frequencies. The MOSFETs M2, M3 must be kept on (as with switches JFETS J1, J2), but each MOSFET has its own floating DC voltage to keep it in the on condition. Those floating gate-source voltages $V_{GS2}$, $V_{GS3}$ for M2 and M3 are provided by the power supply 1260. To provide the necessary floating voltages for MOSFETs M1, M2, and M3, the power supply 1260 (an SMPS) is designed to have three separate secondary windings from which to make three isolated DC voltages—$V_{GS1}$ (the gate-source voltage of M1), $V_{GS2}$ (the gate-source voltage of M2), and $V_{GS3}$ (the gate-source voltage of M3). The MOSFET M1 is the master switch to turn on and off the whole vertical chain of MOSFETs M1, M2 and M3. In both the first switching circuit 1100 and the second switching circuit 1200, the clock input terminal to the power supply SMPS 1260 can be from 100 kHz to 1 MHz in switch mode supplies. The power supply SMPS also can use the external DC voltage $+V_{DD}$ from an external DC supply. In one embodiment, the external DC voltage can be in the order of +15 VDC. This DC supply can be used in the first switching circuit 1100 and the second switching circuit 1200.

Figure 13:
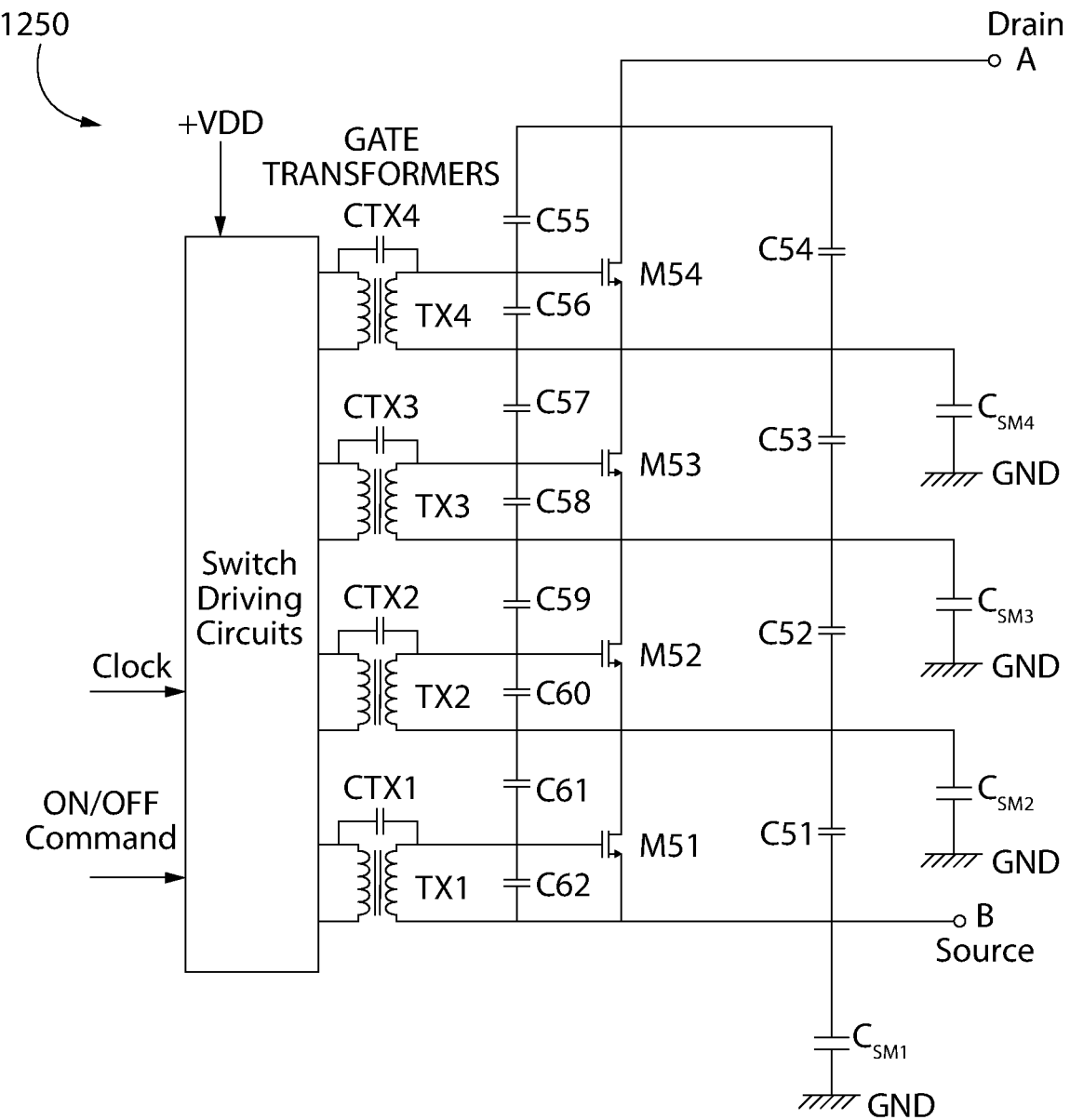
FIG. 13 illustrates parasitic capacitances on a switching circuit according to one embodiment.

FIG. 13 illustrates parasitic capacitances on a switching circuit 1250. The switching circuit 1250 includes four MOSFET M51, M52, M53, M54 connected vertically in series. In other embodiments, other switches can be used. Switch terminals D and S are floating. First parasitic capacitances C51-C62 are on each of the MOSFETs. Second parasitic capacitances $C_{SM1}$-$C_{SM4}$ are from the back body of the MOSFETs to the mounting on the heat sink ground GND. Also shown is coupling parasitic capacitances $C_{TX1}$-$C_{TX4}$ on the gate driver transformers. The parasitic capacitances present possible frequency limitations, and therefore it can be advantageous to keep the parasitic capacitances as low as practically possible. When designing switching circuits, it can be helpful to first predict the parasitic capacitances and from them calculate the maximum frequency of operation for the switching circuit.

Figure 14:
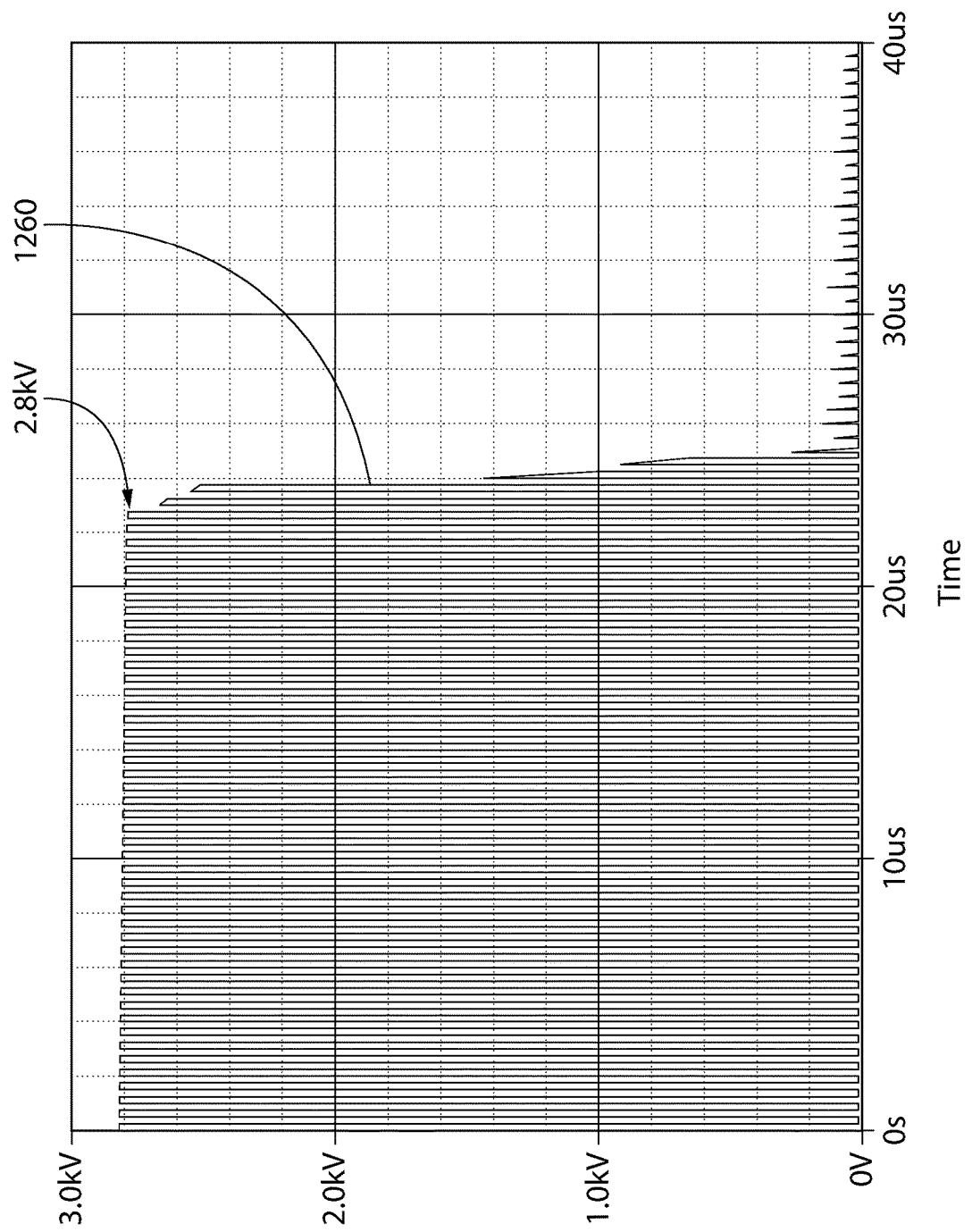
FIG. 14 is a graph of a switched waveform according to one embodiment.

FIG. 14 is a graph of a switched waveform 1260. The waveform 1260 is an example waveform for one embodiment of the switching circuit. The frequency is 2 MHz. The RF voltage switched is 3000 V peak to peak. The switching off time is approximately 2 μs. Note that the switch does not swing the full 3000 V due to inherited capacitance in the circuit. Such computer analysis of switching performance can be performed using P-spice or similar software.

Figure 15:
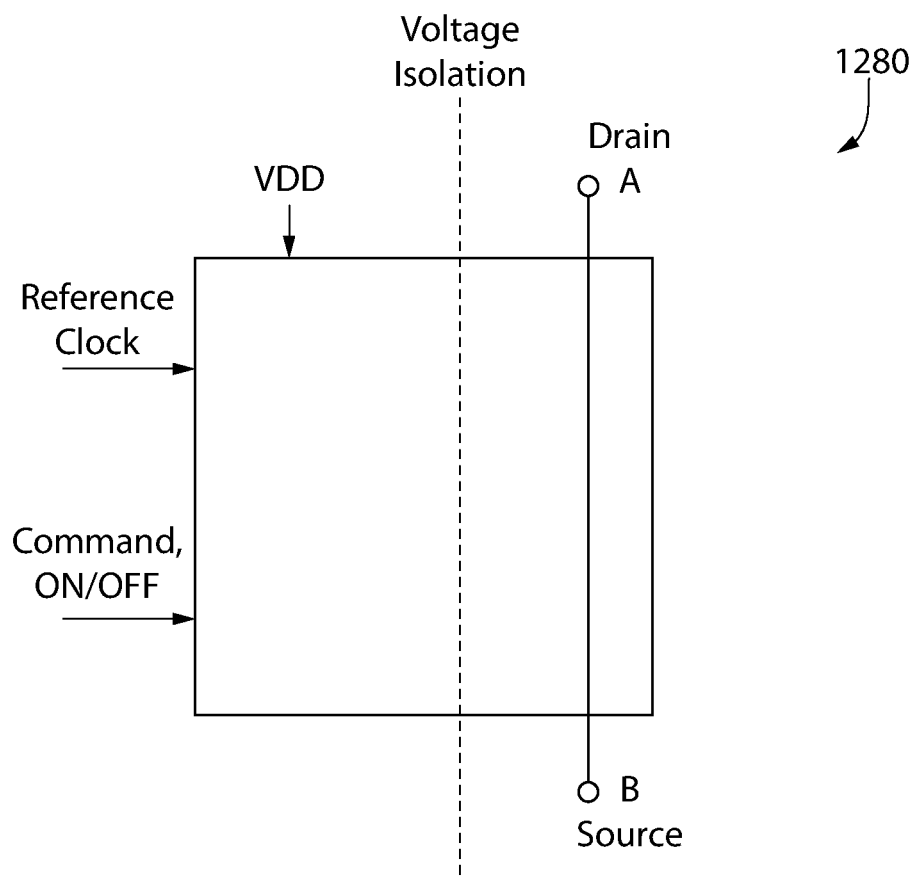
FIG. 15 is a block diagram of a switching circuit according to one embodiment.

FIG. 15 is a simplified block diagram that provides a basic model for the switching circuits described above. The switching circuit 1280 includes terminals A and B. The outputs are floating. High power voltage and current terminals are electrically isolated from the logic driven switching conditions. Since the terminals A and B are floating, such switches can be connected in parallel to increase the current capability. Such switches can also be connected in series to achieve even higher voltages. In one example, the switch can provide a high voltage isolation 1170 of more than 5 kV.

There are several advantages to the switching circuits discussed herein. First, the switching circuits eliminate disadvantages associated with PIN diodes. PIN diodes require elaborate RF choke designs to support the off condition and DC forward current for turning the PIN diode on. The PIN diodes also require a high DC voltage to back bias the PIN diode to off. Further, the disclosed switching circuits can be simpler to implement. Further, the disclosed switching circuit designs allow for the addition of further switches (e.g., more FETs) to handle even higher voltages when such switches are connected in series. Further, more switches can be connected in parallel to allow for higher current capability of the switch.

Figure 16:
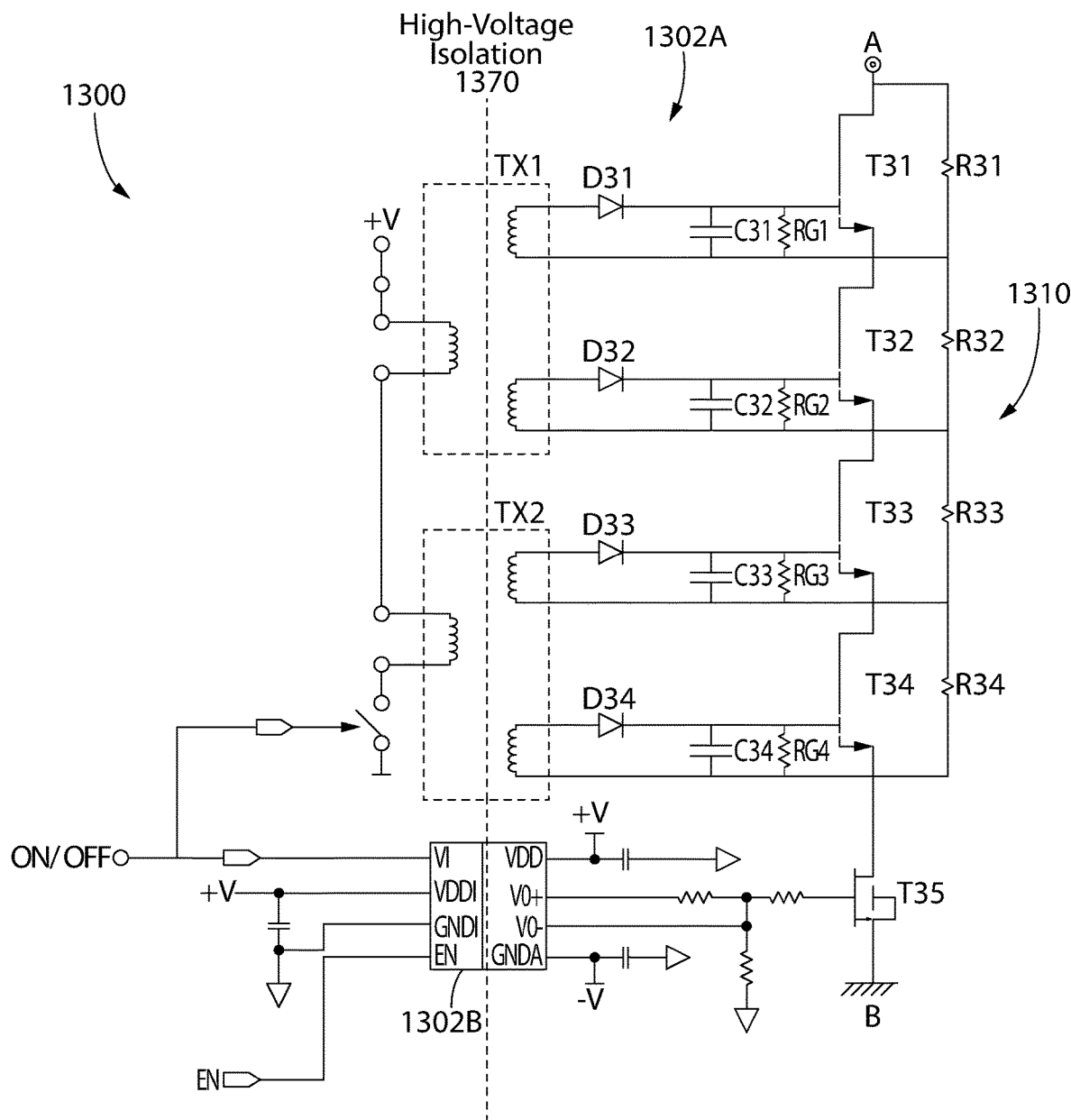
FIG. 16 is a schematic representation of a third switching circuit according to one embodiment.

FIG. 16 is a schematic representation of a third switching circuit 1300. In this embodiment, the switching circuit 1300 utilizes gallium nitride high-electron mobility transistors (GaN HEMTs). The circuit 1300 structure is similar to that of cascode or vertically connected FETs. By vertical connection of the GaN HEMTs, the breakdown voltage on the total switch structure can be increased.

The switching circuit may be understood as comprising a first switch 1310 and a second switch T35. The first switch 1310 is coupled to a first switch terminal A, and comprises at least one GaN HEMT. In other embodiments, other FETs can be used. In this embodiment, the first switch 1310 comprises four GaN HEMTs T31-T34 connected in series. In other embodiments, other numbers of transistors can be used. Using more transistors will increase the breakdown voltage of the overall switch, thus allowing higher voltage on the switch in the OFF condition.

The second switch T5 is coupled in series with the first switch 1310 and a second switch terminal B. The second switch comprises a GaN HEMT, though other FETs can be used. The second switch is configured to drive the first switch ON and OFF.

The switching circuit 1300 further comprises at least one isolated power source configured to provide isolated power to the first switch and the second switch. In this embodiment, the power sources for the switching circuit 1300 include transformers TX1, TX2 and a DC power supply (not shown).

Second switch T5 is externally driven by a control signal from a gate driver 1302B. In this embodiment, the gate driver 1302B must also be high-voltage isolated from the low-level circuitry. For this purpose, a commercially available gate driver can be used with the GaN device (e.g., the SI8271 GB-IS isolator from Silicon Labs). Such a gate driver can withstand high-voltage isolation, for example, up to 5 kVDC. The gate driver 1302B can receive DC power from a commercially available DC power supply (e.g., PES1-S5-S9-M from CUI, Inc.). This DC power supply would be isolated and, in this embodiment, can be provided at $V_{DD}$ of the gate driver 1302B. The switching circuit 1300 can be designed such that all transistors from T31 to T35 are turned ON and OFF at precisely the same time to achieve low switching losses.

In the exemplified embodiment, there are isolated gate drivers 1302A on each of the gates of the passive transistors T31 to T34. The gate drivers 1302A include transformers TX1, TX2. In other embodiments, other configurations of power sources can be used to drive the gates. In this embodiment, the gate drivers 1302A are specially designed to minimize cost. According to the exemplified embodiment, the ON/OFF pulses are rectified by diodes D31-D34 and smoothed out by capacitors C31-C34. Resistors RG1-RG4 are static discharge resistors and can have a value, for example, of 10 kohms. Similar to the gate driver 1302B of driving switch T35, the gate drivers 1302A can receive DC power from a DC power supply (not shown). This DC supply must also be isolated to at least 5 kV in the exemplified embodiment. These DC low power supplies are commercially available (e.g., PES1-S5-S9-M from CUI, Inc.), and therefore are not discussed in detail. When the gate drivers provide the requisite voltage (e.g., 6V) to the gate of the transistor, the transistor is turned on.

For better distribution of voltages in the OFF condition on the GaN HEMTs, resistors R31-R34 (e.g., 10 Mega Ohms) can be included in parallel to each drain to source. Further, it is noted that the switching circuit 1300 (and the other switching circuits discussed herein) can further include a monitoring circuit similar to that discussed above.

One advantage of the disclosed circuit 1300 is that, by using GaN HEMTs, when the switch is fully ON at RF frequencies, RF AC current can flow in the positive and negative directions. The switching circuit can pass full RF current in both directions. The GaN HEMTs also work well at high frequencies. It is noted that GaN HEMTs can also be used in the other switching circuits discussed in this disclosure.

Figure 17:
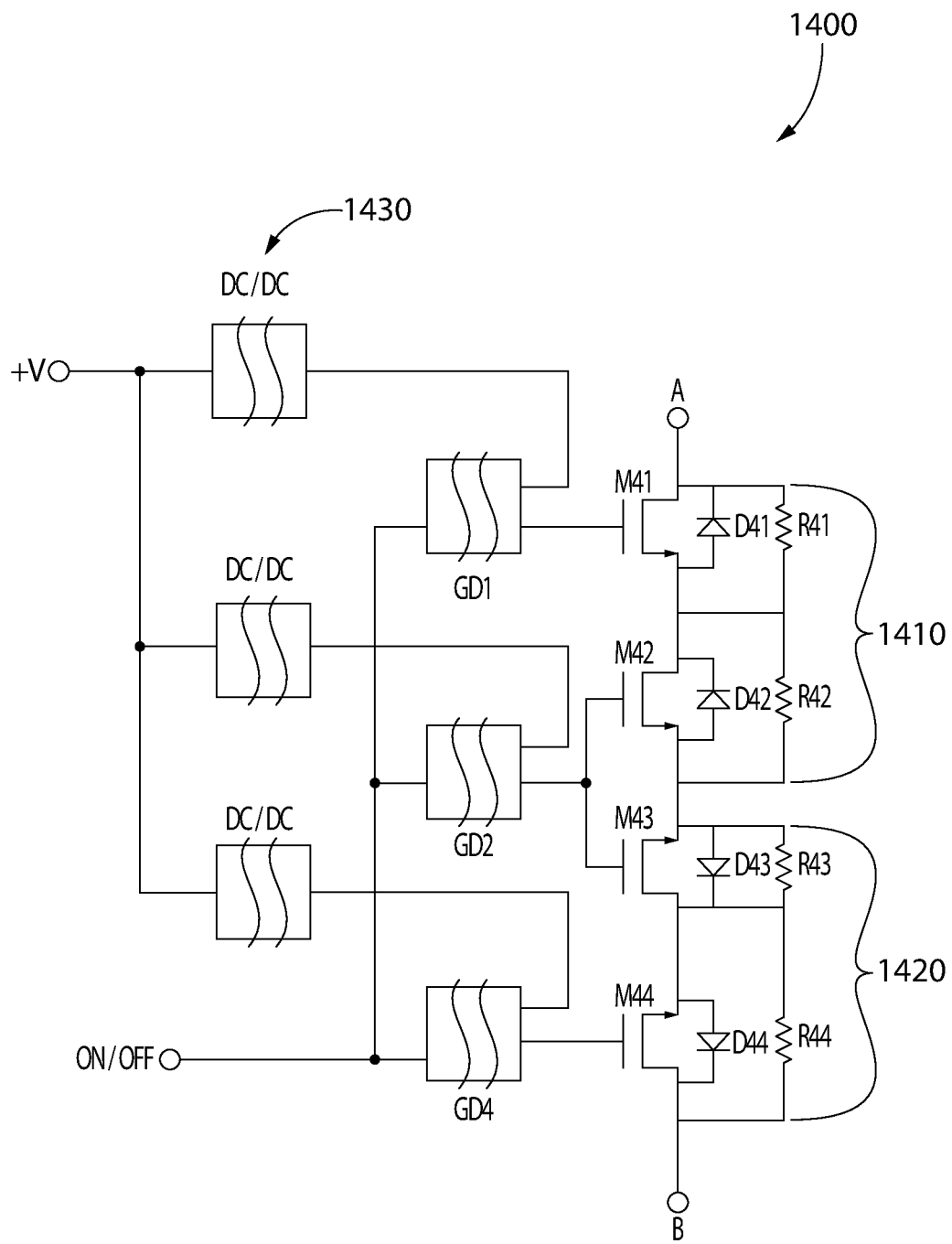
FIG. 17 is a schematic representation of a fourth switching circuit.

FIG. 17 is a schematic representation of a fourth switching circuit 1400. This switching circuit 1400 is designed to sustain high voltage swings in the OFF condition. In one embodiment, silicon carbide (SiC) FETs having a breakdown voltage of 1200V are utilized for devices M41-M44. Such a switch can swing the AC RF voltage in the OFF condition to at least 4,000V peak to peak.

In the exemplified embodiment, the configuration of FETs M41-M44 is such that, when the switch is in the OFF condition, a full RF voltage of approximately 4 kV peak-to-peak can be applied between terminals A and B and not conduct any RF current through the FETs. When in the OFF condition, during the positive swing on the terminal A, the body diodes D41 and D42 of FETs M41 and M42 will keep the positive voltage on A in the OFF condition. Likewise, when the negative RF voltage swings on terminal A (in the OFF condition), the body diodes D43 and D44 will not allow the RF current conduction to ground. Some leakage current may occur through the bleeder resistors R41-R44 but will be minor.

In the exemplified embodiment, the bleeder resistors R41-R44 are 10 Mega Ohms and are in parallel to all drain to source terminals on the FETs M41-M44. These resistors R41-R44 can keep equal voltage distribution on the drain to source on all devices when OFF. This will also keep all the drain to source voltages symmetrical. It is understood that the values discussed herein are examples and other appropriate values may be used.

The exemplified switching circuit may be understood as comprising a first switch 1410 and a second switch 1420. The first switch can comprise a single transistor M42 or more transistors M41. The one or more transistors M41, M42 are operably coupled in series with a first terminal A. Each of the one or more transistors M41, M42 has a corresponding diode D41, D42. Further, a drain of each of the one or more transistors is operably coupled to a cathode of the corresponding diode.

The second switch 1420 can comprise a single transistor M43 or more transistors M44. The one or more transistors M43, M44 can be operably coupled in series with a second terminal B. Each of the one or more transistors can have a corresponding diode D43, D44. A drain of each of the one or more transistors can be coupled to a cathode of the corresponding diode. Further, a source of the one or more transistors of the first switch 1410 can be operably coupled to a source of the one or more transistors of the second switch 1420. Thus, in the exemplified embodiment, the source of M42 is coupled to the source of M43. A drain of transistor M41 is coupled to terminal A, and a drain of transistor M44 is coupled to terminal B. The transistors of each switch 1410, 1420 can be coupled source-to-drain. Each of the transistors can further include a corresponding resistor R41-R44 operably coupled in parallel to the corresponding diode. In other embodiments, M41 and M44 can be eliminated, or additional transistors can be added, provided the general features of and relationship between the first and second switch (as described in the independent claims) are maintained.

Gate drivers GD1, GD2, GD4 are isolated and can utilize commercially available gate drivers. These gate drivers are typically designed to sustain at least 5 kV peak voltages. These gate drivers also require a floating DC/DC supplies 1430. The floating DC supplies are also isolated. Further, the DC/DC supplies 1430 are also commercially available and thus will not be separately discussed.

The cascoded FETs can be increased to a higher number such as six or more devices connected vertically. In that case the higher RF AC voltage swing in the OFF case will be achieved. For that connection, the gate drivers must sustain higher breakdown voltages. Also, the floating or isolated DC/DC supplies must sustain higher isolation voltages. It is noted that the different potential characteristics of gate drivers and DC power supplies discussed herein can also apply to the gate drivers and DC power supplies of this switching circuit 1400.

The switching circuits 1300 and 1400 have several advantages. The rise time of the ON/OFF condition can be achieved in the order tens of nanoseconds or less. They also enable low capacitance to ground and minimize leakage.

Driver Circuit for Diode

Figure 18:
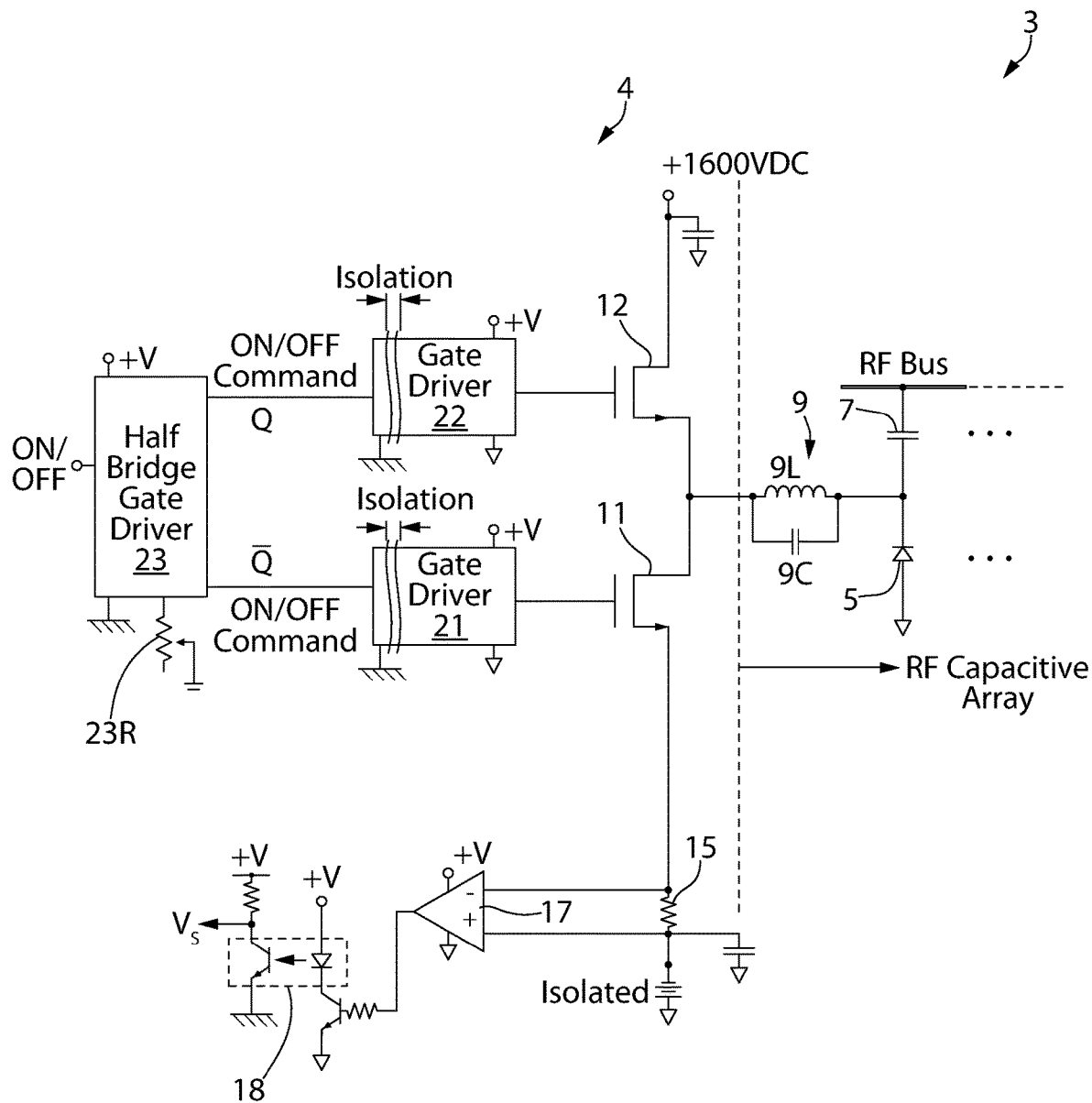
FIG. 18 is a switching circuit having a driver circuit for switching a PIN diode according to one embodiment

As discussed above, in industries such as semiconductor manufacturing, there is need for driver circuits that provide faster switching to enable faster impedance matching. FIG. 18 provides a switching circuit 3 comprising a driver circuit 4 for a PIN diode 5 according to one embodiment. The exemplified driver circuit 4 has ON/OFF driving capabilities for a high voltage and high current PIN diode 5 at frequencies from 400 kHz to 100 MHz. In other embodiments, the concepts discussed herein can be applied to other switches (including NIP diodes) and in other suitable applications.

The exemplified driver circuit 4 is used to control PIN diodes 5 of an EVC used for the digital operation of the matching network. The invention is not so limited, however, as the switching circuit and its driver circuit can be used to switch other types of switches in other types of systems.

In the exemplified embodiment, the driver circuit 4 includes a first switch 11 and a second switch 12 coupled in series, where a drain of the first switch is coupled to a source of the second switch. Further, the first and second switches 11, 12 are metal-oxide semiconductor field-effect transistors (MOSFETs). In other embodiments, however, the first and second switches can be other types of transistors or switches. In the exemplified embodiment, both the first switch 11 and the second switch 12 have a breakdown voltage of at least 1,700 VDC. When the first switch 11 is turned ON, the PIN diode 5 is biased in the forward current direction and thus turned ON. The forward ON current can be adjusted to an optimal set point to minimize the losses of the PIN diode 5. For the PIN diode 5 current adjustment, sense resistor 15 can be used to provide feedback to the controller. When the PIN diode 5 is turned ON, the RF capacitor 7 is connected to ground. In this embodiment, the capacitor 7 is one of many in an array of capacitors of an EVC. These individual capacitors can be switched ON or OFF according to a predetermined algorithmic sequence to vary the EVC's total capacitance.

The second switch 12 is used to switch OFF the PIN diode 5. In this embodiment, the transistor 12 has a sufficiently large breakdown voltage at DC to switch a high DC voltage, such as 1,600 VDC, to the cathode of PIN diode 5. When second switch 12 is turned ON, as much as the full 1,600 VDC can be applied to the cathode of the PIN diode. The PIN diode 5 is then reversed biased and thus the PIN diode 5 is turned OFF.

The driver circuit 4 is controlled by drivers 21, 22, and 23. Specifically, first gate driver 21 is operably coupled to first switch 11, and second gate driver 22 is operably coupled to second switch 12. Third gate driver 23 is operably coupled to the first and second gate drivers 21, 22. In the exemplified embodiment, the third gate driver 23 is a half bridge gate driver, but the invention is not so limited. The third gate driver 23 is configured to provide a first signal to the first gate driver, and a second signal to the second gate driver. The first and second signals substantially asynchronously drive the first and second gate drivers on and off. Note that the gate drivers discussed herein can comprise an integrated circuit or a discrete circuit. In other embodiments, any of the gate drivers can be replaced with other types of drivers for driving switches or other drivers.

Figure 19:
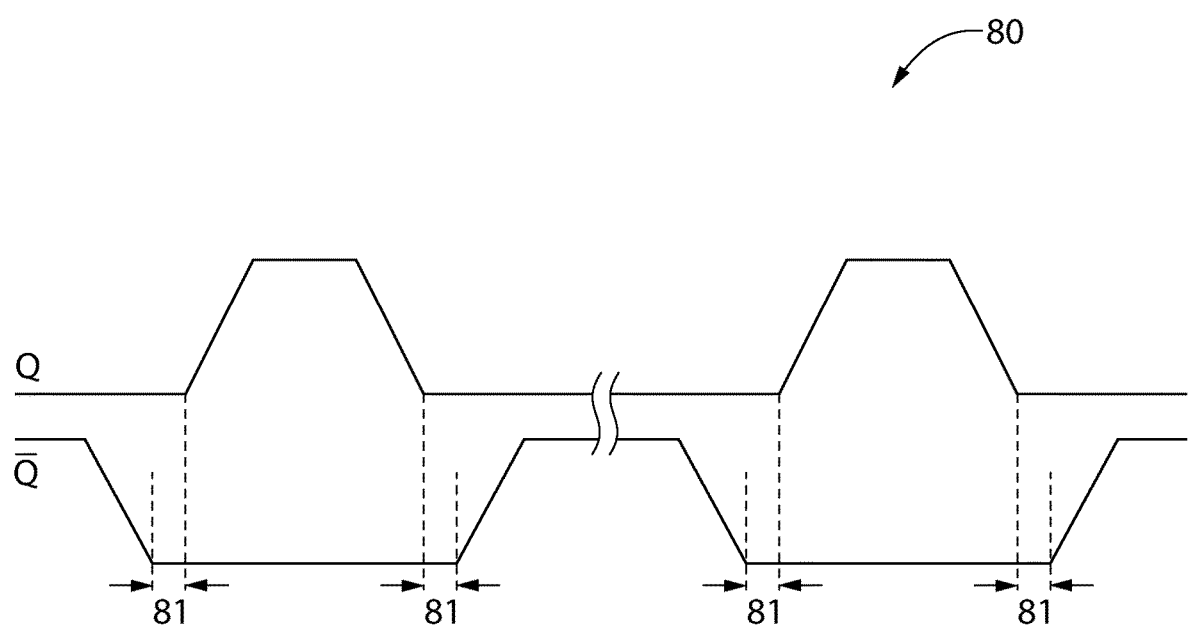
FIG. 19 is a timing diagram for the driver circuit of FIG. 18.

FIG. 19 provides a timing diagram 80 of the sequence of switching the first and second switches 11, 12 of the driver circuit 4 of FIG. 18. This waveform is generated in the third gate driver 23 of FIG. 18. As shown, there can be dead times 81 or time delays between (a) the third gate driver 23 driving the first gate driver 21 ON and the second gate driver 22 OFF, or (b) the third gate driver 23 driving the second gate driver 22 ON and the first gate driver 21 OFF. Accordingly, there can also be dead times between switching the first switch 21 ON and the second switch 22 OFF, or vice versa. These dead times 81 can be exceptions to the otherwise asynchronous switching of the first and second switches 21, 22. The duration of these dead times 81 can be adjusted by varying the resistance of potentiometer 23R on the gate drive 23 in FIG. 18. The dead time 81 can ensure that the energy-storing inductor 9L of the filter circuit 9 does not create a large voltage spike. The dead time 81 can be varied based on the size of the inductor 9L.

Returning to FIG. 18, as discussed above, in the exemplified embodiment, each switch 11, 12 is driven by its own gate driver 21, 22. The gate drivers are isolated between the logic input driving node and the output node. The drivers can have a breakdown voltage in excess of 3 kVrms at the frequency of operation. Separate floating power supplies can feed the gate drivers 21, 22. The gate drivers 21, 22 can also be excited by the third gate driver 23 that supplies the voltage waveform as depicted in FIG. 19. The exemplified gate driver 23 is on the low side of the driver input and does not need the floating low voltage power supply. As discussed above, the third gate driver 23 has a provision to adjust the dead time between ON and OFF states of switching the first and second switches 11, 12. This dead time is adjusted, at a moment, by the potentiometer 23R connected to a ground.

In the exemplified embodiment, between the switching node N1 and the bottom of the switched capacitor 7, connected to the cathode of the PIN diode 5, is an LC or parallel-tuned circuit 9 at the operating frequency. The LC circuit 9 comprises an inductor 9L and a capacitor 9C coupled in parallel. The LC circuit 9 is coupled at a first end between the first switch 11 and the second switch 12, and coupled at a second end to the diode 5.

The exemplified LC circuit 9 is utilized when the PIN diode 5 is in the OFF state to maintain very high impedance at the bottom of switched capacitor 7. This LC circuit 9 assures minimum RF current leakage from the switched capacitor 7 to ground in the OFF state. Also, in parallel to this inductance is the parasitic capacitance of the PIN diode 5 as well as packaging capacitance. All of it can be parallel tuned to make sure the impedance is the highest at the OFF condition of the PIN diode 5. The invention, however, is not limited to the use of LC or parallel-tuned. In other embodiments, other filter circuits, such as a low pass filter, can be utilized.

When the PIN diode 5 is in the OFF state, the total capacitance of the switch in OFF condition should be low, that is, at least about ten times lower that the value of the switched capacitance 7. For instance, if the switched capacitance 7 has a value of 100 pF, it is desirable that a total capacitance from the lower side of capacitor 7 to ground including the PIN diode 5 OFF capacitance be less than 10 pF.

The exemplified filter traps 9 are put individually on each PIN diode 5 in the capacitive array. Such filter traps can be challenging to design when operating at higher frequencies (>40 MHz) with high RF voltage swings on the RF bus. For the PIN diode 5 ON case, a forward DC current adjustment on each PIN diode 5 is measured by the low value of the sense resistor 15 in series with the negative supply. The current sense voltage drop on sense resistor 15 is amplified and processed by an operational amplifier (op-amp) 17. The output voltage of the op-amp 17, now proportional to the current, is optically coupled by a linear opto-coupler 18 to an output node 19, the output node 19 having an output sense voltage, $V_s$. The control board then processes the output sense voltage, $V_s$. The control board (not shown here) can measure the current in each PIN diode 5 to make sure all PIN diodes 5 have sufficient DC current bias available for processing the RF current when the PIN diode 5 is ON. In the exemplified embodiment, a bias current of 0.5 A gives sufficiently low ON resistance in the PIN diode 5.

The sense voltage $V_s$ can also be used to automatically set the DC currents in each PIN diode 5 in an array of diodes. A typical application may use as many as 48 PIN diodes to switch the RF capacitances. The automatic setting of the DC bias current in PIN diode 5 may require the algorithmic voltage adjustment of the negative DC supply. These automatic settings can be embedded in the control board.

As discussed above, the switching circuits discussed above can be used as part of a matching network, such as the matching networks discussed in FIGS. 1A-10 discussed herein. These matching networks are shown within large RF semiconductor manufacturing systems that include an RF generator (or RF source) and a plasma chamber. The switching circuits can be used with π-configuration, L-configuration, and T-configuration matching networks, as well as other types of matching network configurations. Further, the driver circuit is not limited to PIN diodes, as it can be used for other types of diodes or switches. Further, the driver circuit can be used in applications unrelated to semiconductor manufacturing. Further, while the above embodiments discuss providing a variable capacitance, the switching circuit can similarly be utilized to provide a variable inductance.

The switching circuit discussed herein provides several advantages. The circuit can enable high RF voltage and high RF current switching using the PIN diodes. Further, the switching circuit can use only two high voltage switches (e.g., MOSFETs) to achieve a desired switching condition for high voltage and high current RF PIN diodes. Further, the switching circuit enables very high switching speeds for turning ON/OFF a PIN diode. Further, the switching circuit enables low switching losses on the PIN diode, and very low thermal loss on the PIN diode since the DC current through the PIN diode is adjusted to have the lowest Ron resistance, typically in the 50 mil range. Further, the galvanic isolation between the high voltage switched side and the input logic drive is can be large (e.g., in excess of 3 kVrms). Further, as shown in FIG. 18, each switching circuit can be laid out in column, allowing very compact design with RF and galvanic isolation among the multitude of switches. Further, the switching circuit enables the automatic setting of forward bias currents in each individual PIN diode, and the automatic shutdown of the PIN diode switch if it draws an excess of the current, a self-healing process of the RF switch.

Parasitic Capacitance Compensation Circuit

As discussed above, an EVC typically has several discrete capacitors, each having a corresponding switch. In the OFF state, parasitic capacitance on the switches can be significant. There is need for a compensation circuit that can tune out such parasitic capacitances.

Figure 20:
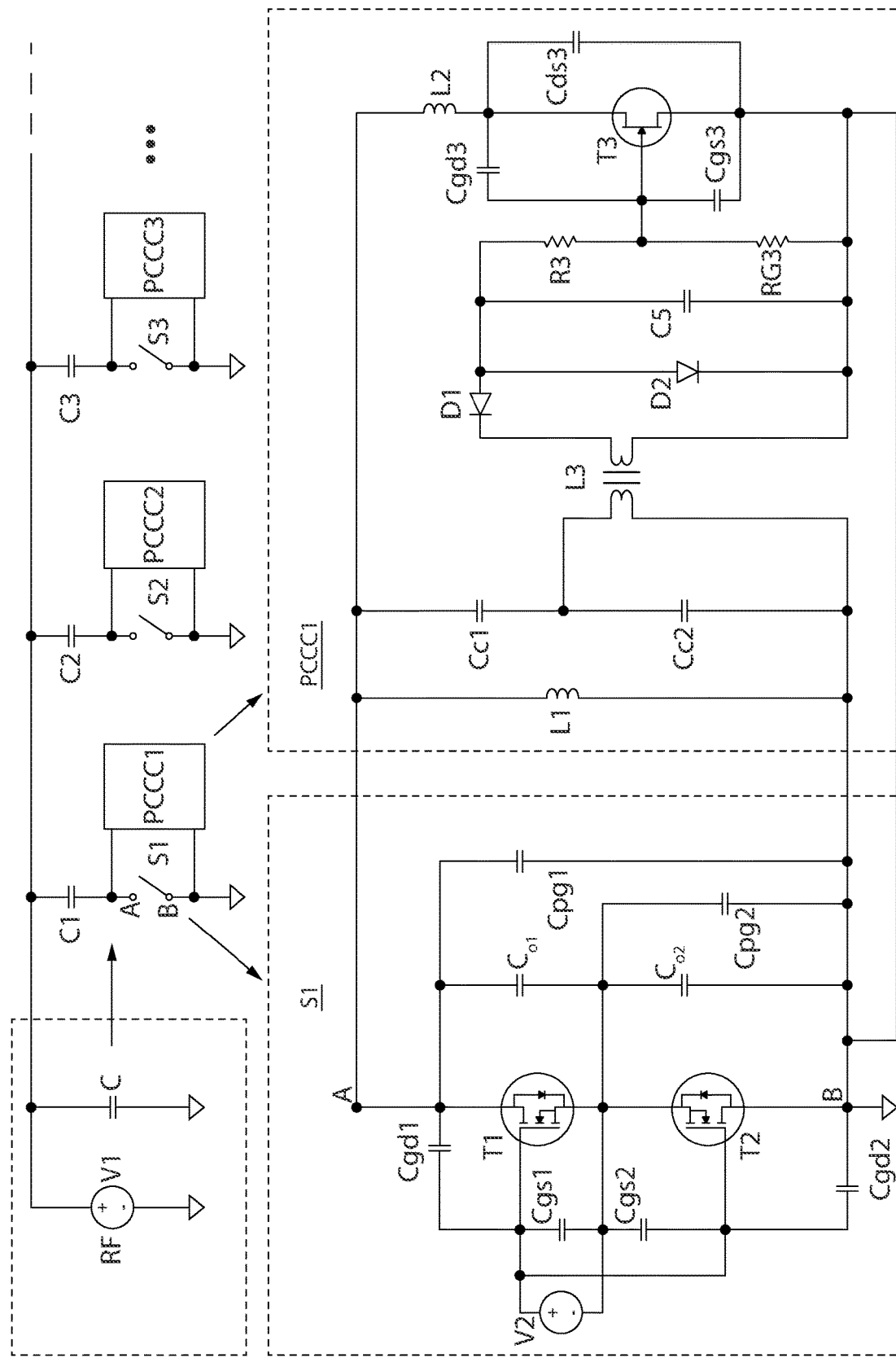
FIG. 20 is a schematic of a system having parasitic capacitance compensation circuits for discrete capacitors of an EVC according to one embodiment.

FIG. 20 is a schematic of a system having parasitic capacitance compensation circuits for discrete capacitors of an EVC according to one embodiment. EVC C comprises an array of discrete capacitors. In the exemplified embodiment, EVC C includes discrete capacitors C1, C2, and C3. Each of these discrete capacitors C1, C2, and C3 can be switched out by a respective switch S1, S2, S3. For example, switch S1 switches discrete capacitor C1 in and out. The total capacitance of EVC C (referred to herein as "C") can be altered by altering the discrete capacitors switched in or out. In the exemplified embodiment, three discrete capacitors are shown, though in other embodiments other numbers of discrete capacitors can be utilized.

Each switch S1, S2, S3 is operably coupled to a parasitic capacitance compensation circuit PCC1, PCC2, PCC3, which compensates for parasitic capacitance in an RF switch, and which will be discussed in further detail below. The circuits of FIG. 20 are simplified and divided into sections to more easily describe the function of the system.

Further, EVC C is coupled to an RF power source V1. The EVC C and RF source V1 can be any of the EVCs or RF sources discussed herein, including those forming part of a matching network. Such matching networks can have any type of the matching network typology, such as a pi-, or L-, or T-type. While the PCCC discussed below is used in compensating for parasitic capacitance in a matching network utilizing EVCs, the invention is not so limited, as it may be used for other types of switches having parasitic capacitances.

FIG. 20 further shows details of switch S1 and its corresponding compensation circuit PCCC1. Switch S1 switches discrete capacitor C1 in and out. Compensation circuit PCCC1 compensates for the parasitic capacitance of switch S1. To simplify FIG. 20, the details of the additional switches S2, S3 and compensation circuits PCCC2, PCCC3 are not shown, though similar circuitry can be used. Terminal A and terminal B represent to two terminals of switch S1. They can also represent the terminals of the compensation circuit PCCC1, which couple to the two terminals of the switch S1.

For switch S1, FIG. 20 identifies all the possible parasitic capacitances between terminals A and B of the switch S1. Some of the capacitances on the switch S1 have fixed values and some are variable with the RF peak voltage impressed between terminals A and B. Output capacitances Co1, Co2 on the RF switch vary with the peak voltage variation on the terminals A, B. FIG. 20 further shows gate-to-drain parasitic capacitances Cgd1, Cgd2, and gate-to-source parasitic capacitances Cgs1, Cgs2.

Figure 21:
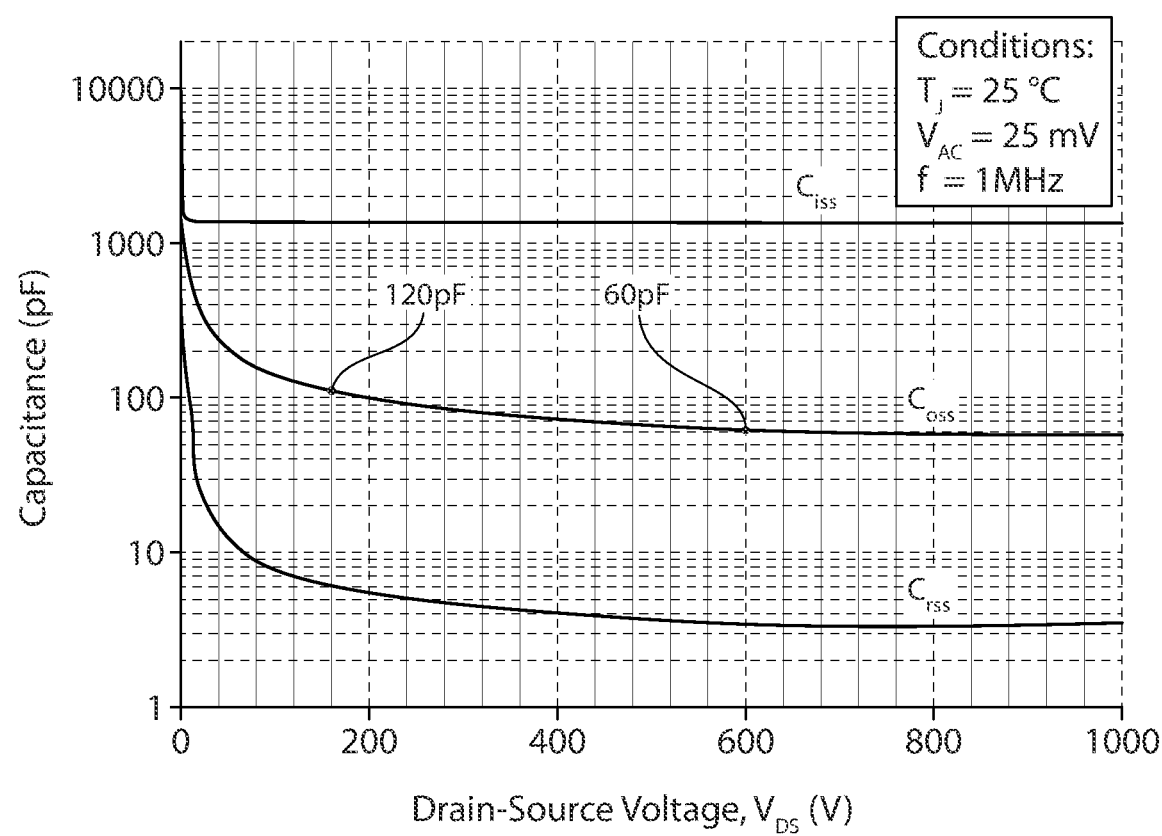
FIG. 21 is a graph showing output capacitance variation for a typical SiC high-voltage MOSFET according to one embodiment.

FIG. 21 is a graph showing output capacitance variation for a typical SiC high-voltage MOSFET that may be used as a switch according to one embodiment. In other embodiments, other types of switches, including other types of FETs, may be used. FIG. 21 specifically shows a capacitance variation for an input capacitance (curve Ciss), an output capacitance (curve Coss), and reverse transfer capacitance (Crss). Output capacitance Coss corresponds with output capacitance Co1 or output capacitance Co2 of FIG. 20. The abbreviations Co and Coss are used interchangeably herein.

A typical application of such an RF FET switch is in a digital matching network where the output voltage on the terminals A, B is about 600V peak (3 kW and 13.56 MHz). At this power level and peak voltage, FIG. 21 indicates the output capacitance Coss is 60 pF. When the voltage on the switch terminals A, B falls down to 160 V peak (about 150 W on the matching network input) the capacitance of the terminals A, B as read from FIG. 21 as Coss rises to 120 pF. Thus, at a most typical peak voltage for the switch of 600V (3 kW), the output capacitance of the switch in the OFF state is 60 pF. When the peak voltage drops to 160V (150 W), the output capacitance of the switch in the OFF state doubles to 120 pF. The most typical peak voltage can vary depending on the application in which the switch and corresponding compensation are used. The most typical peak voltage can be any peak voltage most frequently present at the switch or compensation terminals when the system is operating.

In the exemplified embodiment, the parasitic capacitance of the switch in the OFF state is compensated for by tuning out at two discrete points, though in other embodiments additional points may be used. When RF power is varied from 150 W to 3 kW (a factor 20) the capacitance in the OFF state changes only from 120 pF to 60 pF, that is, only by a factor of 2. As can be seen from FIG. 21, the capacitance change with V peak on the drain is a very shallow curve. Selection of a two-point tune out circuit may therefore be adequate. While adding more tuning points is an option, fewer tuning points can decrease costs and parts.

In the exemplified embodiment, the tuning out of parasitic capacitance is achieved as follows. The total parasitic capacitance Cpar on the RF switch shown in FIG. 20 is:

Cpar=Cgd+Co+Cpg

Thus, the total parasitic capacitance takes into consideration the gate-to-drain capacitance Cgd, the output capacitance Co, and packaging capacitance Cpg. Packaging capacitance Cpg can be caused by, for example, when a FET is put down on a PCB and soldered down. The additional capacitance to ground caused by the soldered pin or an attached pin on the drain of the FET can create such a packaging capacitance Cpg.

In the exemplified embodiment of RF switch S1, transistors T1 and T2 are used to control RF current flow in both directions through the switch S1 when the switch S1 is either ON or OFF. In other embodiments, other switching arrangements and components can be used. For example, in the exemplified embodiment, transistors T1 and T2 are FETs, but other types of switches may be used. In this embodiment, Cgd can be based on Cgd1 and Cgd2, Co can be based on Co1 and Co2, and Cpg can be based on Cpg1 and Cpg2 as shown in FIG. 20.

In one example, when the switch S1 is OFF, Cgd is 3 pF, Co1 is 60 pF, and Cpg is 10 pF, and therefore a total parasitic capacitance is Cpar is 73 pF. One can then calculate the parallel resonant condition for the first case when Co is 60 pF and the peak voltage on the switch S1 is 600V or higher. Parallel resonance will provide minimum current leakage through capacitor C1.

The parasitic capacitance Cpar will be resonated out in a parallel circuit configuration. First inductor L1 is operably coupled between first terminal A and second terminal B, the first inductor causing a first inductance between the first and second terminals A, B. The parasitic capacitance Cpar resonates with discrete inductance L1 as shown in FIG. 20. When they resonate, the parallel impedance of the circuit will be the highest and the leakage current through discrete capacitor C1 will be the lowest. At this moment when the switch is OFF and a high voltage of 600V peak or higher is impressed on capacitor C1, the current should be the minimum through the switch.

$$L1 = \frac{1}{\omega^2 Cpar}$$

In this example, f is 13.56 MHz, and ω=2πf. Thus, L1 is 1.9 uH.

This inductance value is used for inductor L1 of FIG. 20. When the voltage on the terminals A, B decreases to at or below 160V peak, the parasitic capacitance increases due to the increase of output capacitance of the FET T1, T2. At that drain potential the Co capacitance increases to 120 pF as discussed above.

At this moment where the parasitic capacitance has increased by a factor 2, the compensation circuit PCCC1 adjusts the tuning conditions. The new parasitic capacitance Cpar is:

Cpar=Cgd+Co+Cpg

Cpar=5+120+10=135 pF

The total equivalent inductance for this condition is recalculated at 13.56 MHz as:

$$L2' = \frac{1}{\omega^2 Cpar}$$

$$L2' = 1 \text{ uH}$$

The inductance of the second inductor L2, as shown in FIG. 20, is being switched on by the JFET T3 (or other switch) in series with second inductor L2 when the voltage on the terminals A, B falls at or below about 160 V peak. Therefore, the inductance L2 must be recalculated since the parallel combination of L1 and L2 must be equal to L2'=1 uH. Hence, in this case inductor L2 has a value of 2.1 uH.

As shown, the second inductor L2 is operably coupled between the first and second terminals A, B and parallel to first inductor L1. The second inductor L2 causes a second inductance between the first and second terminals of the switch when the second inductor L2 is switched in. The second inductor L2 is switched in when the peak voltage on the first and second terminals falls below a first voltage, which is 160V in this embodiment. The first inductance L1 tunes out substantially all of a parasitic capacitance of the switch when the switch is OFF and the peak voltage is above the first voltage. The first and second inductances L1, L2, collectively tune out substantially all of the parasitic capacitance of the switch when the switch is OFF and the peak voltage is below the first voltage. As used herein, the term substantially all means at least eight five percent (85%).

Figure 22:
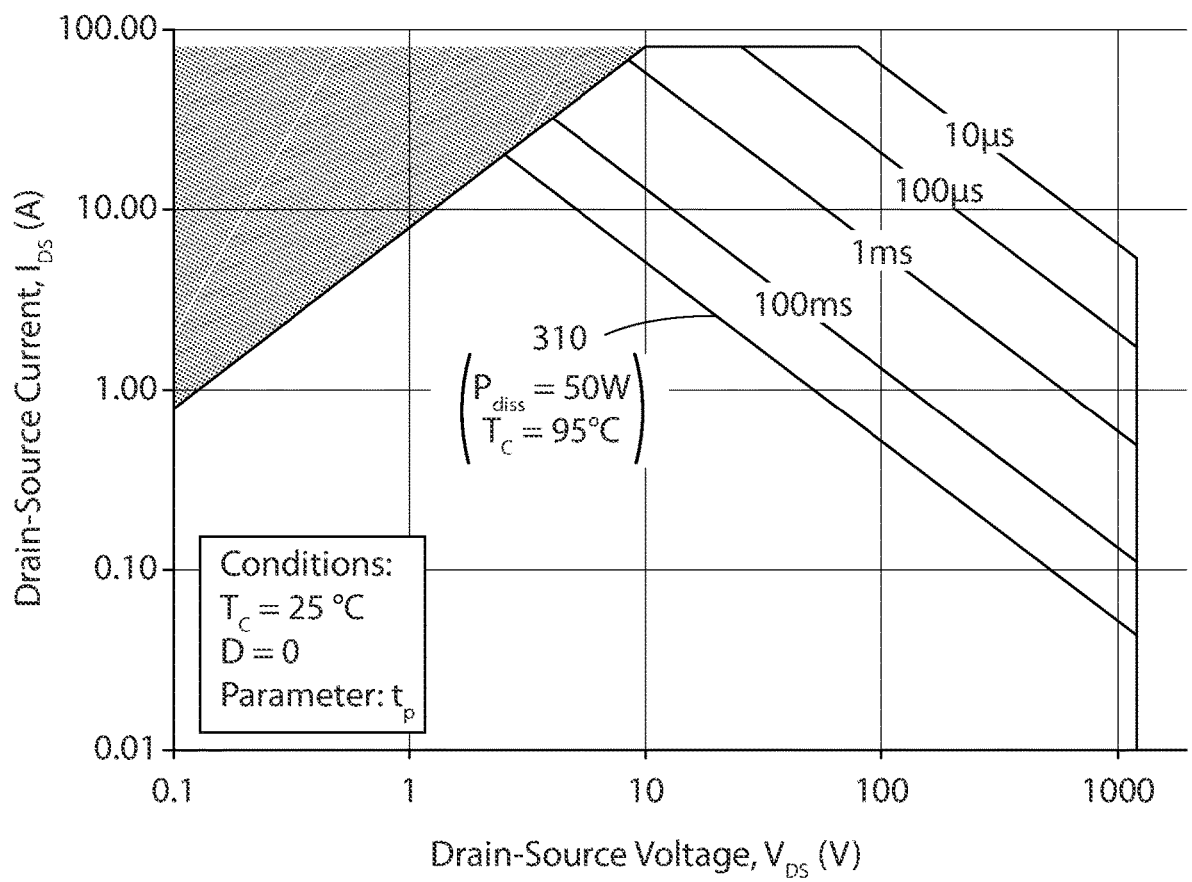
FIG. 22 is a graph showing a power curve for a typical SiC high-voltage MOSFET according to one embodiment.

FIG. 22 is a graph showing a power curve for a typical SiC high-voltage MOSFET according to the exemplified embodiment. Curve 310 shows a maximum power dissipation allowed on the drain-to-source junction when 50 W dissipation is allowed at the device's case temperature of 95° C.

Figure 23:
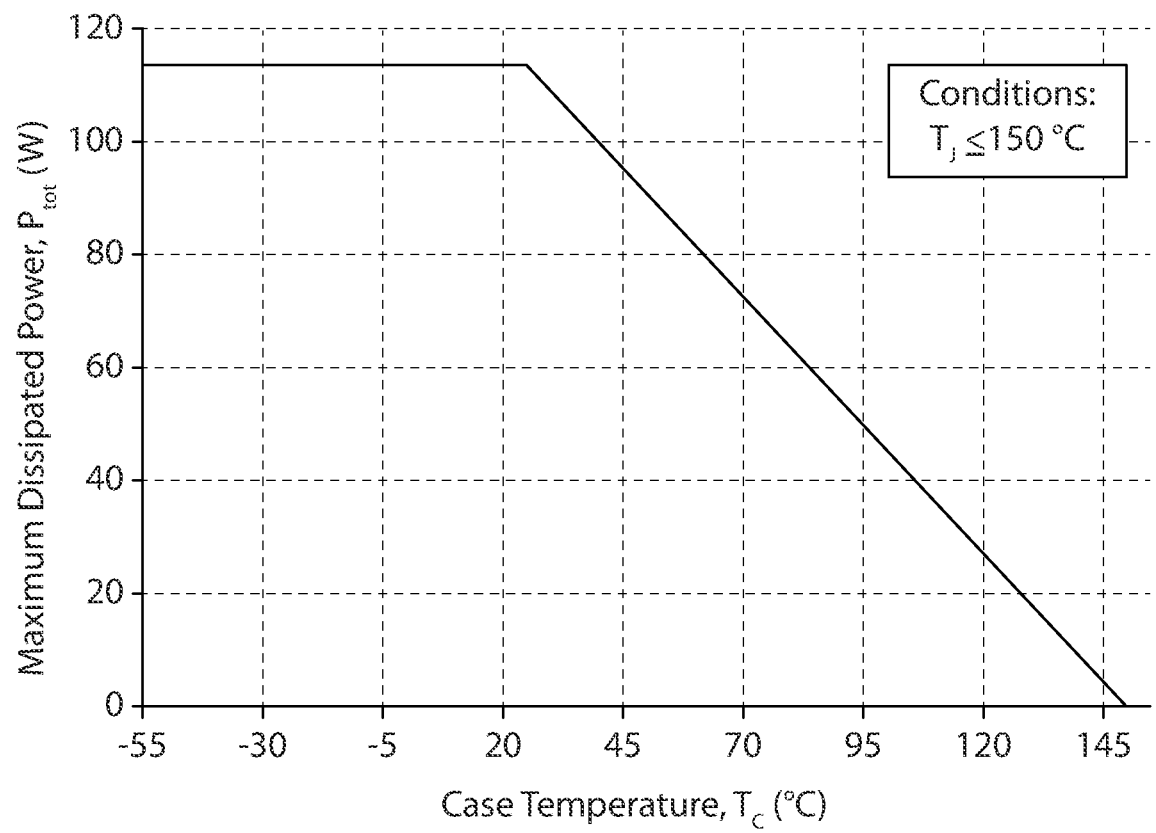
FIG. 23 is a graph of a maximum power dissipation of a typical SiC high-voltage MOSFET according to one embodiment.

FIG. 23 is a graph of a maximum power dissipation of a typical SiC high-voltage MOSFET according to the exemplified embodiment. It is noted that the graphs of FIGS. 21-23 are adapted from graphs from CREE Corp. FIG. 23 shows the power dissipation of 50 W at the case temperature of 95° C. This allows the calculation of the maximum allowable drain current versus the drain-to-source voltage. Curve 310 of FIG. 22 shows the drain-source voltage versus the drain-source current at a maximum power dissipation of 50 W and 95° C. case temperature.

TABLE 2

| $V_{DS}$[V]DC or RMS | Peak[V] | Max Drain Current [mA RMS] | MOSFET |
|---|---|---|---|
| 800 | 1,131 | 63 | OFF |
| 600 | 849 | 83 | OFF |
| 400 | 567 | 125 | OFF |
| 200 | 283 | 250 | OFF |
| 100 | 141 | 500 | OFF |
| 50 | 71 | 1A | Getting ON |
| 25 | 35 | 2A | Getting ON |

TABLE 2-continued

| $V_{DS}$[V]DC or RMS | Peak[V] | Max Drain Current [mA RMS] | MOSFET |
|---|---|---|---|
| 10 | 14.4 | 5A | ON |
| 5 | 7.1 | 10A | ON |

Returning to FIG. 20, in the exemplified embodiment, capacitors Cc1 and Cc2 are used to sample the RF voltage on the switch at terminal A. The sampled voltage is processed via the transformer L3 that allows taking some energy out of the capacitive divider to keep the JFET sub-switch T3 in the OFF condition until the voltage on terminal A falls below about 160V. At that moment, the detected DC voltage on diode D1 falls down to less than minus 1V, in which case the JFET turns ON. This causes inductor L2 to switch ON, which resonates with the new higher parasitic capacitance (120 pF), and thus tunes out the new larger capacitance.

The described parasitic capacitance compensation circuit PCCC1 can tune out parasitic capacitances in all solid state switches (such as MOSFETS, GaN FETS, SiC FETS, BJT, and IGBTs and others) and any other switch circuits that suffer from excessive capacitance. Such a circuit can allow switches, including ordinary RF FETS with large output capacitances, to operate at higher frequencies. The compensation circuit can become an integral part of a solid state switch for an EVC. In a preferred embodiment, the compensation circuit is tightly packaged electrically and thermally to the designed switch. Thermal issues on the RF switch and the compensation circuit can be solved simultaneously, since after the compensation circuit is invoked, the RF switch and compensation circuit become one unit.

The compensation circuit can also be applied to PIN diodes and even high-power electronic transmitter tubes used in HF heating applications, etc. In some cases, the compensation circuit can be added externally to a solid state relay device and improve the solid state relay condition when in the OFF state. The invention not limited to specified types of switches, transistors, or other components shown in the embodiments discussed above.

As discussed, the switching circuits and compensation circuits discussed above can be used as part of a matching network, such as the matching networks discussed in FIGS. 1A-10 discussed herein. These matching networks are shown within large RF semiconductor manufacturing systems that include an RF source and a plasma chamber. The switching circuits can be used with π-configuration, L-configuration, and T-configuration matching networks, as well as other types of matching network configurations. In a method for manufacturing a semiconductor, a substrate is placed in the plasma chamber, the plasma chamber configured to deposit a material layer onto the substrate or etch a material layer from the substrate. The plasma in the plasma chamber is energized by coupling RF power from an RF source into the plasma chamber to perform a deposition or etching. While energizing the plasma, the matching network between the RF source and plasma chamber can carry out an impedance match. The matching network can include an EVC whose discrete capacitors use a parasitic capacitance compensation circuit similar to that discussed herein. Further, the parasitic capacitance compensation circuit can form part of an EVC of a matching network where the matching network forms part of a semiconductor processing tool. The semiconductor processing tool can comprise a plasma chamber and an impedance matching network, such as any of the plasma chambers and impedance matching networks described herein (e.g., matching network 100 and load 120 of FIG. 1A).

Switching Circuit Cancelling Parasitic Capacitance

As discussed above, an EVC typically has several discrete capacitors, each having a corresponding switch. There is need for a switch that can cancel the effects of parasitic capacitances on the switch. The following provides embodiments for a circuit architecture of a single-pole, high-power RF switch. Any active switching element can be used, such as BJTs, IGBTs, JFETs, MOSFETs, HEMTs, etc. Silicon carbide (SiC) and gallium nitride (GaN) devices have good properties for high-power RF switches; however, more traditional silicon devices may also be used.

FET transistors can be used as a switching element at RF frequencies. These RF switches are typically used in matching networks at ISM frequencies and at power levels from 500 W to 5 kW. The predominant applications are in the semiconductor industry when driving a plasma chamber. The switch circuit architecture described herein will allow the design of new matching networks at power levels up to 10 kW using the present technology of RF power transistors.

Figure 24:
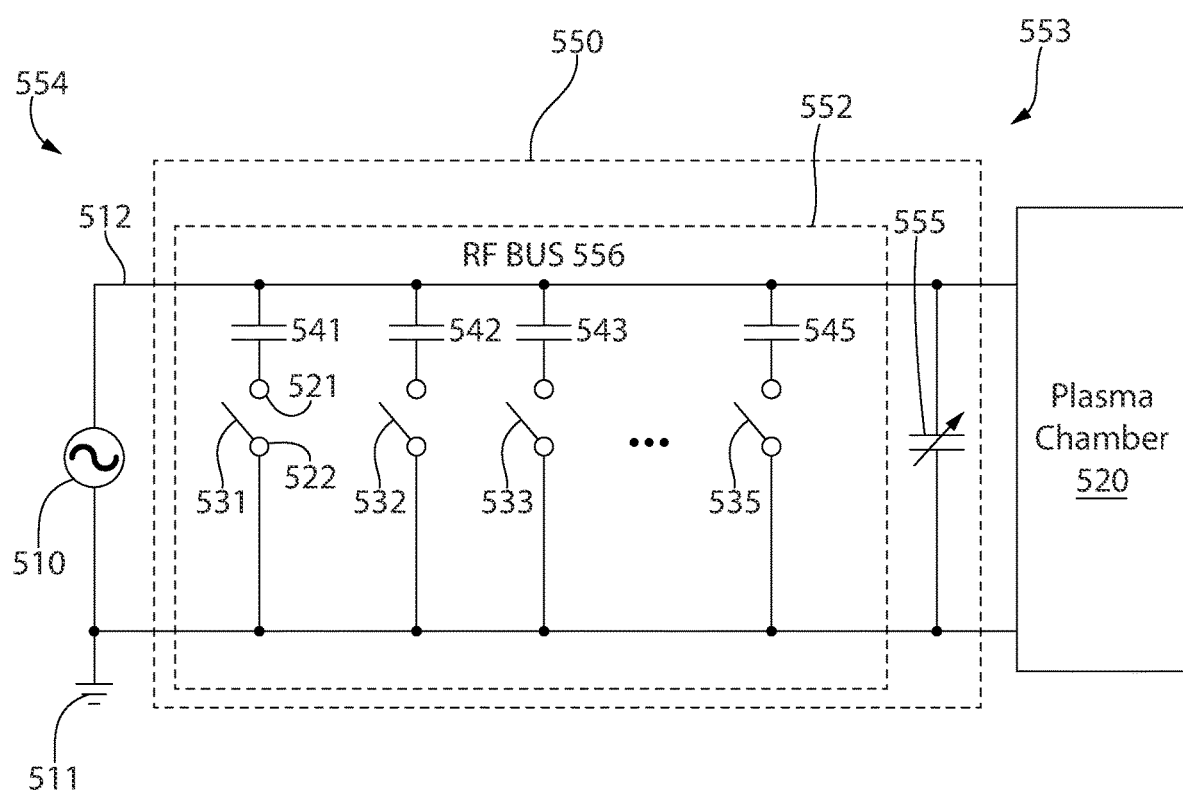
FIG. 24 is a simplified schematic of a system utilizing an electronically variable capacitor according to one embodiment.

FIG. 24 is a simplified schematic of a system 554 utilizing electronically variable capacitors 552, 555 according to one embodiment. The exemplified system 554 comprises an RF source 510 and a semiconductor processing tool 553. The semiconductor processing tool includes a matching network 550 and a plasma chamber 520. In this simplified schematic, the matching network 550 comprises a first electronically variable capacitor (EVC) 552 and a second EVC 555 arranged in a pi-configuration, though it is understood that other configurations (such as those L, and T-type configurations discussed herein) can be utilized. The matching network 550 has an RF input 512 for operably coupling to the RF source 510, and an RF output 513 for operably coupling to a plasma chamber 520 or other load.

The EVC 552 comprises an RF bus 556 having discrete capacitors 541, 542, 543, 545 and corresponding switches 531, 532, 533, 535. Each switch 531 has a first terminal 521 operably coupled to the corresponding discrete capacitor 541, and a separate second terminal 522. In this embodiment, the second terminals 522 are operably coupled to each other and to a reference voltage (ground). The switches 531, 532, 533, 535 are configured to switch in and out the discrete capacitors 541, 542, 543, 545 to alter a total capacitance of the EVC 552. This allows for a precise and fast match with no moving parts. The exemplified switches are designed to be floating devices to some prescribed high-voltage (HV) level.

In other embodiments, other numbers of capacitors can be used. In yet other embodiments, other variable reactance elements comprising one or more reactance elements can be used, such as an electronically variable inductor comprising one or more inductors. Further, it is noted that in other systems, the RF source 510, matching network, 550, and/or plasma chamber 520 can have alternative characteristics such as those discussed in the other embodiments provided herein.

Figure 25:
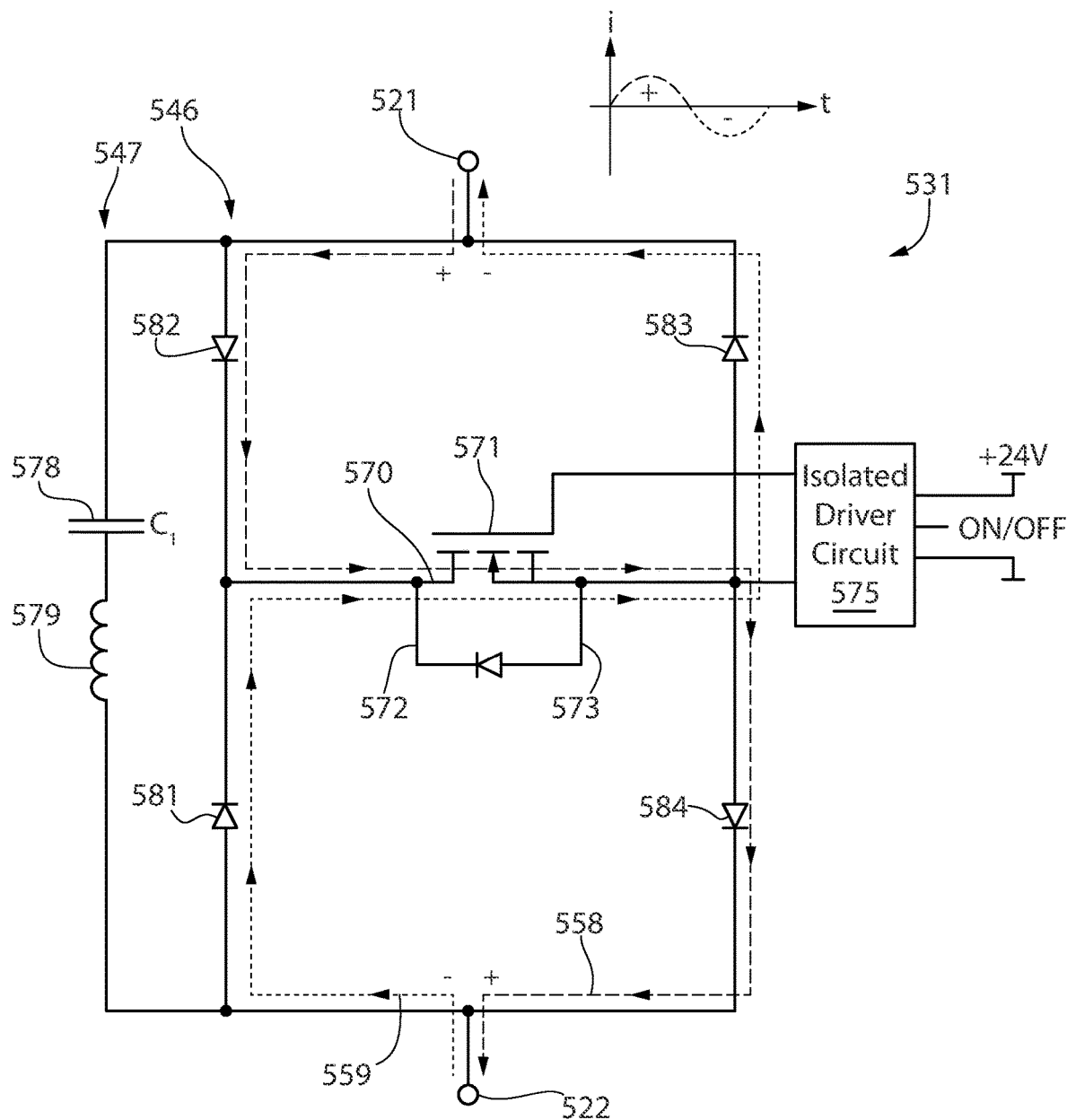
FIG. 25 is a schematic of a high-power RF switch for a discrete capacitor of the electronically variable capacitor of FIG. 24.

FIG. 25 is a schematic of high-power RF switch 531 for discrete capacitor 541 of electronically variable capacitor 552 of FIG. 24. As can be seen, each switch 531 includes a switching circuit 546 and a tuning circuit 547 coupled in parallel. The tuning circuit 547 can used to tune out a cumulative parasitic capacitance of the switching circuit 546. The exemplified tuning circuit 547 includes a tuning inductor 579 and a tuning capacitor 578 coupled in series, though the invention is not so limited. For example, in another embodiments, the tuning circuit can omit the tuning capacitor, as the tuning capacitor is used mainly as a bypass capacitor to prevent any direct current that could develop in the circuit from leaking through the tuning inductor 579 and potentially detuning the circuit. If used, the tuning capacitor 578 will generally be large to look low impedance at the operating frequency. The tuning circuit will be discussed in much greater detail below.

The exemplified switching circuit 546 is coupled between the first terminal 521 and the second terminal 522. The switching circuit 546 includes a switching transistor 570 having a transistor first terminal 571, a transistor second terminal 572, and a transistor third terminal 573. In the exemplified embodiment, the switching transistor 570 is a SiC FET, and the transistor first terminal 571 is a gate, the transistor second terminal 572 is a drain, and the transistor third terminal 573 is a source. But as discussed above, this transistor for carrying out the switching action is not so limited and could be any power FET or BJT device. The FET is the dominant RF power device at this moment in power semiconductor development. The switching of the switching transistor 570 ON and OFF causes its corresponding discrete capacitor 541 to be switched in and out.

In the exemplified embodiment, the switching transistor 570 is imbedded in a cradle of four HV switching diodes 581, 582, 583, 584. First terminal 521 is connected to one electrode of an RF capacitor and second terminal 522 is connected to ground, though the invention is not so limited. First diode 581 has an anode operably coupled to the second terminal 522 and a cathode operably coupled to a drain 572 of the transistor 570. Second diode 582 has an anode operably coupled to the first terminal 521 and a cathode operably coupled to the drain 572 of the transistor 570 and the cathode of the first diode 581. Third diode 583 has a cathode operably coupled to the first terminal and an anode operably coupled to the source 573 of the transistor 570. Fourth diode 584 has a cathode operably coupled to the second terminal and an anode operably coupled to the source 573 of the transistor 570 and the anode of the third diode 583. Note that the invention is not limited to the use of diodes as switching devices. As will be discussed further below, the diodes can be replaced with other switching devices, such as transistors. In one embodiment, the switching devices are insulated-gate bipolar transistors (IGBTs).

The switching transistor 570 is turned ON and OFF by its HV isolated gate driver circuit 575. The gate 571 and source 573 of the transistor 570 are coupled to the driver circuit 575. In the exemplified embodiment, the gate driver 575 for transistor 570 is floating and thus is isolated to at least >5 kV peak voltages. The source and drain terminals 573, 572 of transistor 570 will be floating on high DC voltage when device is switched OFF.

The exemplified transistor 570 and diodes 581, 582, 583, 584 are thermally connected to a heat sink via a good thermal conductor that is at the same time electrically isolated. Alumina or aluminum nitride substrates and silicone-based thermal greases are typically used for thermal management. It is important to take the heat out of the power semiconductor devices when they are switching high currents. The electrical properties of these devices are dependent on temperature.

There will be a parasitic capacitance from source and drain of transistor 570, first terminal 521 to ground, and second terminal 522 to ground. This is shown in the subsequent figures. Switching diodes should be fast switching diodes with breakdown voltages equal to or higher than the switching transistor 570. These diodes should be chosen to have their parasitic capacitances as low as possible.

Condition when RF Switch is ON

Figure 26:
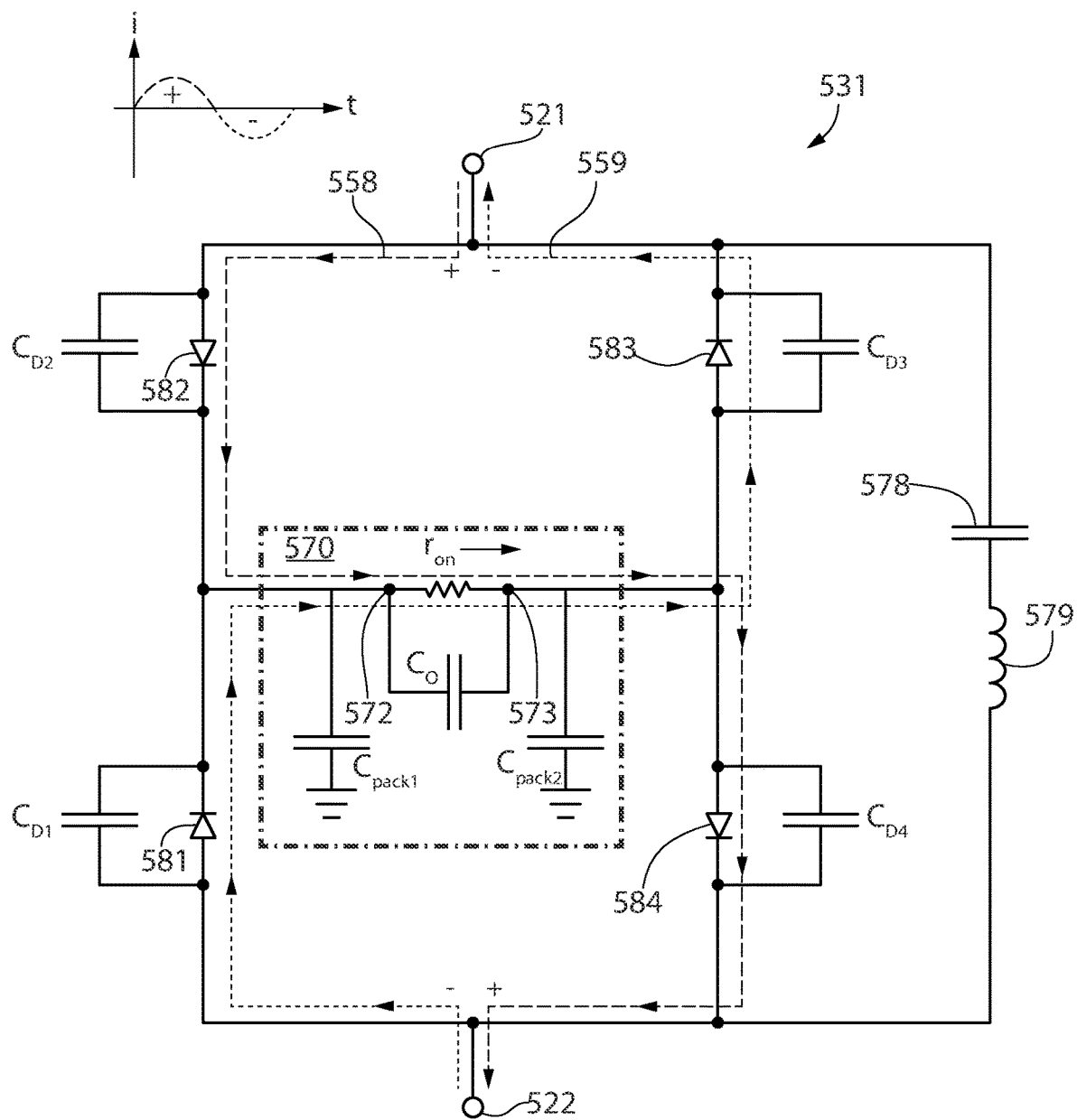
FIG. 26 is a schematic representing the high-power RF switch of FIG. 25 in the ON state.

FIG. 26 is a schematic representing the high-power RF switch 531 of FIG. 25 in the ON state. The switching diodes 581-584 have their parasitic capacitances shown and represented by their notations as CD1, CD2, CD3, and CD4. Typical values of parasitic capacitance of the high-voltage, high-speed diodes are around 40 pF. When the FET switch 570 is ON, the characteristics of the switch 570 in that state are represented as $r_{on}$ resistance in parallel with the output capacitance of the FET 570 as denoted as Co. The figure also shows packaging capacitances Cpack1, Cpack2, which are discussed further below and are similar to the packaging capacitance Cpg discussed above.

When the FET switch 570 is in the ON state, the RF current through the switch 570 must flow in both directions. Note that during the positive swing of the current through the switch 570, current flows according to positive current path 558. At that time diodes 582, 584 are ON. Note that the current in the FET 570 flows from drain 572 to source 573. When the FET switch 570 is still in the ON state but the RF current flows according to the negative current path 559, diodes 581 and 583 will conduct the RF current. Put more generically, it can be said that the switching circuit comprises (a) a first switching device 581 that, only when switched on, passes current from the second terminal 522 to the transistor second terminal 572 (drain); (b) a second switching device 582 that, only when switched on, passes current from the first terminal 521 to the transistor second terminal 572 (drain); (c) a third switching device 583 that, only when switched on, passes current from the transistor third terminal 573 (source) to the first terminal 521; and a fourth switching device 584 that, only when switched on, passes current from the transistor third terminal 573 (source) to the second terminal 522. While in the current embodiment the switching devices are diodes, in other embodiments they can other switching devices such as transistors (see, e.g., FIG. 32).

It is important to note that in both the negative current path 559 and the positive current path 558, the current flows in the FET 570 from drain 572 to source 573. Thus, current flowing between the first and second terminals flows from the transistor second terminal 572 (drain) to the transistor third terminal 573 (source) both when the current is flowing in a positive direction and when the current is flowing in a negative direction. This is an important feature that prevents the need for another FET transistor for the negative flow of RF current. In other embodiments, positive and negative currents can instead flow from source to drain to prevent need for another FET transistor. In yet other embodiments, a second FET transistor can be utilized.

Figure 27:
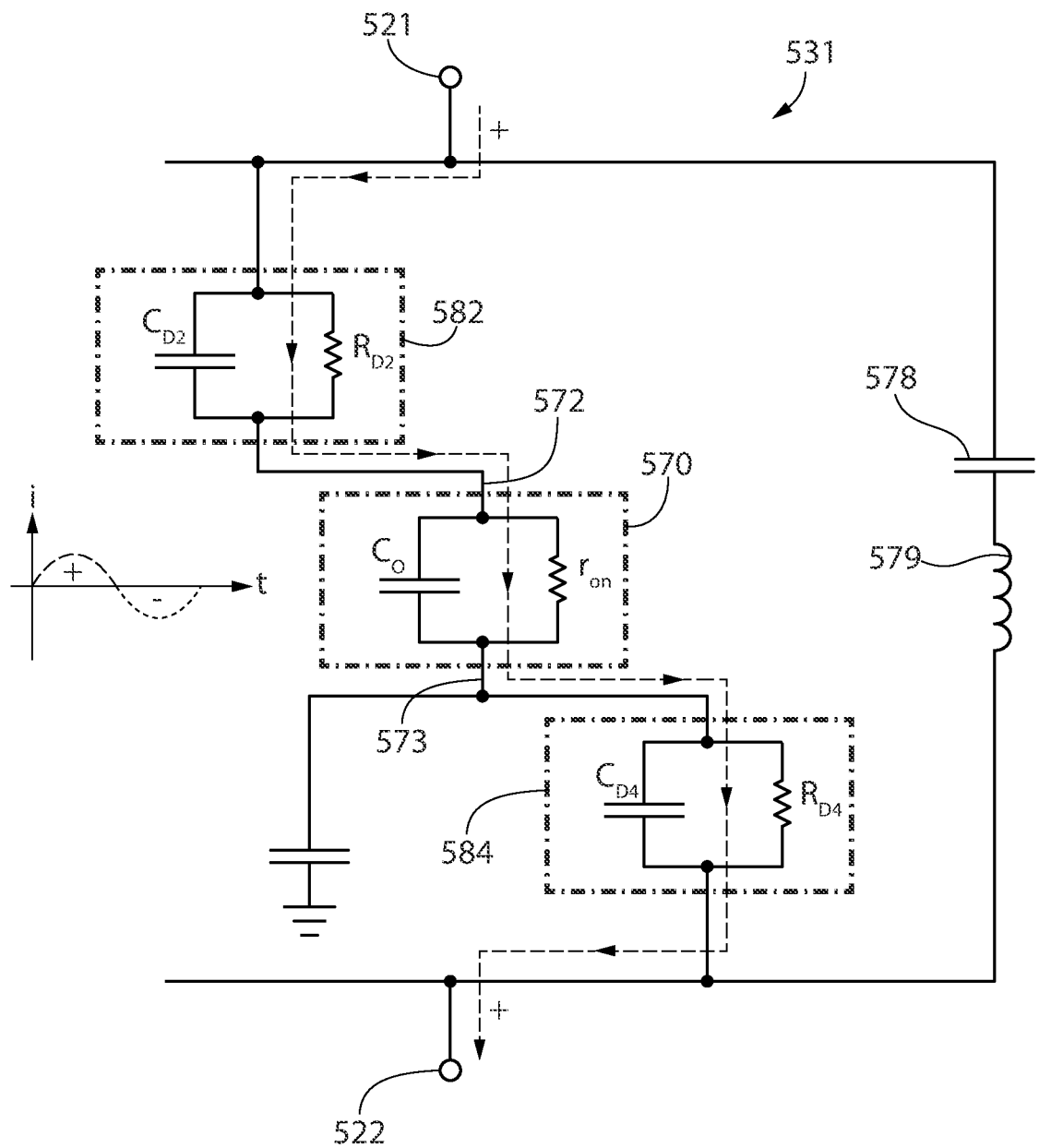
FIG. 27 is a schematic representing the high-power RF switch of FIG. 25 in the ON state during the positive cycle.
Figure 28:
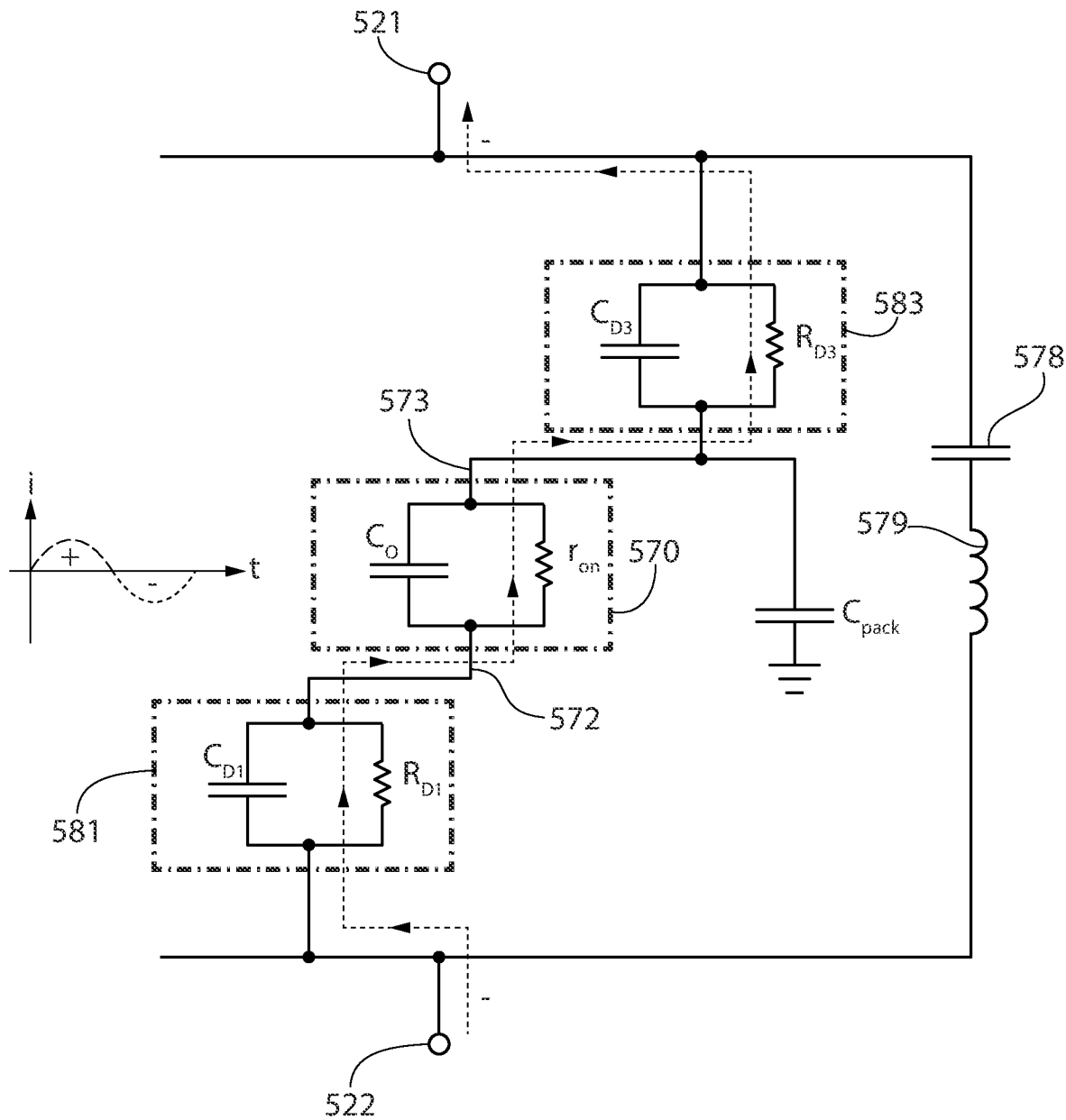
FIG. 28 is a schematic representing the high-power RF switch of FIG. 25 in the ON state during the negative cycle.

FIG. 27 is a schematic representing the high-power RF switch 531 of FIG. 25 in the ON state during the positive cycle, while FIG. 28 is a schematic representing the high-power RF switch of FIG. 25 in the ON state during the negative cycle. These figures show the resistance $r_{on}$ of the FET switch 570 as well as output capacitance Co of the FET switch 570. The voltage drop across the resistance $r_{on}$ will be very small if $r_{on}$ has a value in few tens of milliohms, as is typical of most power transistors. Under these conditions, the output capacitance Co is practically shorted out. The HV voltage drops from drain to ground or source to ground will be about the same. The nodes drain, and source will have high voltages to ground but not from drain to source.

Condition when RF Switch is OFF

Figure 29:
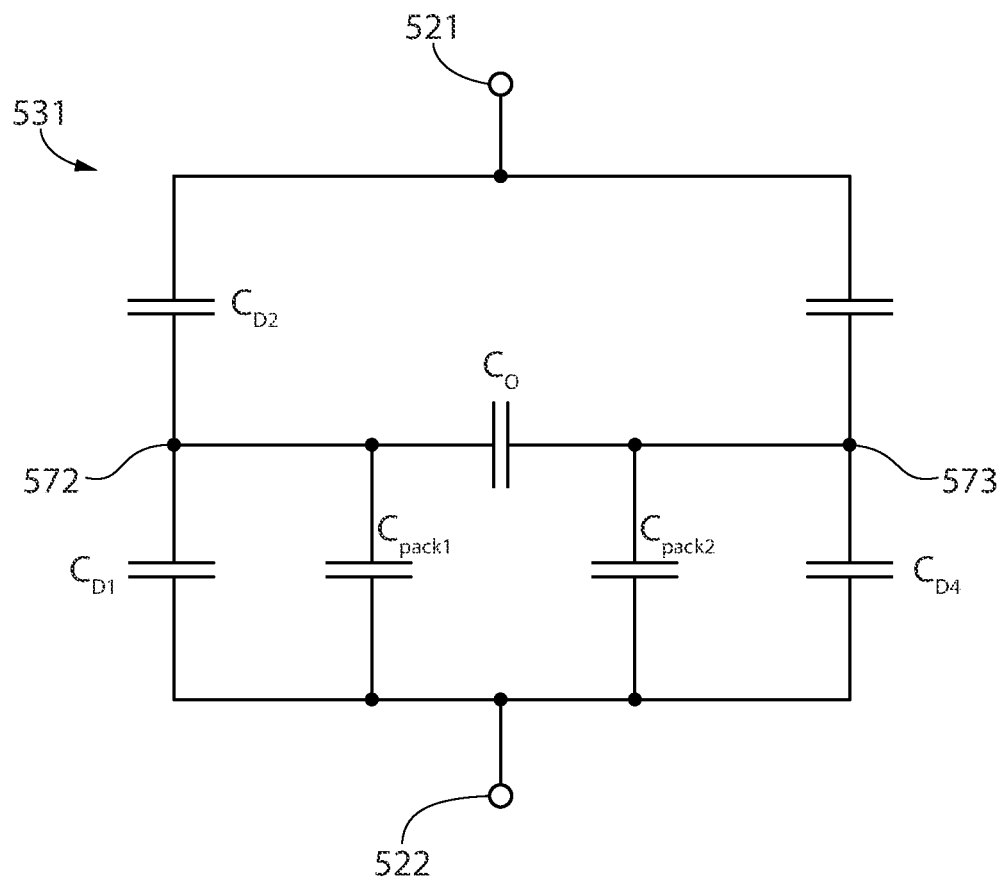
FIG. 29 is a schematic representing the high-power RF switch of FIG. 25 in the OFF state.

FIG. 29 is a schematic representing the high-power RF switch 531 of FIG. 25 in the OFF state. As will be shown, the parasitic capacitance of the accompanying diodes 581-584 play an important role. It is therefore advantageous for this application to find HV diodes with the lowest possible capacitance and the lowest voltage drop when conducting RF current from 10 to 15 A rms. There exist few such components now. For instance: CREE C3D10170H, $I_{rf}$=14 A rms, $C_{diode}$=40 pF at 1,000V.

Diode capacitances are shown in FIG. 29 as $C_{D1}$ to $C_{D4}$ belonging to diodes 581-584. In addition to diode capacitances, the figure shows the packaging capacitance from source to ground Cpack2 and from drain to ground Cpack1 on transistor 570. These parasitic capacitances are the capacitances from the FET packaging to ground when the power FET is mounted on the heat sink with an electronically isolated and thermally conducting pad. The combined capacitance of $C_{D1}$ and Cpack1 can be represented by $C_{D1'}$, and the combined capacitance of $C_{D4}$ and Cpack2 can be represented by $C_{D4'}$, where $$C_{D1'}=C_{D1}//\text{Cpack1}$$

$$C_{D4'}=C_{D4}//\text{Cpack2}$$

Figure 30:
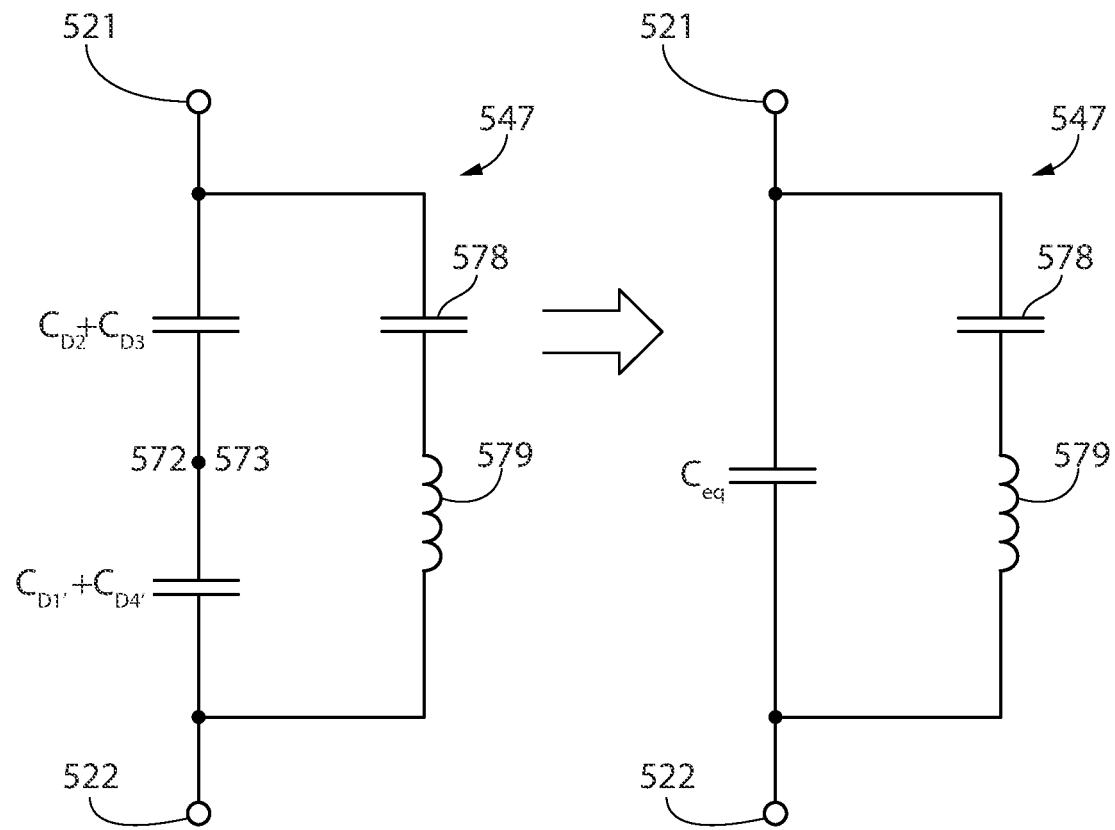
FIG. 30 is an equivalent circuit for the schematic of FIG. 29 with the addition of a tuning circuit according to one embodiment.

FIG. 30 is an equivalent circuit for the schematic of FIG. 29 with the addition of a tuning circuit according to one embodiment. The first equivalent circuit shows the combined capacitances for $C_{D2}$ and $C_{D3}$, as well as the combined capacitances for $C_{D1'}$ and $C_{D4'}$. The second equivalent circuit combines these capacitances to a single cumulative parasitic capacitance Ceq. To determine Ceq, the following equation can be used:

$$Ceq = \frac{(C_{D2}+C_{D3})(C_{D1'}+C_{D4'})}{C_{D2}+C_{D3}+C_{D1'}+C_{D4'}}$$

As one can see, the total capacitance of all parasitic capacitances of four diodes reduces to about a value of one diode.

Timing Out Parasitic Capacitance of Four Diodes

The equivalent circuit of FIG. 30 includes the parallel connection of a tuning inductor. The value of the inductor is chosen such that it will resonate with the equivalent total capacitance Ceq of the diodes. This gives a high impedance at the frequency of operation, blocking RF currents from leaking through the switch in the OFF state.

Importantly, by this configuration, the parasitic capacitance Co of the switching FET 570 is eliminated. In the OFF condition, the equations show that the voltage drop between the drain and source is the DC rectified voltage of the RF BUS 556, when the switching diodes are about matched (to have the same parasitic capacitance). Also, the RF AC current through the switching FET 570 in the OFF condition is zero. Since the voltage between terminals drain and source on switching transistor 570 is a direct current we do not expect any RF AC current to flow. The simulation of the circuit (discussed below) confirms these results. That is also a mechanism that vanishes the influence of the output capacitance of switching FET 570. In the OFF state there is no AC variation on the terminals drain-to-source on switching transistor 570. Rectified DC voltage charges the Co capacitance of switching transistor 570. If we put more of the same FET switches in series, that rectified DC voltage will distribute the voltage down evenly on each FET.

A practical calculation of the tuning inductor 579 in this case is as follows. $C_{D1}=C_{D2}=C_{D3}=C_{D4}$=40 pF. Further, Cpack1=Cpack2=30 pF distributed equally from drain to source (each node will see 15 pF). Putting these values into the equation above, Ceq=46.3 pF. Note that the packaging capacitance of the switching transistor, for instance taken here as 30 pF, contributes only 46.3 pF–30 pF, or 6.3 pF.

From the foregoing, it can be seen that one could use for a switching transistor a much less expensive FET since the FET's output parasitic capacitance is cancelled and does not play any role in the circuit if the accompanying HV diodes are high speed diodes, and matched to have the same parasitic capacitance. Thus, one can use a less expensive FET as a switching transistor if it also has low resistance $r_{on}$ and high voltage breakdown. The switching speed requirement is now reduced if it can switch with the bandwidth of the power control loop. Those frequencies are, currently, less than 100 kHz or 10 us.

Tuning Inductor Value Calculation

The tuning out of the Ceq capacitance is accomplished by resonating with the external inductance L between the terminals A and B. The inductance is calculated using the following equation.

$$L = \frac{1}{\omega^2 Ceq}$$

Where f=1 3.56 MHz and Ceq=46.3 pF, L=3 uH. This is a very reasonable value at that frequency and capacitance. Only one inductor will be required to tune out the Ceq at high voltages on terminals A and B on the RF switch.

Figure 31:
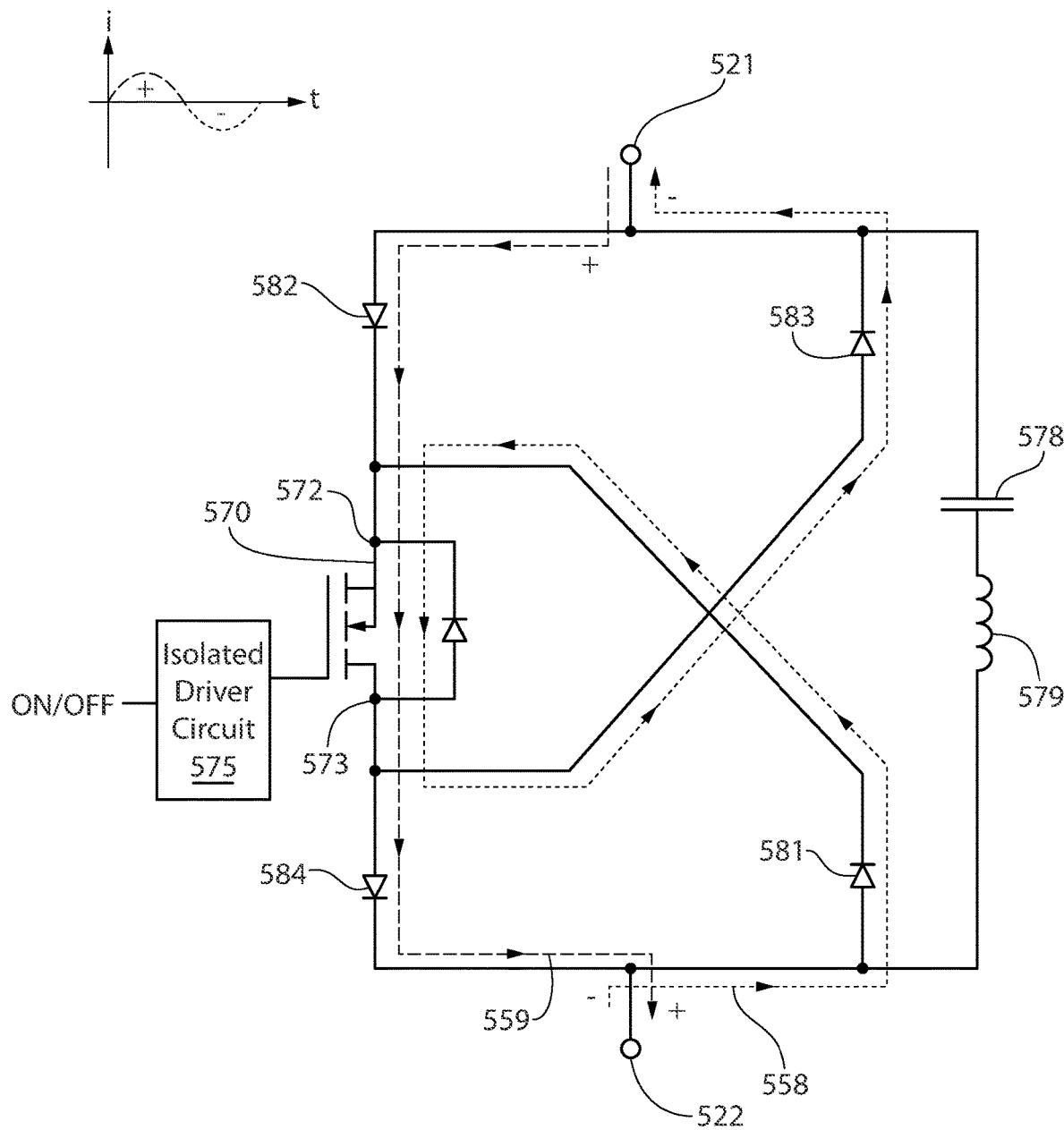
FIG. 31 is a schematic providing a practical circuit layout for the for high-power RF switch of FIG. 25 according to one embodiment.

FIG. 31 is a schematic providing a practical circuit layout for the for high-power RF switch of FIG. 25 according to one embodiment. It is noted that the circuit has only five components and an inductor.

Second Embodiment (Using Transistors)

Figure 32:
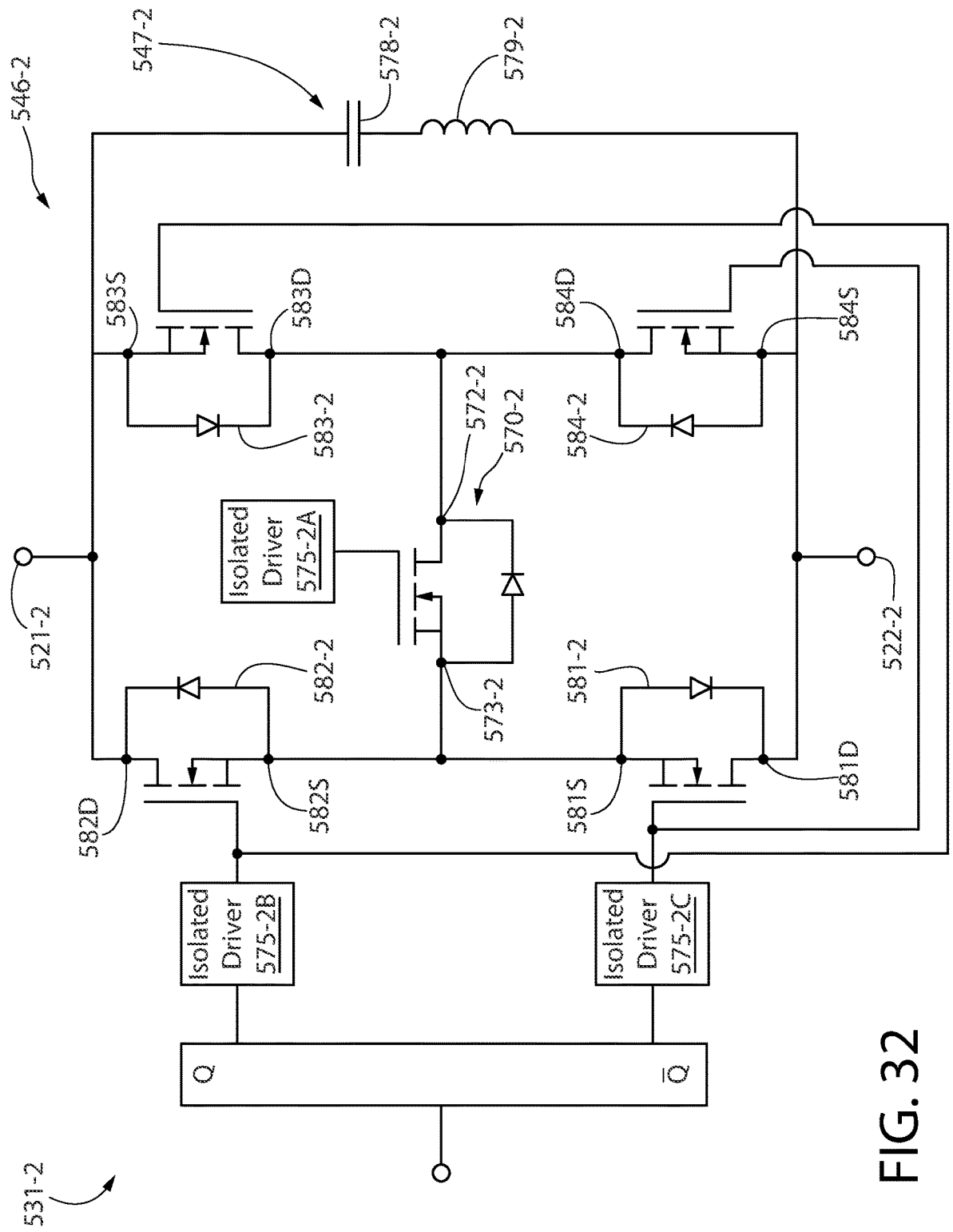
FIG. 32 is a second embodiment of the high-power RF switch utilizing transistors instead of diodes according to one embodiment.

FIG. 32 is a second embodiment of the high-power RF switch 531-2 utilizing transistors 581-2, 582-2, 583-2, 584-2 instead of diodes according to one embodiment. In this embodiment, the first transistor 581-2 has a drain 581D coupled to the second terminal 522-2 and a source 581S coupled to the transistor third terminal 573-2 (source); the second transistor 582-2 has a drain 582D coupled to the first terminal 521-2 and a source coupled to a transistor third terminal 573-2 (source); the third transistor 583-2 has a source 583S coupled to the first terminal 521-2 and a drain 583D coupled to the transistor second terminal 572-2 (drain); and the fourth transistor 584-2 has a source 584S coupled to the second terminal 522-2 and a drain coupled to the transistor second terminal 572-2.

In one embodiment, the transistors 581-2, 582-2, 583-2, 584-2 are insulated-gate bipolar transistors (IGBTs), though the invention is not so limited. IGBTs have inherently larger break down voltages between drain and emitter contacts. A drawback for using such devices is that they are best at low frequency operation. The switch 531-2 would be especially useful in a matching network at power levels up to 10 kW and frequency below 500 kHz. The exemplified transistors 581-2, 582-2, 583-2, 584-2 are synchronously driven every half cycle of the operatizing frequency. The switching of ON/OFF of those transistors should still be very fast, so that in comparison to the diodes, in place of transistors Q1 to Q4 the switching losses would be small. This arrangement as shown in FIG. 32 can have inherently much lower losses when compared to the diodes.

Like the first embodiment, this switch 531-2 includes a switching circuit 546-2 and a tuning circuit 547-2. The exemplified tuning circuit includes a tuning inductor 579-2 and a tuning capacitor 578-2, though similar to switch 531 of the first embodiment, the tuning capacitor may be omitted. The switch 531-2 shares many other features of switch 531. For example, positive and negative current both flow in the same direction through the switching transistor 570-2. But by contrast, the switching circuit 546-2 has three isolated gate drivers, specifically, two isolated gate drivers 575-2B, 575-2C for driving the transistors 581-2, 582-2, 583-2, 584-2, and one isolated gate driver 575-2A for driving the switching transistor 570-2.

Third Embodiment Higher (Voltage)

Figure 33:
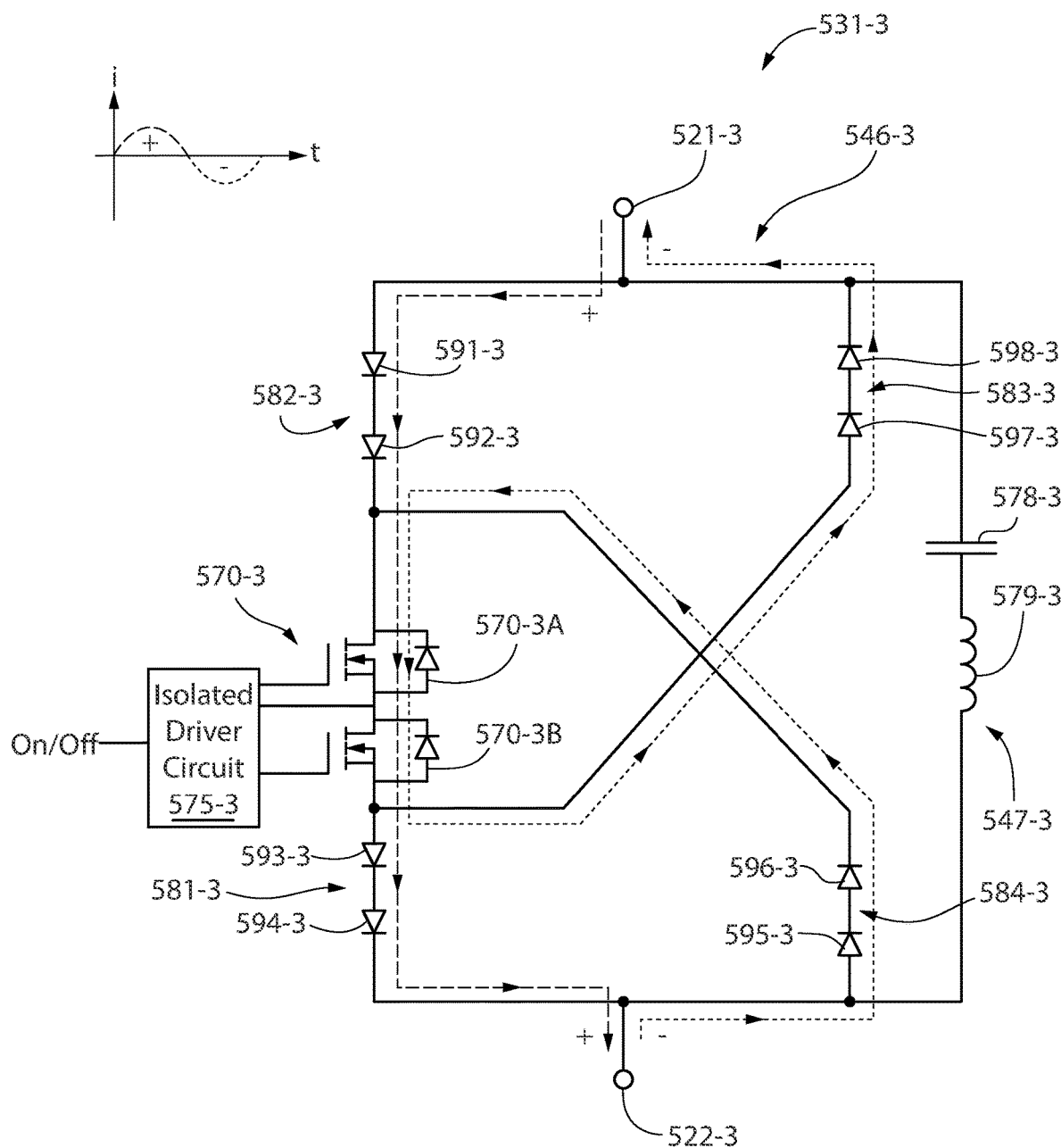
FIG. 33 is a third embodiment of the high-power RF switch for increased high voltage according to one embodiment.

FIG. 33 is a third embodiment of the high-power RF switch 531-3 for increased high voltage according to one embodiment. In this embodiment, each of the four switching devices 581-3, 582-3, 583-3, 584-3 comprises a plurality of switching devices. In this embodiment, switching device 581-3 comprises diodes 593-3, 594-3, switching device 582-3 comprises diodes 591-3, 592-3, switching device 583-3 comprises diodes 597-3, 598-3, and switching device 584-3 comprises diodes 595-3, 596-3. In other embodiments, transistors can be used instead of diodes. Further, in this embodiment the switching transistor 570-3 comprises a first transistor 570-3A and a second transistor 570-3B coupled in series.

This switch 531-3 is capable of switching 1,000V peak voltages and currents up to 50 A. The current capability and voltage capability will depend upon the section of the FETs that are available now. These devices, as of this writing, can withstand those voltages and currents. This switch will be useful in the design of a digital matching network at a power level of P=10 kW and frequency of 13.56 MHz. The switch 531-3 may also require a special gate driver design which is isolated and capable of withstanding the isolation of HV transients at the gate up to 10 kV. The gate driver can be a special and separate design in this case.

The diodes 591-3 to 598-3 of switch 531-3 are in series to increase the voltage break down of the diode branch. The same is true for the FET transistors 570-3A, 570-3B. Since they are in series, they can withstand higher break down voltages. As shown in the simulation (below), when the RF switch 531-3 is in the OFF condition the RF AC current through the FETS 570-3A, 570-3B is zero. However, the voltage on the FETS 570-3A, 570-3B from drain to source is a DC voltage rectified from the RF bus signal at the frequency of apportion and the power level. For instance, in the case of a P=10 kW matching network, based on 50 Ohms RF bus, the voltage expected on the RF bus will be 1,000V peak. The same value of DC voltage of 1,000V will appear on the terminals between the drain to source on the FETs connected in series. Their DC voltage will distribute evenly and, so we expect that each FET will see only 500 V on its terminals. That DC voltage build up between drain-to-source of the switching FETs is also the reason why the tuning inductor 579-3 has a decupling capacitance, CL (some large values such as 1 nF/5 kV) associated with it. In the simulations circuits that capacitance has a designation of C8.

As with the prior embodiments, switch 531-3 of FIG. 33 includes a first terminal 521-3 and a second terminal 522-3, a tuning circuit 547-3 comprising a tuning inductor 579-3 and an optional tuning capacitor 578-3, and an isolated driver circuit 575-3 for driving the transistors 570-3A, 570-3B.

Simulations

Figure 34:
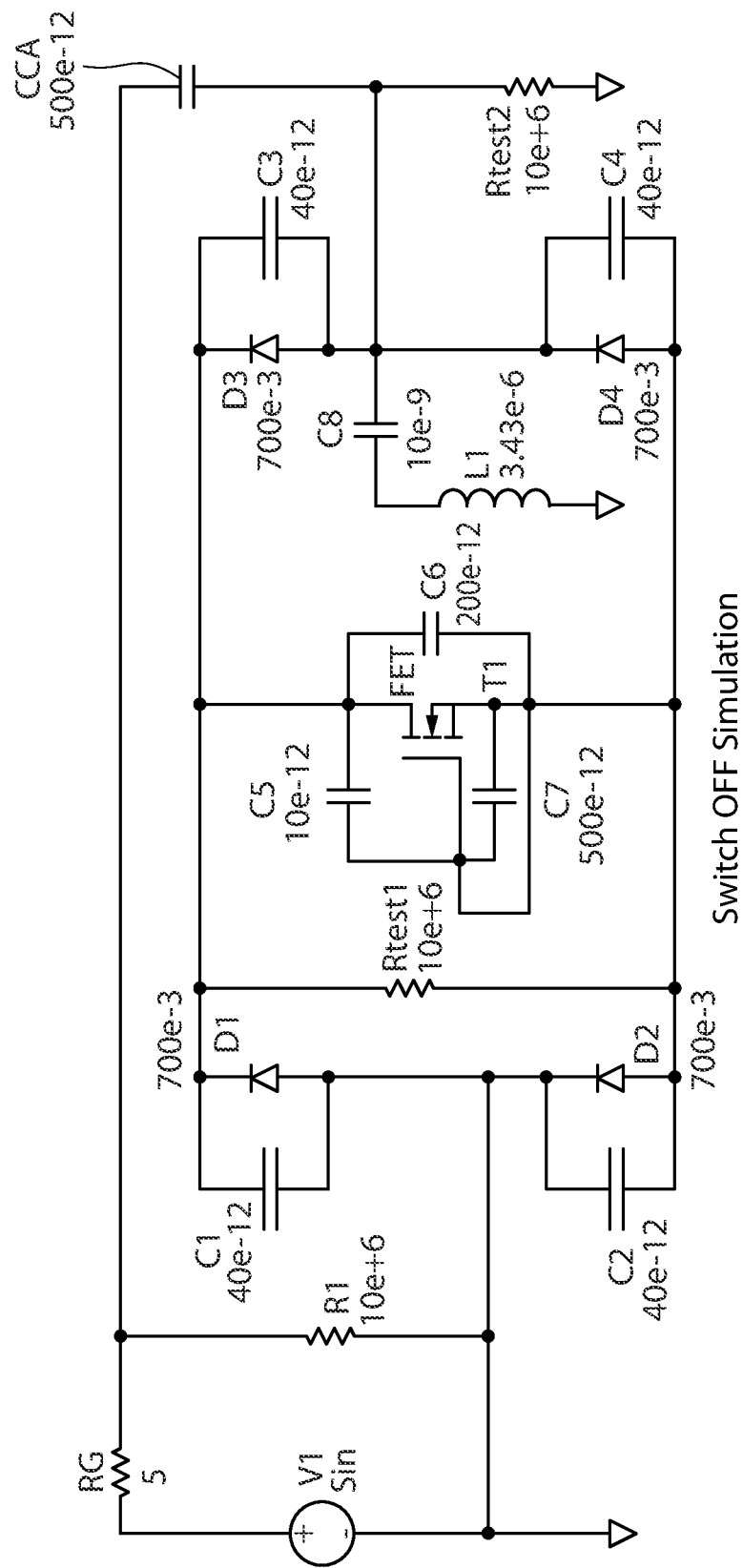
FIG. 34 is a simulation circuit for a high power-RF switch when in the OFF state according to one embodiment.

FIG. 34 is a simulation circuit for a high power-RF switch when in the OFF state according to one embodiment. The V1 input RF bus voltage is 707.1 Vpeak, and Pin is 5 kW. Below is a table of the nodal analysis of the voltages and currents.

TABLE 3

| Simulation Results Where Switch OFF | | | | | |
|---|---|---|---|---|---|
| | left | right | delta | min | max | pp |
| Screen | 0 | 100e−6 | 100e−6 | | | |
| V(CCA) | 0 | 1.93556 | 1.93556 | −115.415 | 289.551 | 404.966 |
| V(Rtest1) | 0 | 776.546 | 776.546 | 0 | 808.16 | 808.16 |
| V(Rtest2) | 0 | −293.053 | −293.053 | −809.548 | 809.56 | 1.61911e+3 |
| V(D1) | 0 | −241.746 | −241.746 | −808.86 | 700e−3 | 809.56 |
| V(D2) | 0 | −534.799 | 534.799 | −808.848 | 700e−3 | 809.548 |
| I(T1) | 0 | 0 | 0 | 0 | 0 | 0 |
| I(V1) | 0 | −7.36452e3 | −7.36452e3 | −9.75601 | 11.3973 | 21.1533 |
| I(CCA) | 0 | −7.33541e−3 | −7.33541e−3 | −9.75598 | 11.3973 | 21.1533 |
| I(D1) | 0 | 0 | 0 | 0 | 9.8919 | 9.8919 |
| I(D2) | 0 | 0 | 0 | 0 | 9.81311 | 9.81311 |
| I(D3) | 0 | 0 | 0 | 0 | 9.81311 | 9.81311 |
| I(D4) | 0 | 0 | 0 | 0 | 9.8919 | 9.8919 |
| V(R1) | 0 | −291.117 | −291.117 | −712.739 | 713.655 | 1.42639e+3 |

| | mean | rms | acrms | freq |
|---|---|---|---|---|
| Screen | | | | |
| V(CCA) | 1.94186 | 9.3115 | 9.1067 | 12.5634e+6 |
| V(Rtest1) | 792.066 | 792.175 | 13.125 | |
| V(Rtest2) | −1.93449 | 498.959 | 498.956 | 13.5587e+6 |
| V(D1) | −395.066 | 467.281 | 249.548 | 13.5575e+6 |
| V(D2) | −397 | 468.935 | 249.58 | 13.5595e+6 |
| I(T1) | 0 | 0 | 0 | |
| I(V1) | 9.76269e−6 | 162.702e−3 | 162.702e−3 | 12.7862e+6 |
| I(CCA) | 9.76195e−6 | 162.702e−3 | 162.702e−3 | 12.8062e+6 |
| I(D1) | 911.815e−6 | 79.8419e−3 | 79.8367e−3 | 4.21661e+6 |
| I(D2) | 1.1082e−3 | 88.0862e−3 | 88.0792e−3 | 6.14321e+6 |

TABLE 3-continued

Simulation Results Where Switch OFF

| | | | | |
|---|---|---|---|---|
| I(D3) | 1.1082e−3 | 88.0862e−3 | 88.0792e−3 | 6.14321e+6 |
| I(D4) | 911.815e−6 | 79.8419e−3 | 79.8369e−3 | 4.21661e+6 |
| V(R1) | 7.36896e−3 | 498.788 | 498.788 | 13.5593e+6 |

Figure 35:
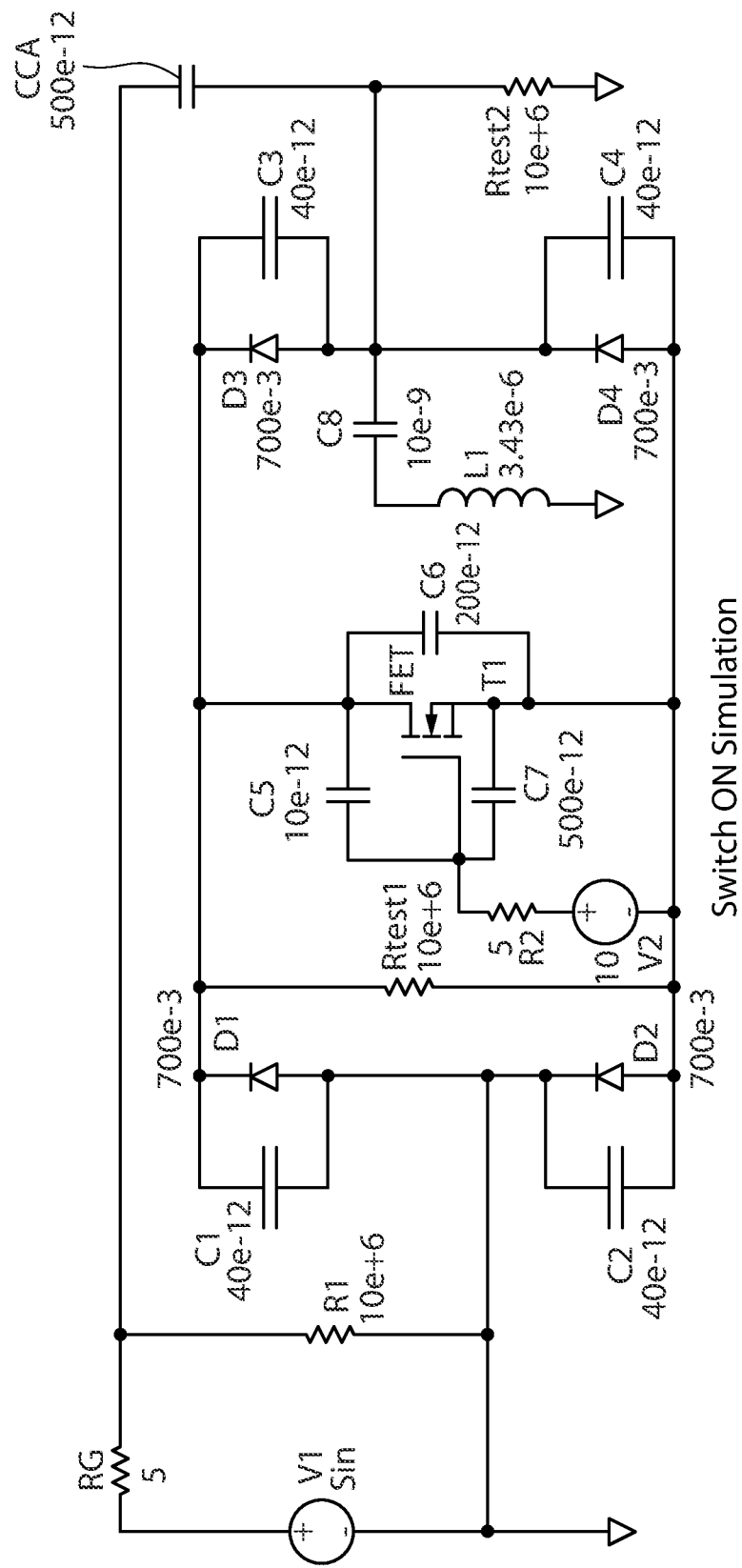
FIG. 35 is a simulation circuit for a high power-RF switch when in the ON state according to one embodiment.

FIG. 35 is a simulation circuit for a high power-RF switch when in the ON state according to one embodiment. Again, the V1 input RF bus voltage is 707.1 Vpeak, and Pin is 5 kW. Below is a table of the nodal analysis of the voltages and currents.

such as any of the plasma chambers and impedance matching networks described herein (e.g., matching network 100 and load 120 of FIG. 1A). Further, while the switch is described as forming part of an EVC, the switch can also be used in other applications.

TABLE 4

Simulation Results Where Switch ON

| | left | right | delta | min | max | pp |
|---|---|---|---|---|---|---|
| V(CCA) | −423.484 | 284.645 | 708.13 | −686.076 | 686.076 | 1.37215e+3 |
| V(Rtest1) | 2.35033 | 61.6107 | 59.2603 | −700.01e−6 | 61.617 | 61.6177 |
| V(Rtest2) | 3.75033 | 63.0107 | 59.2603 | −63.017 | 63.017 | 126.034 |
| V(D1) | −3.05033 | −62.3107 | −59.2603 | −62.317 | 700e−3 | 63.017 |
| V(D2) | 700e−3 | 700e−3 | 333.067e−18 | 62.317 | 700e−3 | 63.017 |
| I(T1) | 23.5033 | 24.387 | 883.742e−3 | −7.00011e−3 | 24.8806 | 24.8876 |
| I(V1) | 23.3276 | 24.2928 | 965.144e−3 | −265.6369 | 26.6369 | 53.2738 |
| I(CCA) | 23.3277 | 24.2927 | 965.067e−3 | −26.6369 | 26.6369 | 53.2738 |
| I(D1) | 0 | 0 | 0 | 0 | 26.4599 | 26.4599 |
| I(D2) | 23.4523 | 24.2826 | 830.337e−3 | 0 | 26.4599 | 26.4599 |
| I(D3) | 23.4523 | 24.2826 | 830.337e−3 | 0 | 26.4599 | 26.4599 |
| I(D4) | 0 | 0 | 0 | 0 | 26.4599 | 26.4599 |
| V(Ri) | −419.734 | 347.656 | 767.39 | −687.498 | 687.498 | 1.375e+3 |

| | mean | rms | acrms | freq |
|---|---|---|---|---|
| V(CCA) | −614.893e−3 | 471.594 | 471.593 | 13.5593e+6 |
| V(Rtest1) | 21.7876 | 31.9252 | 23.3348 | 27.1186e+6 |
| V(Rtest2) | 313.433e−3 | 32.8964 | 32.8949 | 13.5593e+6 |
| V(D1) | −11.0505 | 23.078 | 20.2603 | 13.5593e+6 |
| V(D2) | −10.7371 | 22.7618 | 20.0703 | 13.5993e+6 |
| I(T1) | 18.7096 | 20.2587 | 7.76959 | 27.1186e+6 |
| I(V1) | 226.809e−3 | 20.3227 | 20.3215 | 13.5593e+6 |
| I(CCA) | 266.809e−3 | 20.3227 | 20.3215 | 13.5593e+6 |
| I(D1) | 9.23378 | 14.2761 | 10.8879 | 13.5593e+6 |
| I(D2) | 9.45966 | 14.4779 | 10.9602 | 13.5593e+6 |
| I(D3) | 9.45966 | 14.4779 | 10.9602 | 13.5593e+6 |
| I(D4) | 9.23378 | 14.2761 | 10.8879 | 13.5593e+6 |
| V(Ri) | −301.463e−3 | 481.211 | 481.211 | 13.5593e+6 |

Figure 36:
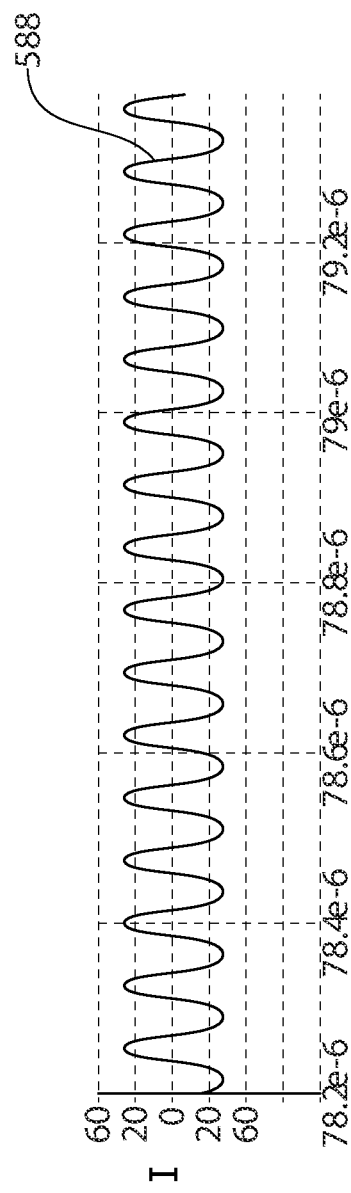
FIG. 36 is a waveform of a signature of the RF current flowing through one of the discrete capacitors of the EVC according to one embodiment.

FIG. 36 is a waveform 588 of a signature of the RF current flowing through one of the discrete capacitors of the EVC according to one embodiment. Specifically, the RF current is flowing through a discrete capacitor having a capacitance of 500 pF at 13.56 MHz that is being switched from OFF to ON. The calculated current in the matching network is for a condition when the matching network operates at 5 kW (see table above). The waveform is that of discrete of capacitor current 20.3 A rms. The simulation levels for the above example were taken for P=5 kW at 13.56 MHz, and a 50Ω RF bus. We can achieve a discrete capacitor capacitance of 500 pF, switching at P=5 kW match, in a shunt of the matching network with only one Power FET.

It is noted that switches discussed above can be used as part of a variety of matching networks, including the matching networks discussed in FIGS. 1A-10 discussed herein. The switches can also be used as part of a method for manufacturing a semiconductor as described herein. Further, the switches can form part of an EVC of a matching network where the matching network forms part of a semiconductor processing tool, the semiconductor processing tool including a plasma chamber and an impedance matching network, There are several advantages to the RF switches discussed above. For example, a matching network designed in pi configuration for a 5 kW application could use only one FET and four HV diodes as switches in the first shunt position. It will need only one parasitic capacitance tuning out inductor to tune out the parasitic capacitance. Further, the switching FET can be any FET or any BJT. It can have relatively large output capacitance (i.e., >200 pF). The output capacitance of a switching FET in this switch can be cancelled out at the RF frequency. The FET parts are therefore also less expensive. Further, a total footprint of the layout is smaller. Further, the reflected HV transients from the chamber get somewhat dissipated by the HV diodes. If the FET switching transistor is in the OFF state, at that moment, the transients will be seen on the diodes capacitances and those transient currents will flow through the diode capacitance to ground. The FET switch is somewhat better protected by the switching diodes. Finally, higher operation voltage is achieved by using the four diodes. Those four diodes at full load, conduct 41% smaller current than the switching FET.

RF Power Amplifier

As discussed above, there is need for a less expensive and more efficient method for varying the output power of an RF generator. Below will be discussed a new circuit architecture that covers all RF power amplifier classifications. The embodiments discussed will be class AB and class E RF amplifiers, but these are just examples and are not exhaustive. The new design does not need to vary the DC bus to vary the gain of RF power, nor does it need to adjust input power level, gate bias, or input phase. Rather, RF power can be controlled through transconductance variation. The RF power variation in this new circuit architecture is achieved by the variation of the drain current in active switching transistors (which may be several transistor in parallel for high power application) and hence variation of the transconductance of the RF power devices driving the amplifier chain. Note that any transistor could be used here (BJTs, HEMTs, MOSFET, etc.), and MOSFETs are used simply as an example.

Figure 37:
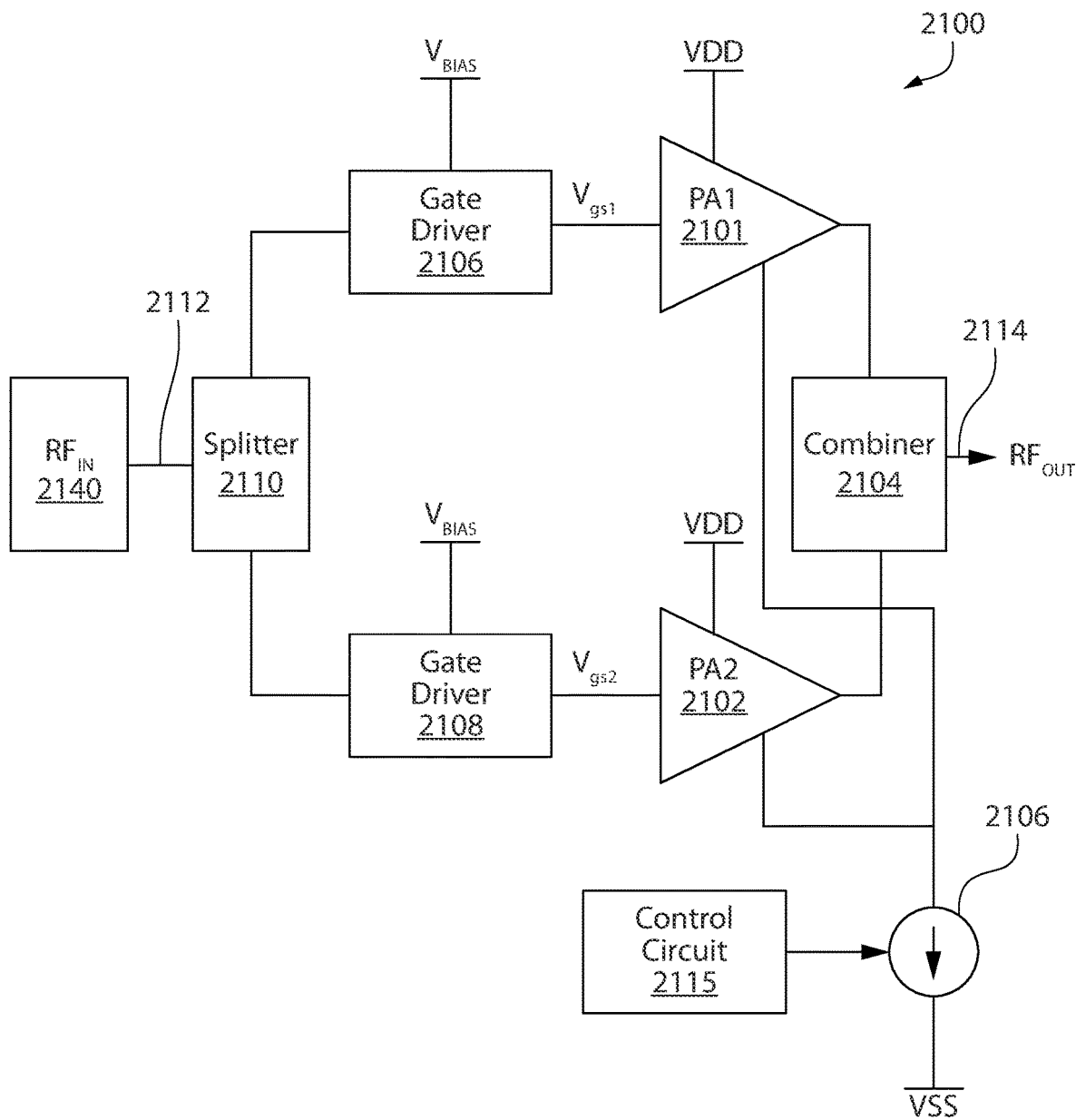
FIG. 37 is a block diagram of a topology for a universal RF amplifier according to one embodiment.

FIG. 37 is a block diagram of a topology for a universal RF amplifier 2100 according to one embodiment. The amplifier includes three distinct RF power transistors blocks, namely, two RF power amplifier stages 2101, 2102, and a transconductance control stage 2106, shown as a current source. This universal RF amplifier topology can be used for all classes of operation. If one changed the RF drive of the power amplifier blocks, one could invoke other classes of RF power amplifier design. At the same time, if other classes of operation are required, one may change the drain filters the power amplifiers 2101, 2102 through which the power gets delivered. For other classes of operation, the design may need a gate biasing on RF stages such as a Class AB or C stage. In those cases, the system can bias the drain current to some small drain current in the order of 0.1 A to 1 A.

The design allows for high frequency, arbitrary pulsing waveforms. High frequency pulsing with fast rise time can be achieved. The fast pulsing, with fast rise time, is inherent in this design since the RF current is not interrupted. The RF current is either steered to the output network of the amplifier or through the active switching devices. By starving the current in the power amplifiers 2101, 2102 and thus delivering less current to the output network, the amplifier 2100 controls the output power. By using this approach, the amplifier 2100 achieves fast rise times in pulsing. The gates of power amplifiers 2101, 2102 are always driven by the constant RF drive.

As shown in FIG. 37, the power amplifiers 2101, 2102 are driven by an RF source 2140. In the exemplified embodiment, the RF source 2410 is coupled to an input 2112 of the amplifier 2100. The inputted RF signal is split by splitter 2110 coupled to gate drivers 2106, 2108, which in turn are coupled to the power amplifiers 2101, 2102. The power amplifiers each output a signal to combiner 2104, which combines the signal for the output 2114. A control circuit 2115 controls the transconductance control stage 2106, thereby controlling the output power, as discussed below.

The RF source 2140 may be at any frequency, including from LF up to microwave. In the exemplified embodiment, the power amplifiers 2101, 2102 are driven at a constant power, removing the need for a complex preamplifier. In this embodiment all transistor gates are transformer isolated, because the DC supply is simply AC mains rectified. The RF section is therefore floating. The gate transformers provide the galvanic isolation. The gate drive on the transconductance control circuit 2106 is the control loop voltage that comes from the RF section. The envisioned control loop of the control circuit 2115 is analog but a digital control loop using an FPGA could be done as well. The control board in which the RF power sensor outputs meet will also have the serial port for the computer connection. Those standard techniques are not discussed here. In other embodiments, the gates of the first and second transistors can be optoisolated.

When designing such an amplifier at lower frequencies one could use simply rectified 110 VAC, single-phase AC mains and achieve VDC required. There is no need for a sophisticated DC power supply, which is an important advantage of this design.

Figure 38:
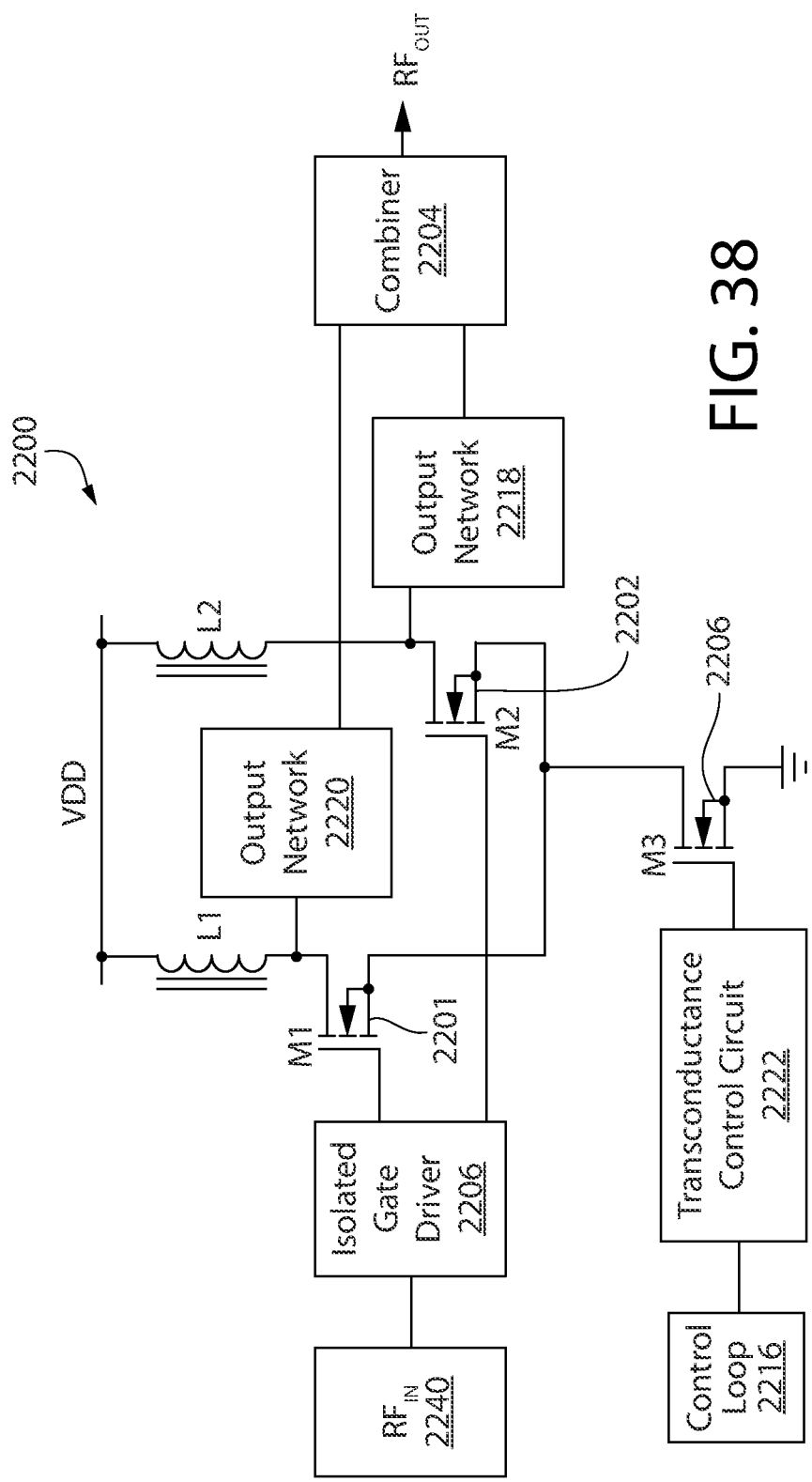
FIG. 38 is a schematic of an RF amplifier for a Class E amplifier according to one embodiment.

FIG. 38 is a schematic of an RF amplifier 2200 for a Class E amplifier according to one embodiment. Similar to FIG. 37, the amplifier 2200 includes first transistor amplifier 2201, second transistor amplifier 2202, and third transistor 2203 for controlling the first and second transistor amplifiers 2201, 2202. Further, the amplifier 2200 includes an RF source 2240, a gate driver 2206, output networks 2218, 2220, a combiner 2204 at the output, a transconductance control circuit 2222, and a control loop 2216 for RF power level control and pulsing.

The first and second transistors 2201, 2202 are RF power amplifier stages. The third transistor 2203 is a transconductance control stage for both the first transistor 2201 and the second transistor 2202. The third transistor 2203 controls the current for both RF stages (first and second transistors 2201, 2202), as the current variation in the third transistor 2203 directly impacts the transconductance of the first transistor 2201 and the second transistor 2202. The main DC bus supplying the amplifier stages is assumed constant (for example, about 150 VDC). The values of DC voltage will depend upon the technology of the FETS and the frequency of operation. For instance, there are more high voltage FETS available at lower frequencies (≈10 MHz) than at frequencies of 100 MHz or higher.

The third transistor 2203 (transconductance control stage) controls the drain current to the first and second transistors 2201, 2202 (RF power stages) if the control loop 2216 demands are set to deliver more or less power at the output. The current control stage (third transistor 2203) is driven by the control loop 2216 from the output of the RF power amplifier. The process computer interfacing the load or process computer software could also drive the RF power loop. For instance, the system may dial into the power amplifier a certain power-preset point. That set point will bias the third transistor 2203 to set up the appropriate RF power level for that process.

The drain current from the third transistor 2203 drives the drain currents in the RF stages (first and second transistors 2201, 2202). The drain currents in the RF stages above share currents equally. The stages are matched and then combined. In this embodiment of the architecture, there must be a dual pair of transistors in the RF stage, because one stage acts as a bypass of the source of the other at the source of the FET. Each source is bypassed by the low impedance of $1/g_m$ of the other stage (where $g_m$ is the transconductance, and $1/g_m$ is input resistance $R_{in}$). Since $g_m$ is typically between 5 to 10 S for power FETS, the $1/g_m$ term will give less than 1 Ohm of bypass resistance. That is sufficient to get large RF gain in each stage. Most of the modern power FETS available now are destined for high current switching applications. Therefore, we expect them to have relatively large values of transconductance ($g_m$). Some degeneration of the gain due to by passing of $1/g_m$ of the next FET in parallel, connected at the source, is therefore tolerable. In fact, this technique is helpful to stabilize the gain of the amplifier. By controlling the current in this way, the system does not interrupt the current flow in the choke inductors and filters. The operation of these amplifiers should therefore be more efficient under the abrupt output load impedance changes such as in the application in the semiconductor industry where such amplifiers are driving the plasma loads during deposition or etching.

The following is an example of a 500 W design. During the simulation process, there is approximately 250 W per power FET when operated by +150 VDC fixed DC power bus. A typical one FET transistor load line is about $R_{FET}$=3−j8Ω. (at 60 MHz when the amplifier is driving the 50Ω input of a matching network, for example). If the efficiency of the FET transistor stage, in Class E mode, is assumed to be 85% or larger, the calculated losses in one Power FET transistor are:

$$P_{loss} = P_{out}\frac{1-\eta}{\eta}$$

$$P_{loss} = 250\frac{1-0.85}{0.85}$$

$$P_{loss} = 44 \text{ W/transistor}$$

An average RMS drain current per transistor is $I_D$=3 A rms, at an assumed frequency of operation of 60 MHz. A typical transconductance ($g_m$) of the FET amplifier during the transition when the transistor goes from the ON to OFF or from the OFF to ON stage is shown in Equation 2.

From the drain current ($I_D$) versus gate-to-source voltage ($V_{GS}$) of a typical commercial FET we derived the transconductance ($g_m$) in Table 1 below. The values in the columns for $g_m$ and $R_{in}$ were calculated from the data shown in the table. The FET transistor characteristics were taken from the data sheet for that device. Some typical characteristics of a commercial FET are shown below. This device was used in the simulation process for this new circuit architecture.

TABLE 1

| $V_{GS}$ [V] | $I_D$[A] | $g_m$[S] | $R_{in}$ = (1/$g_m$) [M1 and M2] |
|---|---|---|---|
| 3 ($V_{TH}$) | 0 | — | — |
| 3.5 | 0.05 | 0.3 | 3.5 |
| 4 | 0.13 | 0.5 | 2 |
| 4.5 | 0.5 | 1 | 1 |
| 5 | 2 | 2 | 0.5 |
| 5.5 | 5 | 3.2 | 0.3 |
| 6 | 11 | 4.7 | 0.2 |
| 6.5 | 14 | 5.3 | 0.2 |

The transconductance calculation in Table 1 was calculated as shown below in one example $$g_m = 2k(V_{gs}-V_{TH}) \quad (2)$$

Where:

$$I_D = k(V_{gs}-V_{TH})^2 \quad (3)$$

This is just a regular MOSFET drain current in the linear region. Here, we assumed the threshold voltage (VTH) is 3V for some FET and k=0.5 [AN], evaluated at $V_{GS}$=5V and $I_D$=2 A. The transconductance in Table 1 was calculated using Equation 2. From the transconductance ($g_m$), we also calculated the input resistance ($R_{in}$) looking into the source of the RF stage either first transistor 2001 or second transistor 2002. In the control loop the $V_{GS}$ of third transistor 2203 is varied, thereby varying the $I_D$ in first transistor 2001 and second transistor 2002.

In this example for the Class E amplifier, first and second transistors 2201, 2202 its source is bypassed by input resistance $R_{in}$. As discussed, the active bypassing is helpful if the basic cell should have a large gain when switching to an ON or OFF state. Thus, in this embodiment, it is required that at least two transistors (e.g., first and second transistors 2201, 2202) be used and at least two transistors must be in the ON state at the same time to ensure 1/$g_m$ ($R_{in}$) bypassing.

In fact, it is this input resistance $R_{in}$ that is varied by the third transistor 2203, that in turn will be varied by the control loop 2216 settings in current control stage. If the current in the third transistor 2203 will be large (set by the controller), the $g_m$ will also be large, and hence the $R_{in}$ will be small and the gain in the first and second transistors 2201, 2202 in the Class E stage will be large. Varying the current in the third transistor 2206 varies the RF power in the active RF stage of the first and second transistor 2201, 2202.

Figure 39:
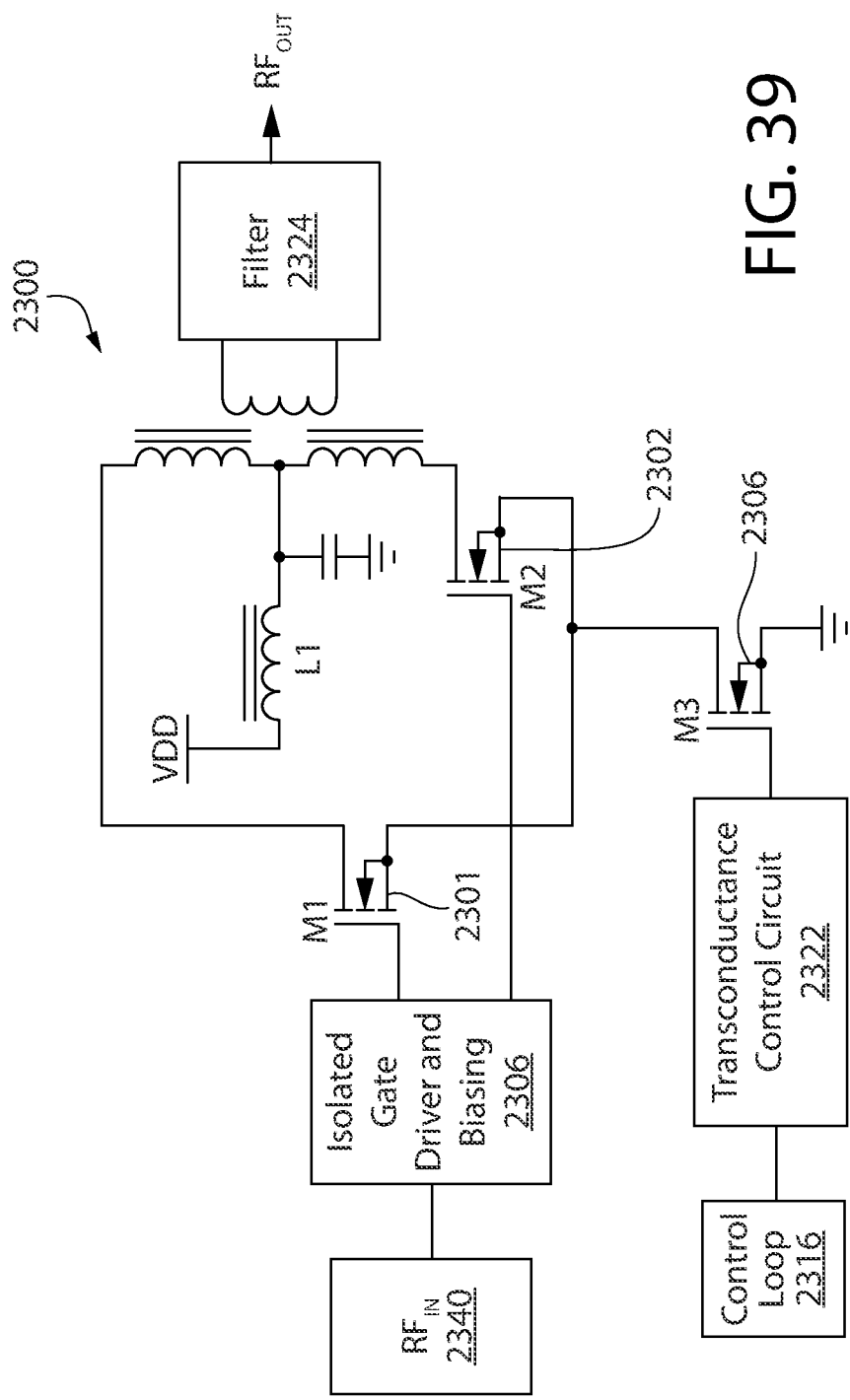
FIG. 39 is a schematic of an RF amplifier for a Class AB amplifier according to one embodiment.

FIG. 39 is a schematic of an RF amplifier 2300 for a Class AB amplifier according to one embodiment. It is clear that the fundamental structure of the basic cell of FIG. 37 is common between the Class E (FIG. 38) and Class AB (FIG. 39) examples. Transistors 2301, 2302, and 2303 are similar to transistors 2201, 2202, and 2203, respectively. Further, FIG. 39 similarly includes an RF source 2340, a control circuit 2322, a control loop 2316, and a gate driver 2306. The amplifier 2300 further includes a filter 2324 at the output.

The simplicity and flexibility of the topology, in addition with the reduction in necessary arts (as there is no need for complex DC supplies or pre-amplifiers), is another advantage of this technique.

For higher power operation, or when using transistors with very large gain and high transconductance values, a quadrature gate drive can be used to improve performance. This ensures that current from the DC supply to the load is never completely interrupted. The idea is that there will always be at least one power transistor in the ON state at any given time during operation.

Figure 40:
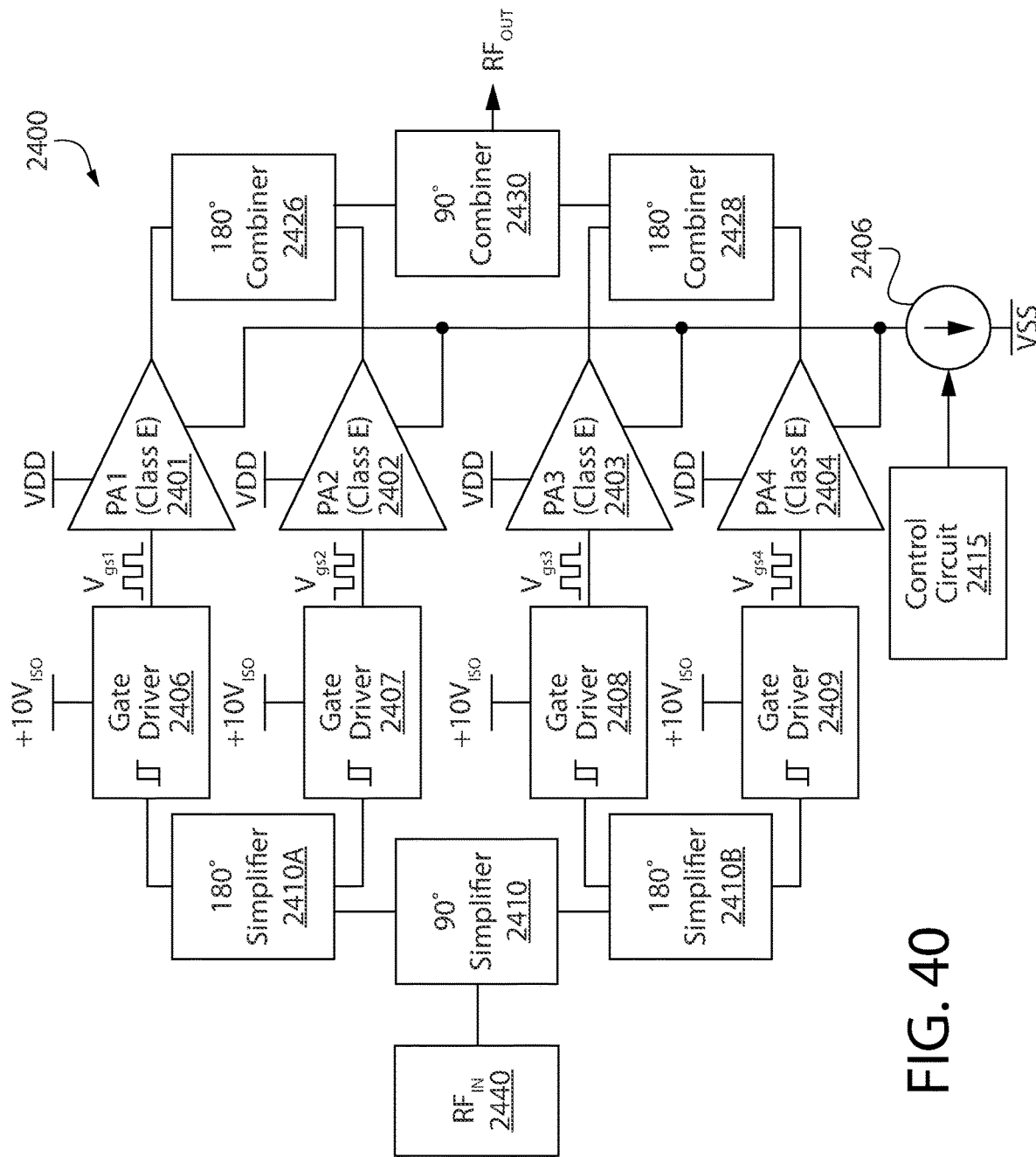
FIG. 40 is a block diagram of a topology for a quadrature RF amplifier for Class E operation according to one embodiment.

FIG. 40 is a block diagram of a topology for a quadrature RF amplifier 2400 for Class E operation according to one embodiment. In this embodiment, the RF source 2440 provides an RF signal to a 90 degree splitter 2410, which feeds signals to 180 degree splitters 2410A, 2410B, which feeds signals to gate drivers 2406, 2407, 2408, 2409, which feed signals to amplifiers 2401, 2402, 2403, 2404, which output signals to 180 degree combiners 2426, 2428, which feed signals to a 90 degree combiner 2430, which provides a signal to the RF output. A control circuit 2415 is coupled to an optoisolated transconductance amplifier 2406, whose drain is coupled to a source of each of the amplifiers 2401, 2402, 2403, 2404 to control their output currents in a manner similar to the method described above.

Figure 41:
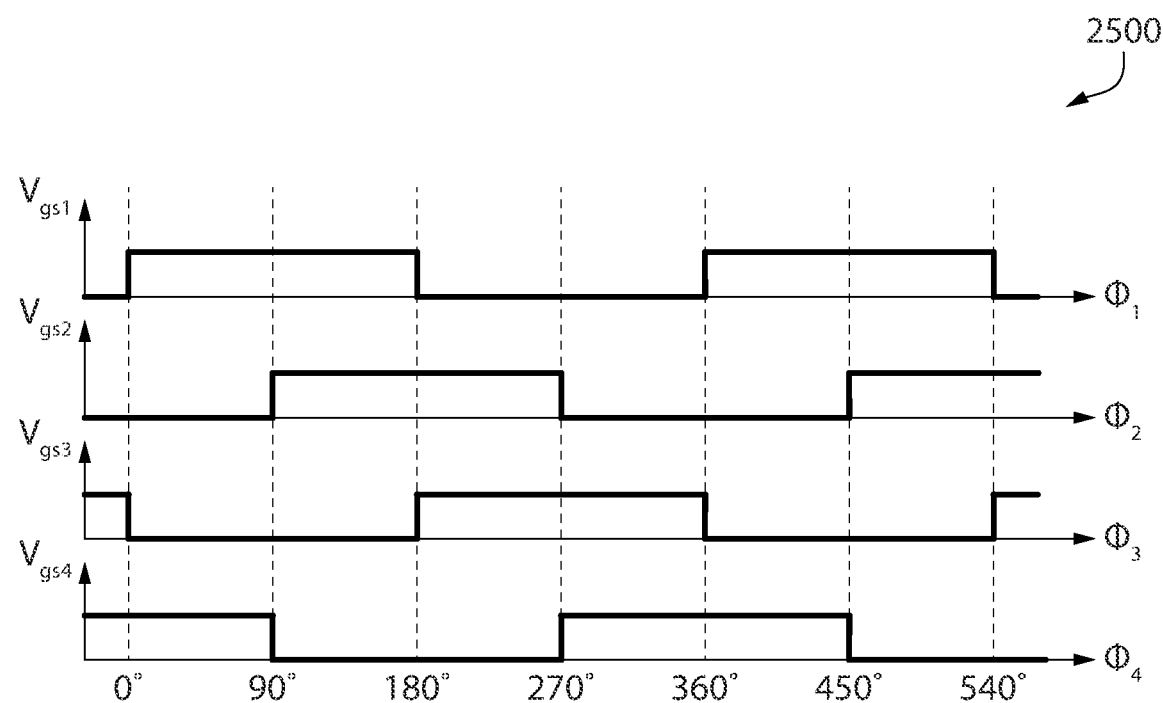
FIG. 41 provides a graph providing a detailed view of the timing of the gate drives according to one embodiment.

FIG. 41 provides a graph 2500 providing a detailed view of the timing of the gate drives according to one embodiment. As shown, during any given cycle, at least two transistors are fully ON. This avoids completely cutting off current from the DC bus. The quadrature gate drive also helps improve isolation between the RF sections, improving stability. This quadrature drive and combining can be achieved through both active and passive networks. It gives a possibility of combing more power.

The pulsing of the RF power envelope may be achieved by modulating the current in the transconductance control circuit. The pulsing rate will be limited to less than $$\frac{f_0}{20},$$

where $f_0$ is the RF operating frequency. For instance, if the operating frequency of the amplifiers is 60 MHz, the pulsing frequency can be extended up to about 3 MHz. Higher pulsing rates are possible, but aliasing becomes a problem. The third transistor 2203 could be a bank of power FETS in parallel in order to deliver sufficient current to the first and second transistors 2201, 2202 in one example.

In general, the circuit architecture discussed above is not frequency limited. The RF power amplifier using this circuit architecture is viable from extremely low frequencies (less than 30 Hz) to microwave frequencies (less than 3 GHz). Higher than 3 GHz is possible, but very dependent on device properties and expected efficiency would be low. The proper selection of the active devices is critical. Active devices must have large drain to source break down voltages, BVDs. The breakdown voltages of transistors must be at least 3.5 times as large as VAC selected for the Class E design for safe operation. Another reason for that is that at some transient times, for example, the first or second transistors are in series with the third transistor and there exists a possibility to have a total DC bus voltage impressed upon each FET device.

The circuit architecture discussed herein may use 3 times as many power transistors in comparison to other RF amplifier architectures. But today power transistors are reasonably priced and hence such circuits are very economical. Since in this design there is no requirement for a sophisticated DC power supply, the price offset of using more active devices in RF stages is therefore appropriate. The DC bus for such RF architecture could simply be consisting of a rectified AC main with an appropriate filter capacitor.

The RF gate drives of the RF transistors can be standard, and these driver circuits are well known. The FET gates will be driven via the appropriate high frequency gate transformers since the galvanic isolation is required when the DC bus consists of a simple rectified main.

The control loop will have wide bandwidth and should be fast. The control loop drives the transconductance control circuit to set the power level and manage the amplifier to maintain steady output power. This control loop will be independent of the first and second transistors. The third transistor controls the current in the RF stages of the first and second transistors. Therefore, the control loop will control the currents in the first and second transistors. This control loop will easily manage any ripple in the DC bus as well as voltage transients on the DC bus caused by the main variations at 50/60 Hz. In one embodiment, it is determined by simulation and will be better than 1.25 µs response time, and have wide dynamic range.

It is noted that the RF power amplifier and method of amplifying discussed above can be incorporated into any of the RF generators or other RF sources discussed above, including RF sources incorporated into a system or method for manufacturing a semiconductor or other device. In one method for manufacturing a semiconductor, a substrate is placed in the plasma chamber, the plasma chamber configured to deposit a material layer onto the substrate or etch a material layer from the substrate. The plasma in the plasma chamber is energized by coupling RF power from an RF source into the plasma chamber to perform a deposition or etching. While energizing the plasma, the matching network between the RF source and plasma chamber can carry out an impedance match. The RF source can comprise an RF power amplifier as discussed herein. The semiconductor manufacturing system can comprise a plasma chamber and an RF source, such as any of the plasma chambers and RF sources described herein (e.g., load 120 and RF source 110 of FIG. 1A).

As discussed above, the above approach is a less expensive system design for RF power amplifiers. There is no need for a complex DC power supply with varying DC levels or complex preamplifiers. Therefore, much less weight, space, and thermal control will be needed. Arbitrary pulsing at frequencies and waveforms can be achieved. The RF generators will become more reliable through component reduction and system simplification. Pulsing would be improved in all generators and at all frequencies. The same basic cell RF architecture could be used in all products and for all frequencies. There is no need to have different circuit architecture for different frequencies. Large savings could be achieved by buying common parts. Further, service technicians can more easily make repairs.

For the circuits discussed above, note that not all components are shown. Rather, the drawings show those components helpful in conveying an understanding of the circuit and its operation. A person of ordinary skill in the art will readily understand the role other standard components can play in the circuit. Further, it is noted that the above switching circuits can be used in methods for providing switching, including methods to provide switching to capacitors or inductors in a matching network, including matching networks in semiconductor fabrication. It is further understood that where devices are described as being operably coupled or coupled, such coupling may be direct or indirect.

While the inventions have been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present inventions. Thus, the spirit and scope of the inventions should be construed broadly as set forth in the appended claims.

What is claimed is:
1. An impedance matching circuit comprising:
   a radio frequency (RF) input configured to couple to an RF source;
   an RF output configured to couple to a plasma chamber; and
   a control circuit; and
   a variable reactance circuit operably coupled to the control circuit and configured to provide a variable reactance, the variable reactance circuit comprising fixed reactance components and corresponding switching circuits, wherein each of the switching circuits comprises:
      a diode; and
      a driver circuit operably coupled to the diode and configured to switch the diode, the driver circuit comprising:
         a biasing current source positioned to provide a bias current to bias the diode;
         a first switch operably coupled to the diode and the biasing current source;
         a second switch operably coupled to the diode; and
         a resistor coupled to the biasing current source;
   wherein, for each diode of each switching circuit, the control circuit is configured to (a) receive a value related to a voltage drop on the resistor, and (b) based on the value related to the voltage drop, adjust the bias current being provided by the biasing current source.

2. The impedance matching circuit of claim 1,
wherein the control circuit is further configured to, based on the value related to the voltage drop on the resistor, determine a current in each diode; and
wherein the adjustment of the bias current is based on the current in the diode.

3. The impedance matching circuit of claim 1, wherein the adjustment of the bias current is configured to ensure that the diode for each switching circuit has sufficient bias current for processing RF current when the diode is ON.

4. The impedance matching circuit of claim 1, wherein the bias current is a forward-biasing DC current sufficient to turn ON the diode.

5. The impedance matching circuit of claim 1, wherein the value related to a voltage drop is the voltage drop.

6. The impedance matching circuit of claim 1, wherein each driver circuit of each switching circuit further comprises an amplifier comprising (a) input terminals coupled across the resistor, and (b) an output, wherein the control circuit receives the value related to the voltage drop via the output of the amplifier.

7. The impedance matching circuit of claim 6, wherein each driver circuit of each switching circuit further comprises a linear opto-coupler coupled to the output of the amplifier, wherein the control circuit receives the value related to the voltage drop from the linear opto-coupler.

8. The impedance matching circuit of claim 1, wherein the variable reactance circuit is an electronically variable capacitor, and the fixed reactance components are fixed capacitors.

9. The impedance matching circuit of claim 1, wherein, for each switching circuit, the diode is a PIN or NIP diode.

10. The impedance matching circuit of claim 1, wherein, for each switching circuit, the first and second switches are metal-oxide semiconductor field-effect transistors (MOSFETs).

11. The impedance matching circuit of claim 1, wherein, for each switching circuit, a first node between the first switch and the second switch is coupled to a second node between the reactance component and its corresponding diode.

12. The impedance matching circuit of claim 1, wherein a drain of the first switch is coupled to a source of the second switch.

13. A semiconductor processing tool comprising:
a plasma chamber configured to deposit a material onto a substrate or etch a material from the substrate; and
an impedance matching circuit operably coupled to the plasma chamber, the matching circuit comprising:
an RF input configured to couple to an RF source;
an RF output configured to couple to the plasma chamber; and
a control circuit; and
a variable reactance circuit operably coupled to the control circuit and configured to provide a variable reactance, the variable reactance circuit comprising fixed reactance components and corresponding switching circuits, wherein each of the switching circuits comprises:
a diode; and
a driver circuit operably coupled to the diode and configured to switch the diode, the driver circuit comprising:
a biasing current source positioned to provide a bias current to bias the diode;
a first switch operably coupled to the diode and the biasing current source;
a second switch operably coupled to the diode; and
a resistor coupled to the biasing current source;
wherein, for each diode of each switching circuit, the control circuit is configured to (a) receive a value related to a voltage drop on the resistor, and (b) based on the value related to the voltage drop, adjust the bias current being provided by the biasing current source.

14. The semiconductor processing tool of claim 13,
wherein the control circuit is further configured to, based on the value related to the voltage drop on the resistor, determine a current in each diode; and
wherein the adjustment of the bias current is based on the current in the diode.

15. The semiconductor processing tool of claim 13, wherein the adjustment of the bias current is configured to ensure that the diode for each switching circuit has sufficient bias current for processing RF current when the diode is ON.

16. The semiconductor processing tool of claim 13, wherein the bias current is a forward-biasing DC current sufficient to turn ON the diode.

17. The semiconductor processing tool of claim 13, wherein the value related to a voltage drop is the voltage drop.

18. The semiconductor processing tool of claim 13, wherein each driver circuit of each switching circuit further comprises an amplifier comprising (a) input terminals coupled across the resistor, and (b) an output, wherein the control circuit receives the value related to the voltage drop via the output of the amplifier.

19. The semiconductor processing tool of claim 18, wherein each driver circuit of each switching circuit further comprises a linear opto-coupler coupled to the output of the amplifier, wherein the control circuit receives the value related to the voltage drop from the linear opto-coupler.

20. A method of impedance matching comprising:
operably coupling a matching network between an RF source and a plasma chamber, the matching network comprising:
a control circuit; and
a variable reactance circuit operably coupled to the control circuit, the variable reactance circuit comprising fixed reactance components and corresponding switching circuits, wherein each of the switching circuits comprises:
a diode; and
a driver circuit operably coupled to the diode and configured to switch the diode, the driver circuit comprising:
a biasing current source positioned to provide a bias current to bias the diode;
a first switch operably coupled to the diode and the biasing current source;
a second switch operably coupled to the diode; and
a resistor coupled to biasing current source;
altering a reactance of the variable reactance circuit by altering a state of at least one of the switching circuits;
for each diode of each switching circuit:
receiving a value related to a voltage drop on the resistor;
based on the value related to the voltage drop, adjusting the bias current being provided by the biasing current source.

\* \* \* \* \*